(12) United States Patent
Lin et al.

(10) Patent No.: US 11,848,326 B2
(45) Date of Patent: Dec. 19, 2023

(54) INTEGRATED CIRCUITS WITH GATE CUT FEATURES

(71) Applicant: Taiwan Semiconductor Manufacturing Co., Ltd., Hsinchu (TW)

(72) Inventors: Zhi-Chang Lin, Hsinchu County (TW); Wei-Hao Wu, Hsinchu (TW); Jia-Ni Yu, Hsinchu (TW); Chih-Hao Wang, Hsinchu County (TW); Kuo-Cheng Ching, Zhubei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 273 days.

(21) Appl. No.: 17/131,542

(22) Filed: Dec. 22, 2020

(65) Prior Publication Data

US 2021/0296313 A1    Sep. 23, 2021

Related U.S. Application Data

(62) Division of application No. 16/362,864, filed on Mar. 25, 2019, now Pat. No. 10,872,891.

(Continued)

(51) Int. Cl.
*H01L 27/088* (2006.01)
*H01L 21/033* (2006.01)
(Continued)

(52) U.S. Cl.
CPC ...... *H01L 27/0886* (2013.01); *H01L 21/0337* (2013.01); *H01L 21/823431* (2013.01); *H01L 21/823437* (2013.01); *H01L 29/66545* (2013.01); *H01L 29/66795* (2013.01); *H01L 29/785* (2013.01)

(58) Field of Classification Search
CPC ............. H01L 27/0886; H01L 21/0337; H01L 21/823431; H01L 21/823437; H01L 29/66545; H01L 29/66795; H01L 29/785; H01L 21/823481; H01L 21/823412
See application file for complete search history.

(56) References Cited

U.S. PATENT DOCUMENTS 8,772,109 B2    7/2014  Colinge
8,785,285 B2    7/2014  Tsai et al.
(Continued)

FOREIGN PATENT DOCUMENTS

DE    102017118920 A1    7/2018

*Primary Examiner* — Herve-Louis Y Assouman
(74) *Attorney, Agent, or Firm* — HAYNES AND BOONE, LLP

(57) ABSTRACT

Examples of an integrated circuit with gate cut features and a method for forming the integrated circuit are provided herein. In some examples, a workpiece is received that includes a substrate and a plurality of fins extending from the substrate. A first layer is formed on a side surface of each of the plurality of fins such that a trench bounded by the first layer extends between the plurality of fins. A cut feature is formed in the trench. A first gate structure is formed on a first fin of the plurality of fins, and a second gate structure is formed on a second fin of the plurality of fins such that the cut feature is disposed between the first gate structure and the second gate structure.

20 Claims, 42 Drawing Sheets

Related U.S. Application Data

(60) Provisional application No. 62/736,146, filed on Sep. 25, 2018.

(51) Int. Cl.
*H01L 21/8234* (2006.01)
*H01L 29/66* (2006.01)
*H01L 29/78* (2006.01)

(56) References Cited

U.S. PATENT DOCUMENTS

| | | | |
|---|---|---|---|
| 8,816,444 B2 | 8/2014 | Wann et al. | |
| 8,823,065 B2 | 9/2014 | Wang et al. | |
| 8,860,148 B2 | 10/2014 | Hu et al. | |
| 9,105,490 B2 | 8/2015 | Wang et al. | |
| 9,236,267 B2 | 1/2016 | De et al. | |
| 9,236,300 B2 | 1/2016 | Liaw | |
| 9,520,482 B1 | 12/2016 | Chang et al. | |
| 9,576,814 B2 | 2/2017 | Wu et al. | |
| 9,929,156 B2 | 3/2018 | Oh et al. | |
| 2010/0090290 A1 | 4/2010 | Sheen et al. | |
| 2016/0043225 A1 | 2/2016 | Ching et al. | |
| 2016/0133632 A1* | 5/2016 | Park | H01L 29/66545 257/369 |
| 2016/0247876 A1 | 8/2016 | Chung et al. | |
| 2016/0351568 A1* | 12/2016 | Chang | H01L 29/267 |
| 2017/0133486 A1* | 5/2017 | Zhou | H01L 29/4966 |
| 2017/0287909 A1 | 10/2017 | Oh et al. | |
| 2019/0189804 A1* | 6/2019 | You | H01L 21/76229 |
| 2019/0304971 A1* | 10/2019 | Hafez | H01L 23/528 |
| 2020/0098750 A1 | 3/2020 | Lin et al. | |

\* cited by examiner

US 11,848,326 B2

INTEGRATED CIRCUITS WITH GATE CUT FEATURES

PRIORITY DATA

The present application is a divisional of U.S. patent application Ser. No. 16/362,864, filed Mar. 25, 2019, which claims the benefit of U.S. Provisional Application No. 62/736,146, entitled "Integrated Circuits With Gate Cut Features," filed Sep. 25, 2018, which is herein incorporated by reference in its entirety.

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. However, such scaling down has also been accompanied by increased complexity in design and manufacturing of devices incorporating these ICs. Parallel advances in manufacturing have allowed increasingly complex designs to be fabricated with precision and reliability.

For example, advances in fabrication have enabled three-dimensional designs, such as Fin-like Field Effect Transistors (FinFETs). A FinFET may be envisioned as a typical planar device extruded out of a substrate and into the gate. An exemplary FinFET is fabricated with a thin "fin" (or fin structure) extending up from a substrate. The channel region of the FET is formed in this vertical fin, and a gate is provided over (e.g., wrapping around) the channel region of the fin. Wrapping the gate around the fin increases the contact area between the channel region and the gate and allows the gate to control the channel from multiple sides. This can be leveraged in a number of way, and in some applications, FinFETs provide reduced short channel effects, reduced leakage, and higher current flow. In other words, they may be faster, smaller, and more efficient than planar devices.

The fins of the FinFET may extend in parallel across a substrate with the gates running perpendicular to the fins, so that a single gate electrode may extend over and around multiple fins. However, the circuit may just as often call for nearby FinFETs to have electrically isolated gates. These may be formed by first forming a single gate, etching a trench that divides the gate in two, and filling the trench with a dielectric material to isolate the two cut gates. Additionally or in the alternative, a placeholder material that reserves space for the gate is cut to divide the placeholder, and a dielectric material is inserted. When the placeholder is removed, and gate segments are formed in its place, the dielectric material divides and isolates the gate segment. As device sizes shrink, the spacing between fins may be reduced, which may affect the ability to perform these cut processes and others. Advances that reduce the size of the cut area, improve the cut alignment, and/or improve the cut uniformity have the potential to increase yield, reduce variability, reduce circuit area, and provide other benefits.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1A:
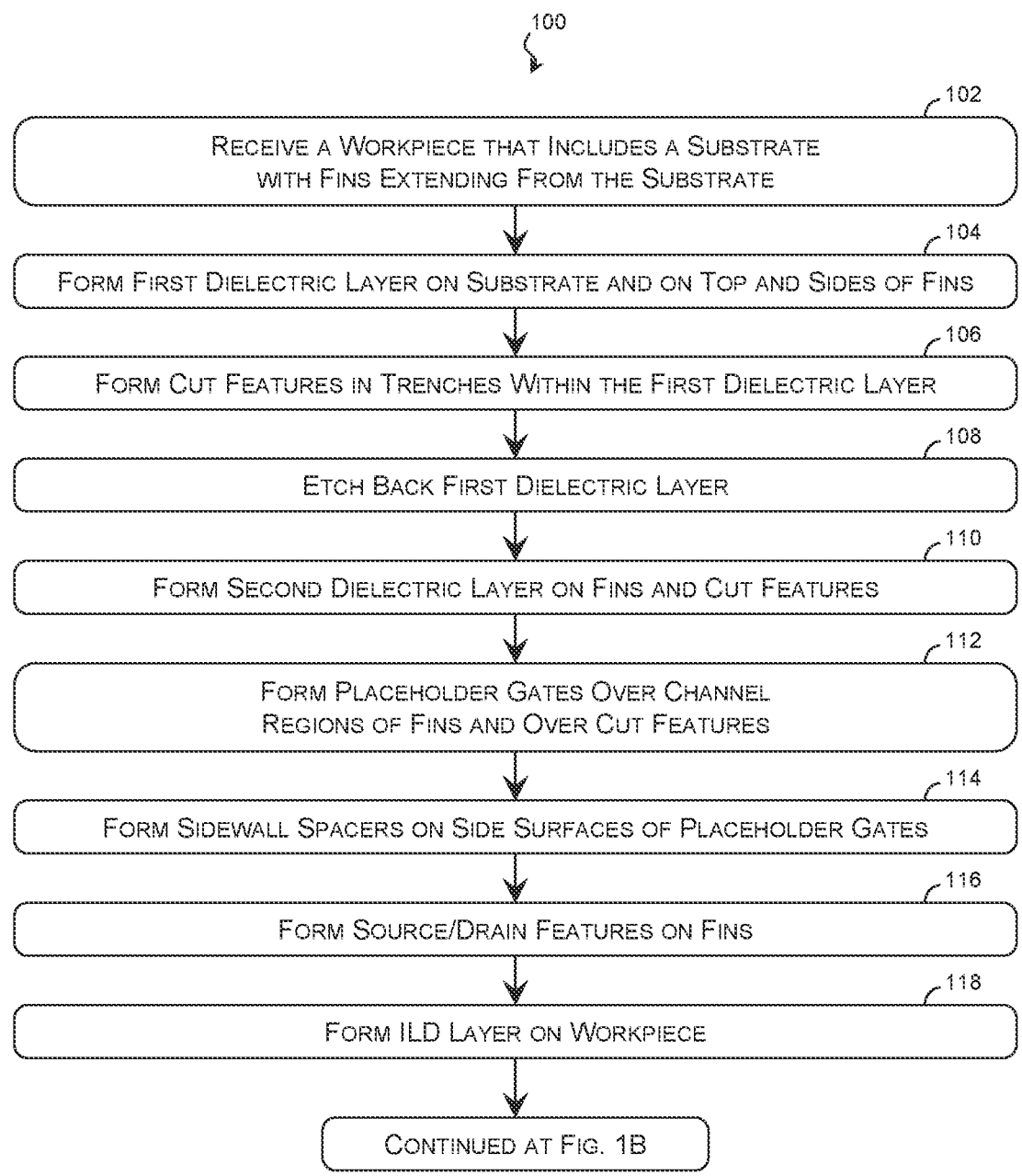
FIGS. 1A and 1B are flow diagrams of a method of fabricating a workpiece with gate cut features according to various aspects of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. Moreover, the formation of a feature connected to and/or coupled to another feature in the present disclosure that follows may include embodiments in which the features are formed in direct contact, and may also include embodiments in which additional features may be formed interposing the features, such that the features may not be in direct contact.

In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. In addition, the present disclosure may repeat reference numerals and/or letters in the various examples. This repetition is for the purpose of simplicity and clarity and does not in itself dictate a relationship between the various embodiments and/or configurations beyond the extent noted.

Integrated circuits include an ever-increasing number of active and passive circuit devices formed on a substrate or wafer, of which Fin-like Field Effect Transistors (FinFETs) are an example. For spacing and other considerations, FinFETs may be arranged so that the fins extend in parallel and the gates extend in parallel, albeit perpendicular to the fins. Gates may be shared such that a single gate structure extends over a plurality of fins corresponding to more than one device or and/or over a plurality of fins that make up a single larger device.

In contrast, where the circuit calls for electrically isolated gates, the technique of the present disclosure provides insulating cut features disposed between the device fins that separate the gate electrodes. The cut features may be formed using a self-aligned process where a spacer material is formed on the sides of the fins to control the distance between a cut feature and the adjacent fins. This may eliminate possible alignment errors associated with other comparable techniques and thereby improve yield. By improving the alignment and precision of the cut features, the spacing between the fins and the cut features may be reduced. Similarly, the thickness of the cut features may also be reduced, and in some examples, the minimum cut feature width is equivalent to the minimum FinFET fin width or smaller. In some examples, portions of the cut features are thinned to provide additional space for contacts that couple to the adjacent gates. Of course, these advantages are merely examples and no particular advantage is required for any particular embodiment.

Figure 1B:
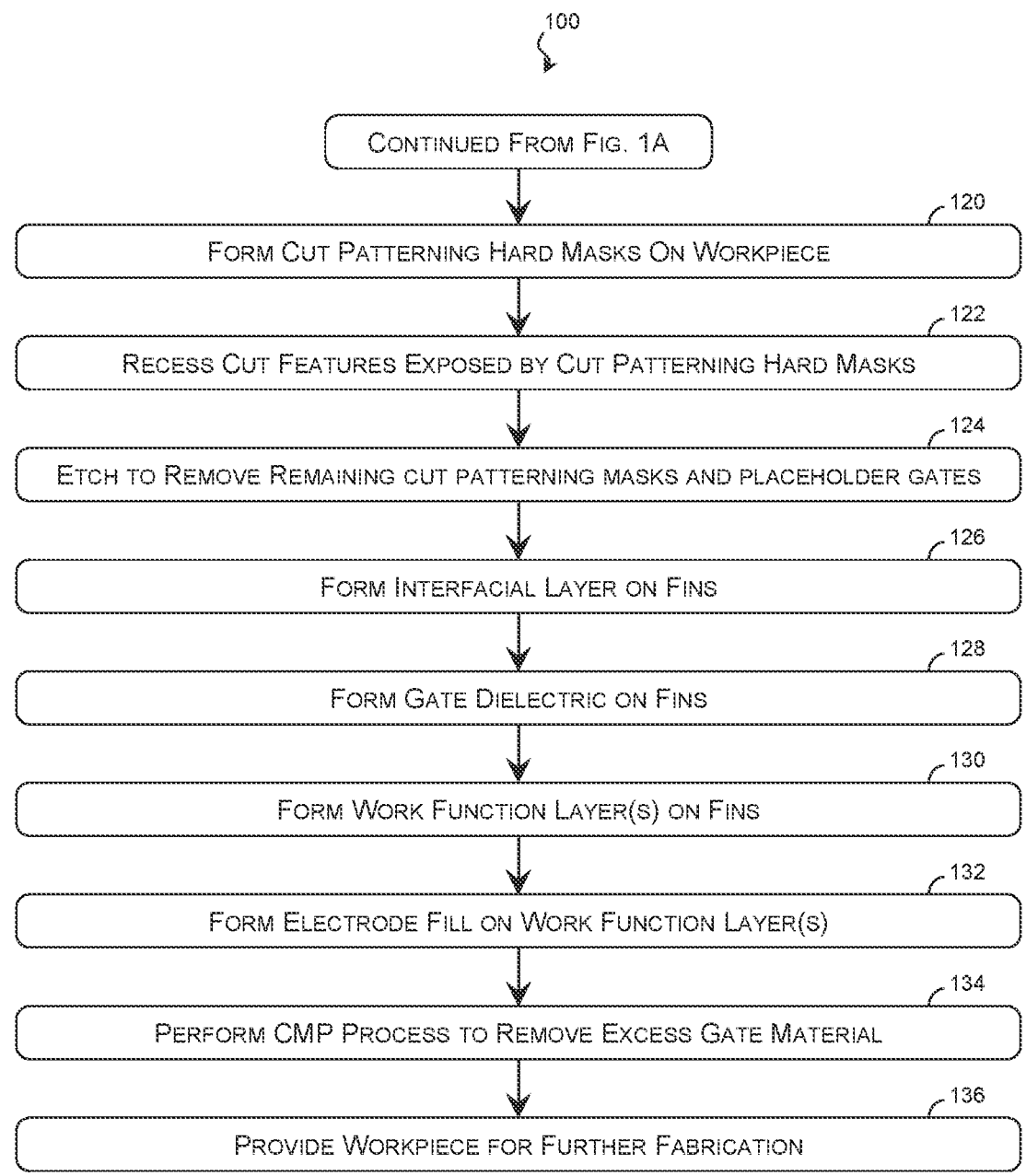

The present disclosure provides examples of an integrated circuit including a plurality of FETs and a cut technique for forming electrically isolated gates on the channel regions of selected FET devices. In that regard, FIGS. 1A and 1B are flow diagrams of a method 100 of fabricating a workpiece 200 with gate cut features according to various aspects of the present disclosure. Additional steps can be provided before, during, and after the method 100, and some of the steps described can be replaced or eliminated for other embodiments of the method 100. FIGS. 2-6 and 8-9 are perspective illustrations of the workpiece 200 undergoing the method 100 of fabrication according to various aspects of the present disclosure. FIG. 7 is a cross-sectional illustration of the workpiece 200 taken along a length of a fin undergoing the method 100 according to various aspects of the present disclosure. FIGS. 10-13 are cross sectional illustrations of the workpiece 200 taken along a gate region undergoing the method 100 according to various aspects of the present disclosure.

Figure 2:
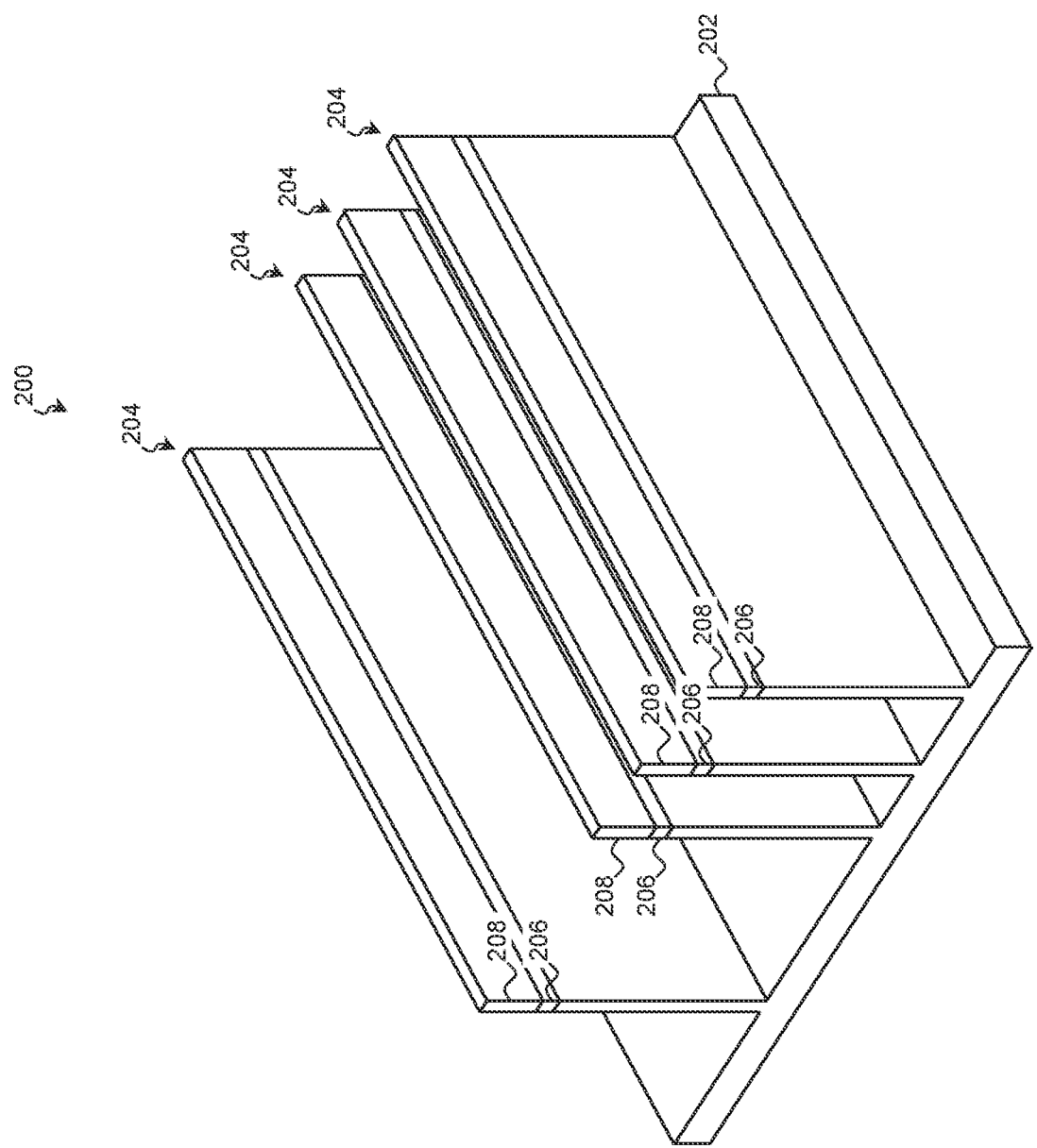
FIGS. 2-6 and 8-9 are perspective illustrations of a workpiece undergoing the method of fabrication according to various aspects of the present disclosure.

Referring to block 102 of FIG. 1A and to FIG. 2, the workpiece 200 is received. The workpiece 200 includes a substrate 202 upon which devices are to be formed. In various examples, the substrate 202 includes an elementary (single element) semiconductor, such as silicon or germanium in a crystalline structure; a compound semiconductor, such as silicon carbide, gallium arsenic, gallium phosphide, indium phosphide, indium arsenide, and/or indium antimonide; an alloy semiconductor such as SiGe, GaAsP, AlInAs, AlGaAs, GaInAs, GaInP, and/or GaInAsP; a non-semiconductor material, such as soda-lime glass, fused silica, fused quartz, and/or calcium fluoride ($CaF_2$); and/or combinations thereof.

The substrate 202 may be uniform in composition or may include various layers, some of which may be selectively etched to form the fins. The layers may have similar or different compositions, and in various embodiments, some substrate layers have non-uniform compositions to induce device strain and thereby tune device performance. Examples of layered substrates include silicon-on-insulator (SOI) substrates 202. In some such examples, a layer of the substrate 202 may include an insulator such as a semiconductor oxide, a semiconductor nitride, a semiconductor oxynitride, a semiconductor carbide, and/or other suitable insulator materials.

Doped regions, such as wells, may be formed on the substrate 202. In that regard, some portions of the substrate 202 may be doped with p-type dopants, such as boron, $BF_2$, or indium while other portions of the substrate 202 may be doped with n-type dopants, such as phosphorus or arsenic; and/or other suitable dopants including combinations thereof.

In some examples, the devices to be formed on the substrate 202 extend out of the substrate 202. For example, FinFETs and/or other non-planar devices may be formed on device fins 204 disposed on the substrate 202. The device fins 204 are representative of any raised feature and include FinFET device fins 204 as well as fins 204 for forming other raised active and passive devices upon the substrate 202. The fins 204 may be similar in composition to the substrate 202 or may be different therefrom. For example, in some embodiments, the substrate 202 may include primarily silicon, while the fins 204 include one or more layers that are primarily germanium or a SiGe semiconductor. In some embodiments, the substrate 202 includes a SiGe semiconductor, and the fins 204 include one or more layers that include a SiGe semiconductor with a different ratio of silicon to germanium than the substrate 202.

The fins 204 may be formed by etching portions of the substrate 202, by depositing various layers on the substrate 202 and etching the layers, and/or by other suitable techniques. For example, the fins 204 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over the fins 204 and one or more fin-top hard masks (e.g., fin-top hard masks 206 and 208). The sacrificial layer is patterned using a photolithography process. Spacers are formed alongside the patterned sacrificial layer using a self-aligned process. The sacrificial layer is then removed, and the remaining spacers are used to pattern the fins 204 by removing material of the fin-top hard masks 206 and 208 and the fins 204 that is not covered by the spacers.

The fin-top hard masks 206 and 208 may be used to control the etching process that defines the fins 204 and may protect the fins 204 during subsequent processing. Accordingly, the fin-top hard masks 206 and 208 may be selected to have different etch selectivity from the material(s) of the fins 204 and from each other. The fin-top hard masks 206 and 208 may include a dielectric material such as a semiconductor oxide, a semiconductor nitride, a semiconductor oxynitride, a semiconductor carbide, a semiconductor carbonitride, a semiconductor oxycarbonitride, and/or a metal oxide.

The patterning and etching process may leave gaps of any width between the fins 204. The present technique may be used to selectively form cut feature in those gaps that are more than a minimum spacing apart as described in detail below.

Figure 3:
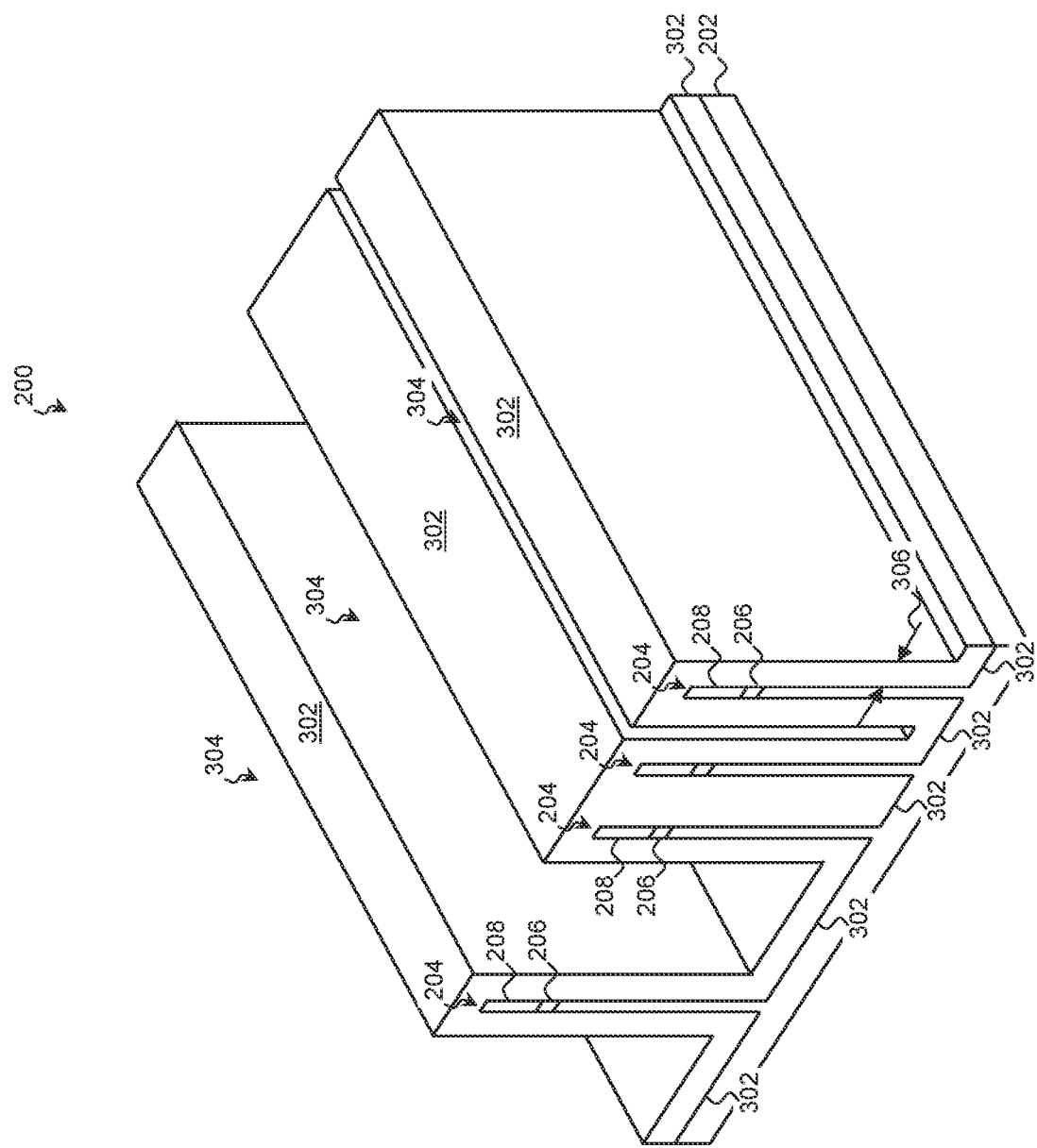

Referring to block 104 of FIG. 1A and to FIG. 3, a first dielectric layer 302 is formed on the substrate 202, the fins 204, and the fin-top hard masks 206 and 208. The first dielectric layer 302 may be structured to fill the recesses between those fins 204 that are a minimum spacing apart and to define trenches 304 for forming cut features between those fins 204 that are more than the minimum spacing apart. To do so, the first dielectric layer 302 may be formed using a substantially conformal technique to have a thickness 306 that is at least half of the minimum spacing between fins 204 so that a first portion on a sidewall of a first fin 204 merges with a second portion on a sidewall of an adjacent second fin 204 if the fins 204 are the minimum spacing apart. In various such examples, this represents a thickness 306 between about 10 nm and about 50 nm.

Accordingly, the first dielectric layer 302 may be formed by any suitable process, and in some examples, the first dielectric layer 302 is deposited using Atomic Layer Deposition (ALD), Plasma Enhanced ALD (PEALD), Chemical Vapor Deposition (CVD), Plasma Enhanced CVD (PECVD), High-Density Plasma CVD (HDP-CVD), and/or other suitable deposition processes. The first dielectric layer 302 may include a dielectric material such as a semiconductor oxide, a semiconductor nitride, a semiconductor oxynitride, a semiconductor carbide, a semiconductor carbonitride, a semiconductor oxycarbonitride, a metal oxide, etc., and in some examples, the first dielectric layer 302 includes multiple sublayers of different dielectric materials.

Figure 4:
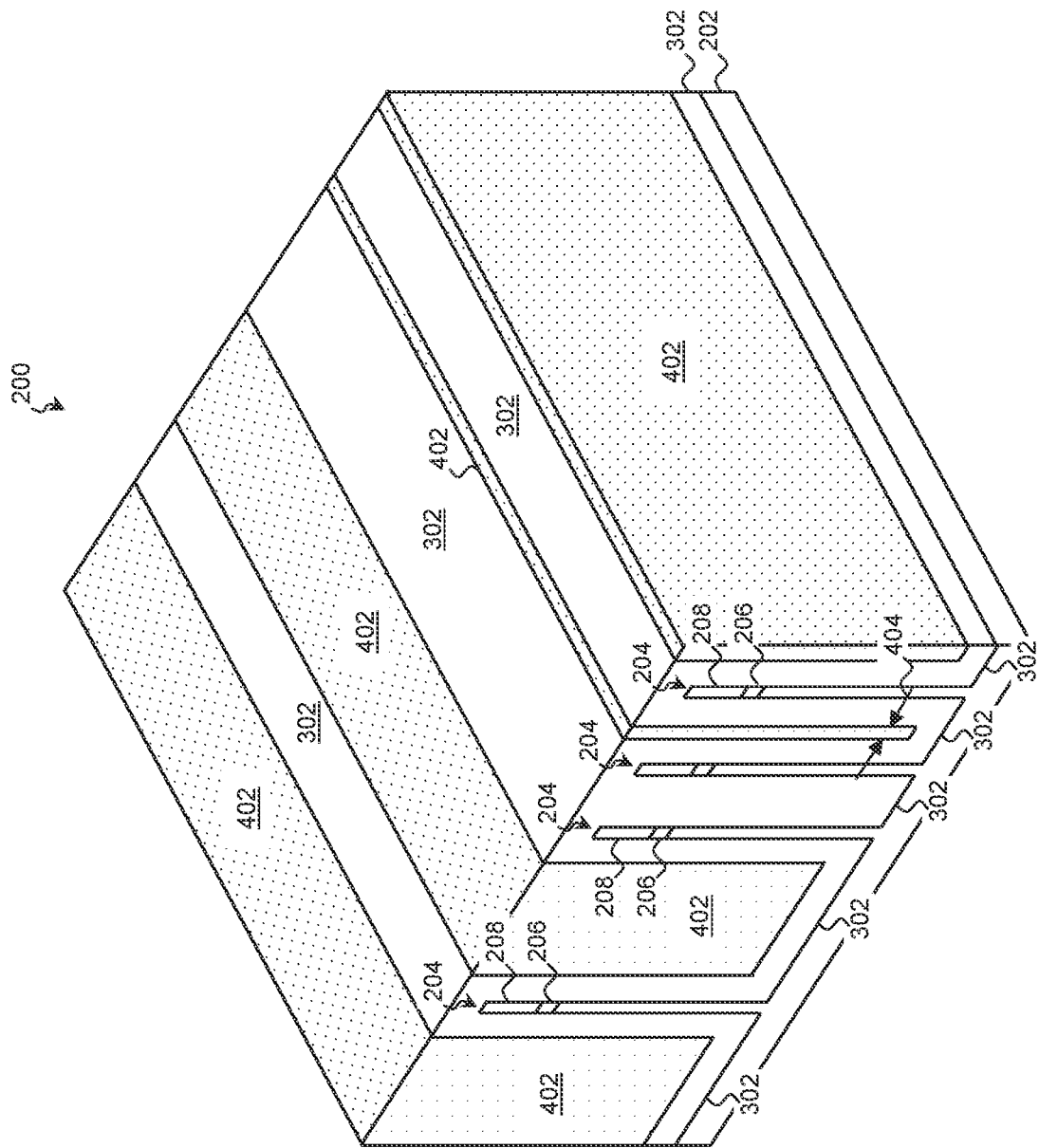

Referring to block 106 of FIG. 1A and to FIG. 4, cut features 402 are formed between the fins 204 in the trenches 304 in the first dielectric layer 302. The cut features 402 are self-aligned by the first dielectric layer 302 to extend parallel to the fins 204 and at a fixed distance from the nearest fin 204. Aligning the cut features 402 using the first dielectric layer 302 rather than, for example, forming the cut features using lithography may avoid placement errors from the alignment of the lithographic system. As a result, the spacing between the cut features 402 and the adjacent fins 204 may be safely reduced. Similarly, the width 404 of the cut features 402 may be safely reduced, and while cut features 402 may have varied widths throughout the workpiece 200, in some examples, a minimum width 404 of the smallest cut features 402 is substantially the same as the minimum fin width (e.g., between about 3 nm and about 10 nm).

The cut features 402 may include any suitable material, such as one or more dielectric materials including a semiconductor oxide, a semiconductor nitride, a semiconductor oxynitride, a semiconductor carbide, a semiconductor carbonitride, a semiconductor oxycarbonitride, and/or a metal oxide. The material(s) of the cut features 402 may be selected to have a different etch selectivity from that of the first dielectric layer 302, the fin-top hard masks 206 and 208, and/or the fins 204. In various examples, the cut features 402 include HfO, ZrO, AlO, LaO, BN, silicon oxide, silicon nitride, silicon carbonitride, silicon oxynitride, silicon oxycarbonitride, and/or other suitable materials.

The cut features 402 may be formed by any suitable process, and in some examples, the cut features 402 are deposited using CVD, PECVD, HDP-CVD, Physical Vapor Deposition (PVD), ALD, PEALD, and/or other suitable deposition processes. In some such examples, the cut features 402 are formed using a flowable CVD process configured to fill the trenches 304 within the first dielectric layer 302. The deposition may be followed by a Chemical Mechanical Planarization/Polishing (CMP) process to remove material of the cut features 402 from the top of the first dielectric layer 302. Accordingly, the CMP process may use the first dielectric layer 302 as a CMP stop. In subsequent examples, techniques for forming cut features with multiple layers of different materials are described.

Figure 5:
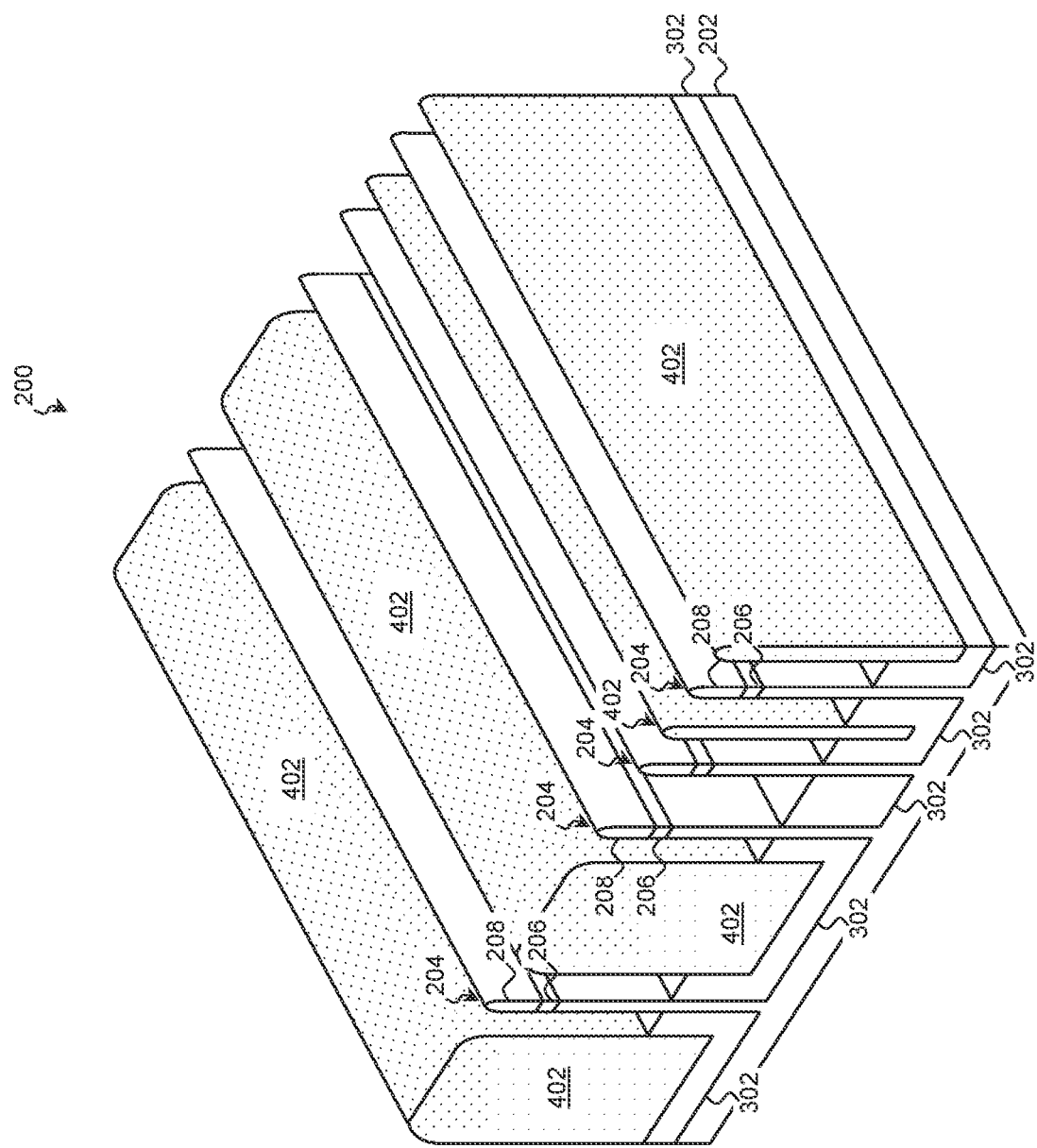

Referring to block 108 of FIG. 1A and to FIG. 5, an etching process is performed to etch back the first dielectric layer 302 from between the fins 204 and the cut features 402. The etching may be configured to leave some portion of the first dielectric layer 302 between the fins 204 and cut features 402 for electrical isolation while exposing a portion of both the fins 204 and cut features 402. In various examples, the fins 204 extend between about 100 nm and about 500 nm above the topmost surface of the remaining first dielectric layer 302.

The etching process of block 108 may include any suitable etching technique, such as wet etching, dry etching, Reactive Ion Etching (RIE), ashing, and/or other etching methods. In some embodiments, the etching process includes anisotropic dry etching using a fluorine-based etchant, an oxygen-based etchant, a chlorine-based etchant, a bromine-based etchant, an iodine-based etchant, other suitable etchant gases or plasmas, and/or combinations thereof. In particular, the etching steps and chemistries may be configured to etch the first dielectric layer 302 without significant etching of the fins 204, the fin-top hard masks 206 and 208, or the cut features 402.

Figure 6:
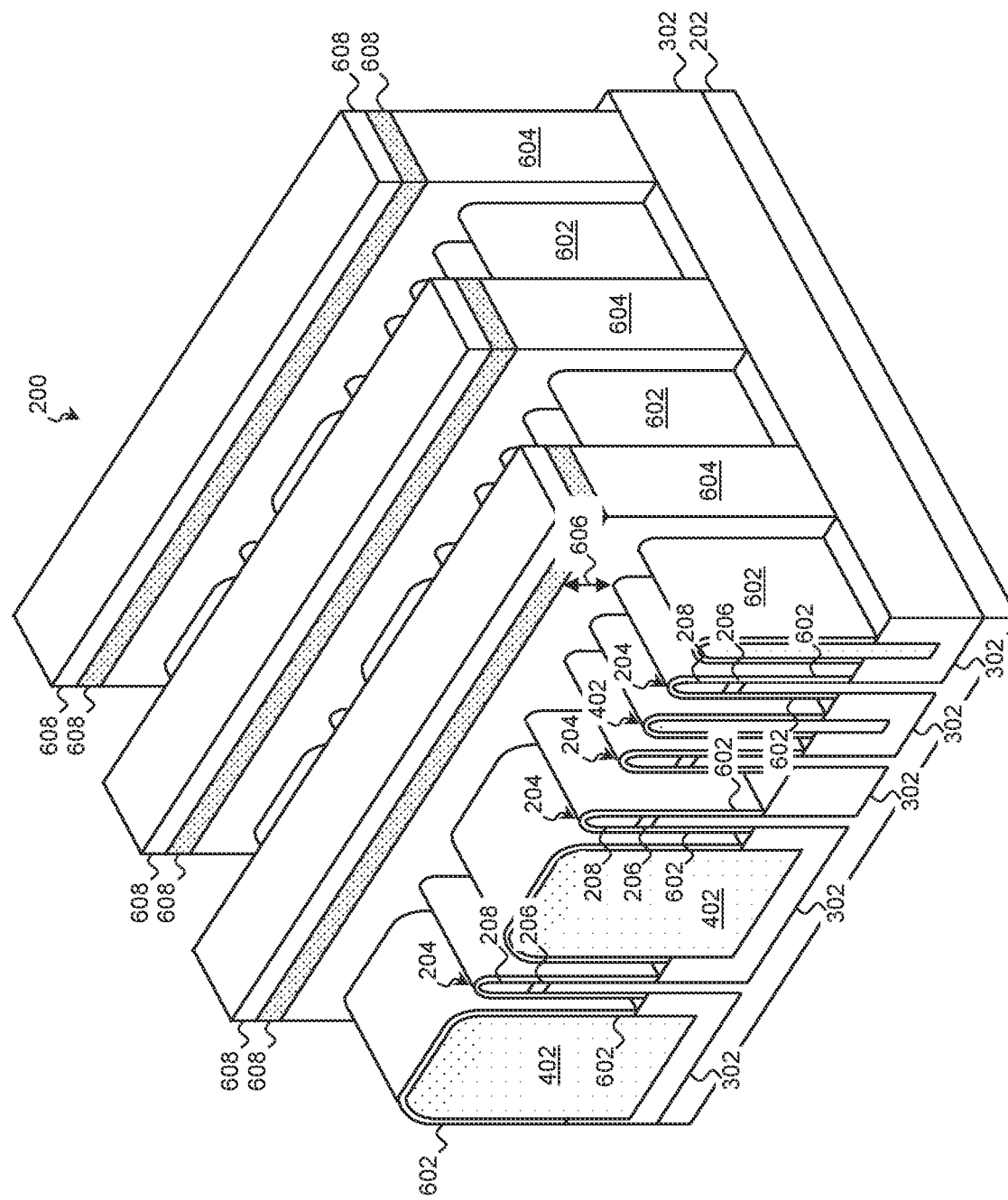
Figure 7:
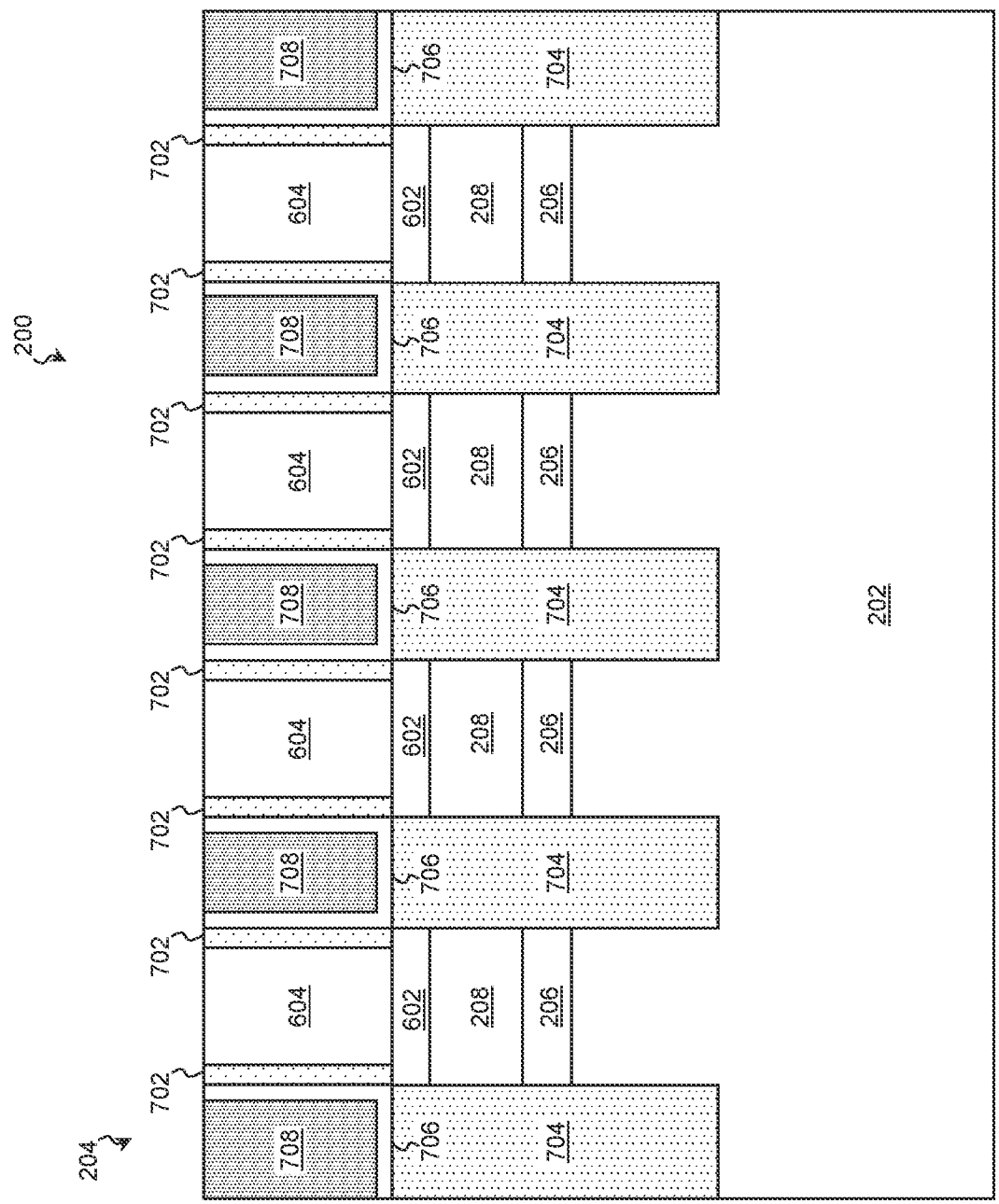
FIG. 7 is a cross-sectional illustration of the workpiece taken along a length of a fin undergoing the method according to various aspects of the present disclosure.

Referring to block 110 of FIG. 1A and to FIG. 6, a second dielectric layer 602 may be formed on the fins 204 and on the cut features 402. The second dielectric layer 602 may include any suitable material, such as one or more dielectric materials including a semiconductor oxide, a semiconductor nitride, a semiconductor oxynitride, a semiconductor carbide, a semiconductor carbonitride, and/or a semiconductor oxycarbonitride. In an example, the second dielectric layer 602 includes silicon oxide.

The second dielectric layer 602 may be formed by any suitable process, and in some examples, is formed using thermal oxidation, ALD, PEALD, CVD, PECVD, HDP-CVD, and/or other suitable techniques. The second dielectric layer 602 may be formed to any suitable thickness, and in various examples, has a thickness between about 1 nm and about 5 nm.

Referring to block 112 of FIG. 1A and referring still to FIG. 6, placeholder gates 604 are formed over and surrounding the channel regions of the fins 204 and over and surrounding the cut features 402. When materials of the functional gate structures are sensitive to fabrication processes or are difficult to pattern, placeholder gates 604 of polysilicon, dielectric, and/or other resilient material may be used during some of the fabrication processes. The placeholder gates are later removed and replaced with elements of functional gates (e.g., a gate electrode, a gate dielectric layer, an interfacial layer, etc.) in a gate-last process. In this way, the placeholder gates 604 reserve area for the forthcoming functional gates.

The placeholder gates 604 run perpendicular to the fins 204 and the cut features 402 and extend above the top of the fins 204 (including any fin-top hard masks 206 and 208) and above the top of the cut features 402 as indicated by marker 606. In an example where the fins 204 and fin-top hard masks 206 and 208 extend between about 100 nm and about 500 nm above the topmost surface of the first dielectric layer 302, the placeholder gates 604 extend another 50 nm or more from the upper-most surface of the fin-top hard masks 206 and 208.

The placeholder gates 604 may include any suitable material, such as polysilicon, one or more dielectric materials (e.g., a semiconductor oxide, a semiconductor nitride, a semiconductor oxynitride, a semiconductor carbide, a semiconductor carbonitride, a semiconductor oxycarbonitride, etc.), and/or other suitable material. The material of the placeholder gates 604 may be formed by any suitable process including CVD, PECVD, HDP-CVD, PVD, ALD, PEALD, and/or other suitable deposition processes. In some examples, the material of the placeholder gate is deposited in a blanket deposition and etched to selectively remove portions of the material so that the placeholder gates 604 remain over the channel regions of the fins 204. To aid in patterning, one or more placeholder gate hard mask layers 608 of dielectric material or other suitable material may be formed on top of the placeholder gate material prior to etching.

Referring to block 114 of FIG. 1A and to FIG. 7, sidewall spacers 702 are formed on side surfaces of the placeholder gates 604. In various examples, the sidewall spacers 702 include one or more layers of suitable materials, such as a dielectric material (e.g., a semiconductor oxide, a semiconductor nitride, a semiconductor oxynitride, a semiconductor carbide, a semiconductor oxycarbonitride, etc.). In one embodiment, the sidewall spacers 702 each include a first layer of a semiconductor oxide, a second layer of a semiconductor nitride disposed on the first layer, and a third layer of a semiconductor oxide disposed on the second layer. In the embodiment, each layer of the sidewall spacers 702 has a thickness between about 1 nm and about 50 nm.

Referring to block 116 of FIG. 1A and referring still to FIG. 7, source/drain features 704 are formed on the fins 204 on opposing sides of the placeholder gates 604. The source/drain features 704 may be formed by recessing a portion of the fins 204 and depositing material in the recess using a CVD deposition technique (e.g., Vapor-Phase Epitaxy (VPE) and/or Ultra-High Vacuum CVD (UHV-CVD)), molecular beam epitaxy, and/or other suitable processes. The epitaxy process may use gaseous and/or liquid precursors, which interact with a component of the remaining portions of the fins 204 (e.g., silicon or silicon-germanium) to form the source/drain features 704. The semiconductor component of the source/drain features 704 may be similar to or different from the remainder of the fin 204. For example, Si-containing source/drain features 704 may be formed on a SiGe-containing fin 204 or vice versa. When the source/drain features 704 and fins 204 contain more than one semiconductor, the ratios may be substantially similar or different.

The source/drain features 704 may be in-situ doped to include p-type dopants, such as boron, $BF_2$, or indium; n-type dopants, such as phosphorus or arsenic; and/or other suitable dopants including combinations thereof. Additionally or in the alternative, the source/drain features 704 may be doped using an implantation process (i.e., a junction implant process) after the source/drain features 704 are formed. With respect to the particular dopant type, the source/drain features 704 are doped to be of opposite type than the remainder of the fins 204. For a p-channel device, the fin 204 is doped with an n-type dopant and the source/drain features 704 are doped with a p-type dopant, and vice versa for an n-channel device. Once the dopant(s) are introduced into the source/drain features 704, a dopant activation process, such as Rapid Thermal Annealing (RTA) and/or a laser annealing process, may be performed to activate the dopants.

A contact-etch stop layer (CESL) 706 may be formed on the source/drain features 704 and along the top and sides of the placeholder gates 604. The CESL 706 may include a dielectric (e.g., a semiconductor oxide, a semiconductor nitride, a semiconductor oxynitride, a semiconductor carbide, etc.) and/or other suitable material, and in various embodiments, the CESL 706 includes SiN, SiO, SiON, and/or SiC. The CESL 706 may be deposited by any suitable technique including ALD, PEALD, CVD, PECVD, and/or HDP-CVD and may be formed to any suitable thickness. In some examples, the CESL 706 has a thickness between about 1 nm and about 50 nm.

Figure 8:
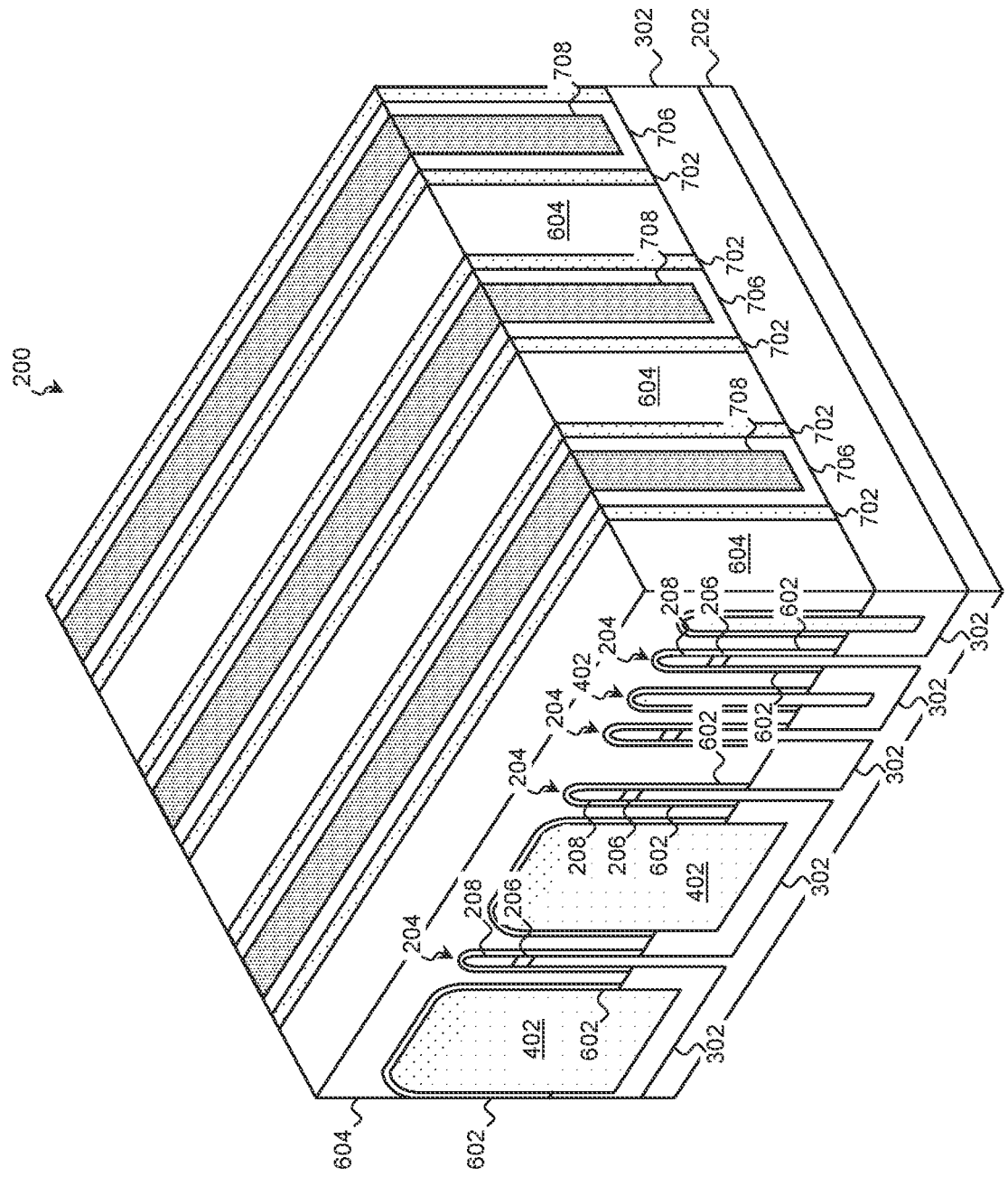

Referring to block 118 of FIG. 1A and referring to FIGS. 7 and 8, an Inter-Level Dielectric (ILD) layer 708 is formed on the workpiece 200. The ILD layer 708 acts as an insulator that supports and isolates conductive traces of an electrical multi-level interconnect structure. In turn, the multi-level interconnect structure electrically interconnects elements of the workpiece 200, such as the source/drain features 704 and the functional gates. The ILD layer 708 may include a dielectric material (e.g., a semiconductor oxide, a semiconductor nitride, a semiconductor oxynitride, a semiconductor carbide, etc.), SOG, fluoride-doped silicate glass (FSG), phosphosilicate glass (PSG), borophosphosilicate glass (BPSG), Black Diamond® (Applied Materials of Santa Clara, California), Xerogel, Aerogel, amorphous fluorinated carbon, parylene, BCB, SILK® (Dow Chemical of Midland, Michigan), and/or combinations thereof. The ILD layer 708 may be formed by any suitable process including CVD, PVD, spin-on deposition, and/or other suitable processes.

As illustrated in FIGS. 7 and 8, a CMP process may be performed following the deposition of the ILD layer 708 to planarize the ILD layer 708, the CESL 706, the sidewall spacers 702, and/or the placeholder gates 604. In particular, the CMP process may remove the placeholder gate hard mask layers 608 from the top of the placeholder gates 604.

Figure 9:
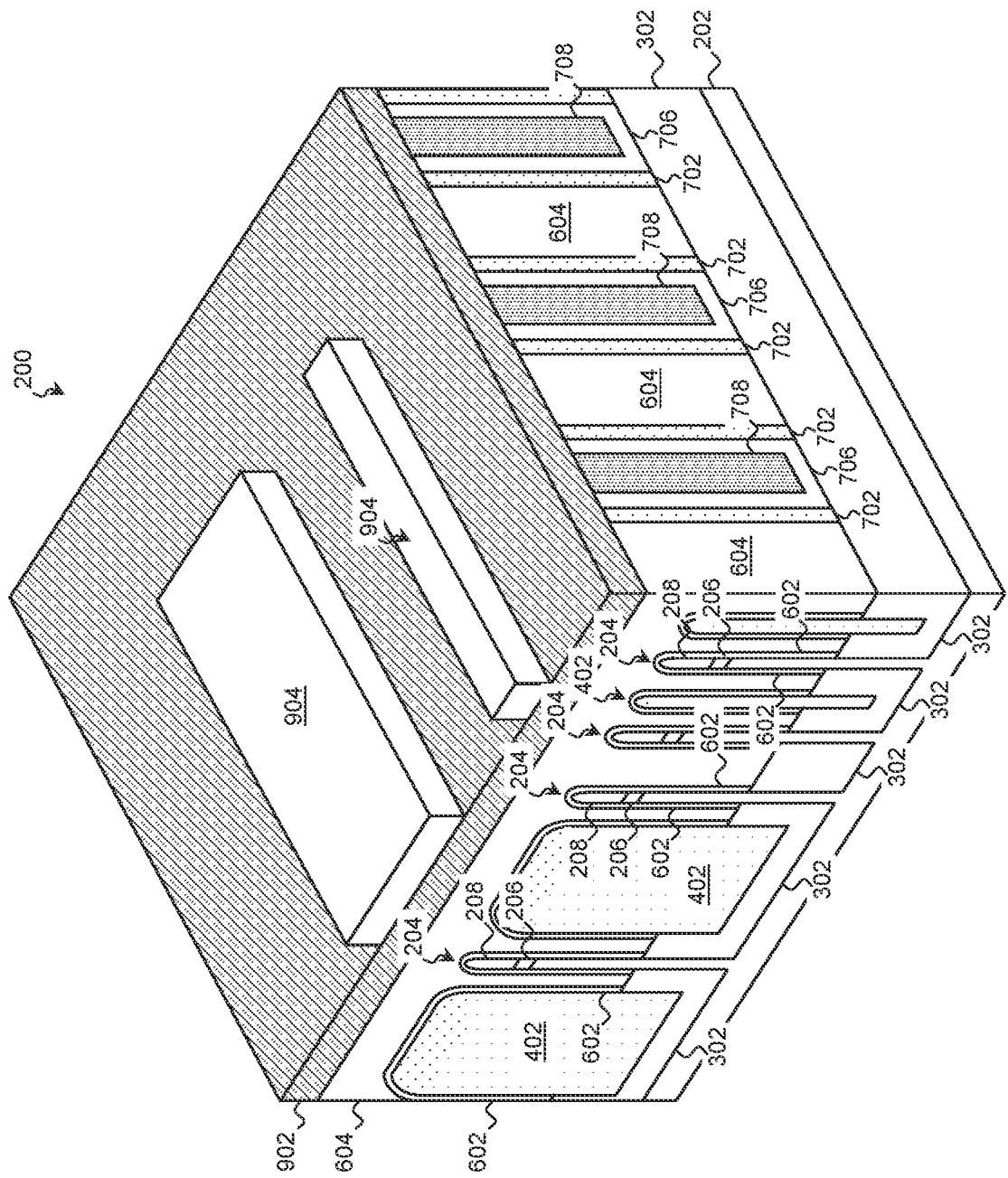

Referring to block 120 of FIG. 1B and to FIG. 9, one or more patterned hard masks (e.g., cut patterning hard masks 902 and 904) are formed on the ILD layer 708 and on the placeholder gates 604. The cut patterning hard masks 902 and 904 are patterned to expose portions of the cut features 402 where the cut features 402 are not needed. In the subsequent processes, the portions of the cut features 402 that are not protected by the cut patterning hard masks 902 and 904 are recessed so that forthcoming gates extend over the recessed cut features 402 and thereby connect. Conversely, the patterned cut patterning hard masks 902 and 904 cover those portions of the cut features 402 that are to remain in order to separate the gates on either side.

The cut patterning hard masks 902 and 904 may include any suitable masking material, such as one or more dielectric materials including a semiconductor oxide, a semiconductor nitride, a semiconductor oxynitride, a semiconductor carbide, a semiconductor carbonitride, a semiconductor oxycarbonitride, a metal oxide. In one such example, a first cut patterning hard mask 902 includes amorphous silicon, and a second cut patterning hard mask 904 includes a dielectric material.

Referring to block 122 of FIG. 1B, those cut features 402 that are not covered by the cut patterning hard masks 902 and 904 are etched back while the cut features 402 that are covered by the cut patterning hard masks 902 and 904 remain. Doing so may include one or more etching processes, each configured to selectively etch a particular material or set of materials. The etching process of block 122 may include any suitable etching techniques, such as wet etching, dry etching, RIE, ashing, and/or other etching methods.

Figure 10:
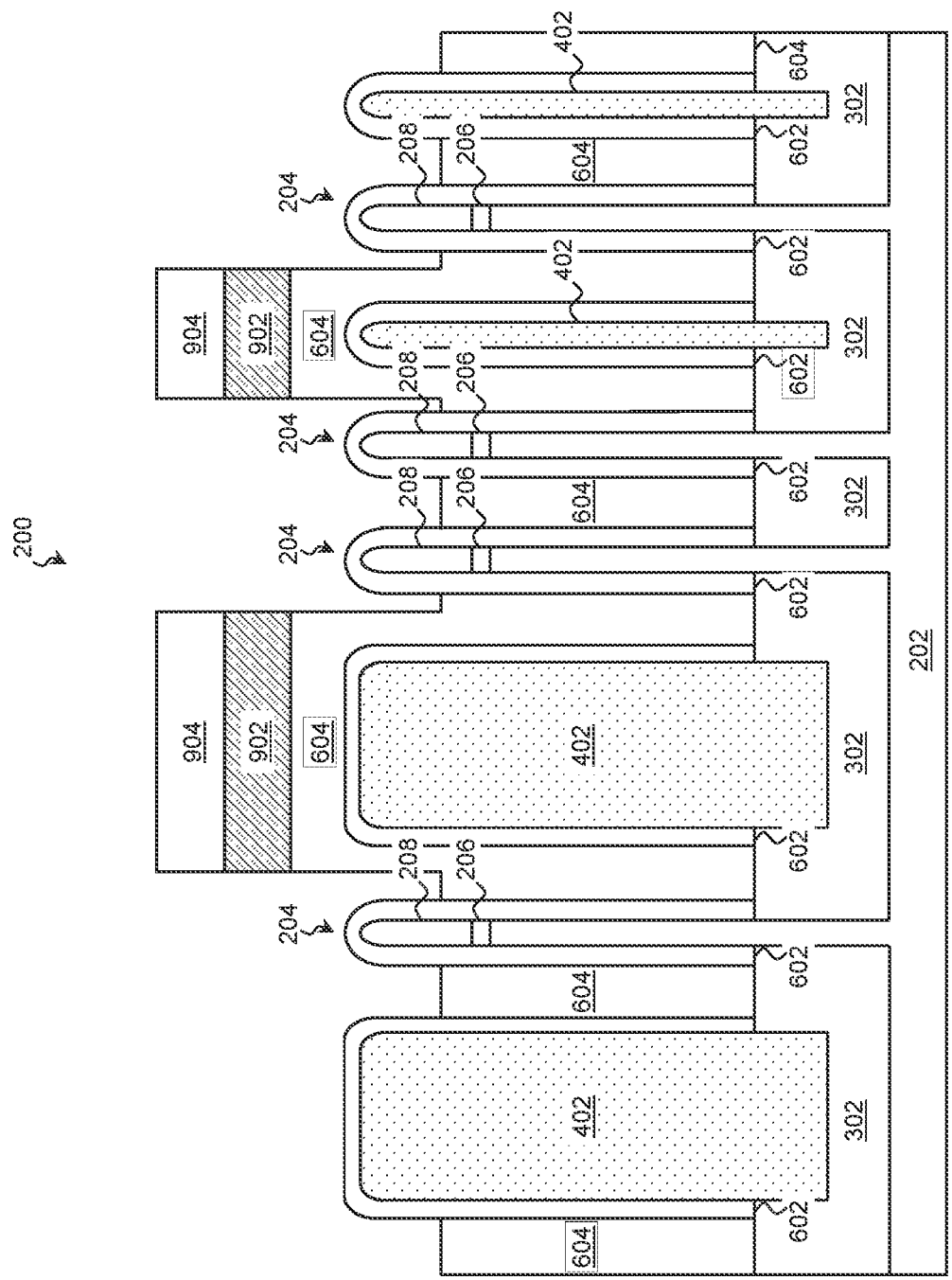
FIGS. 10-13 are cross sectional illustrations of the workpiece taken along a gate region undergoing the method according to various aspects of the present disclosure.
Figure 11:
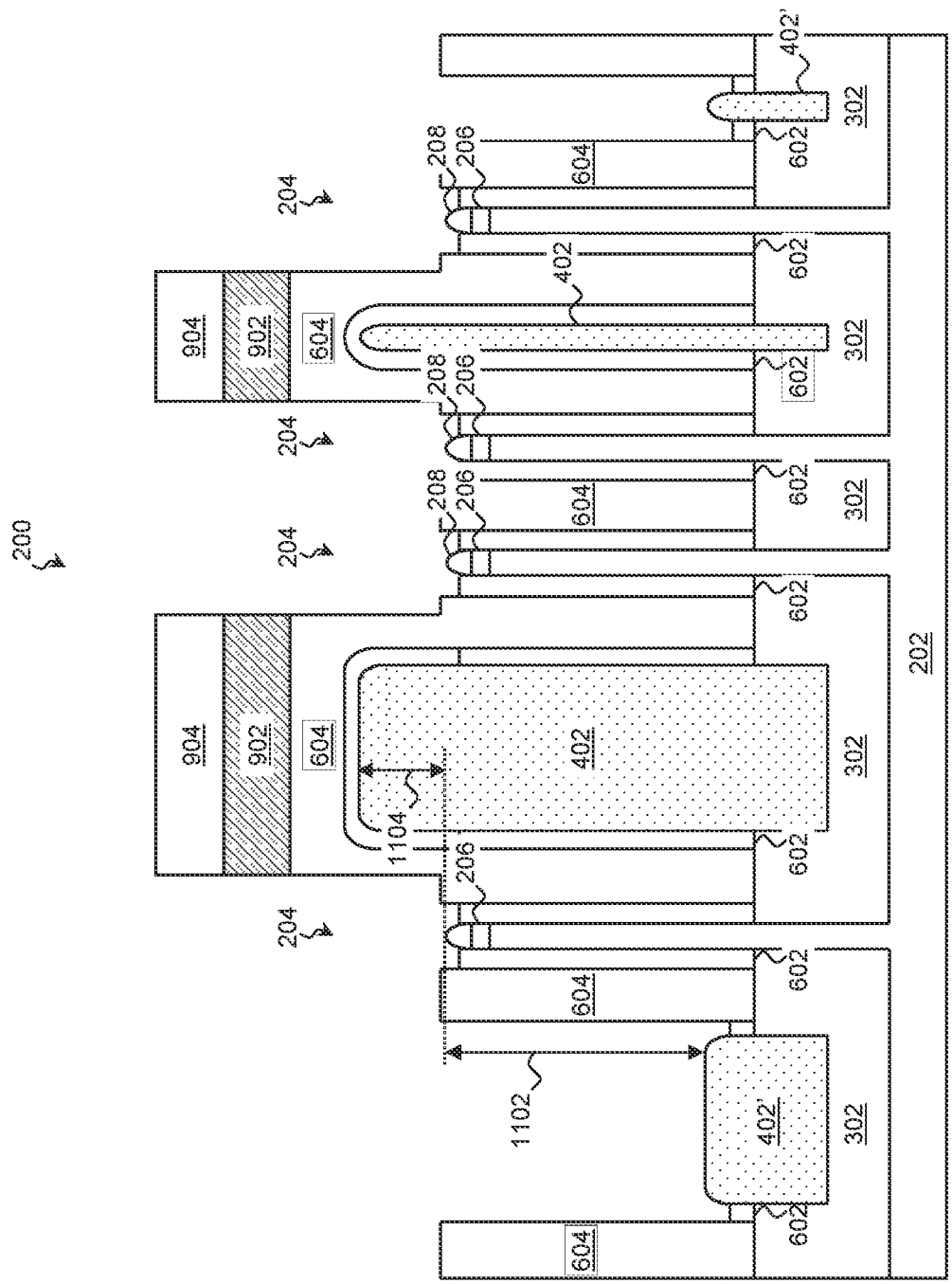
Figure 12:
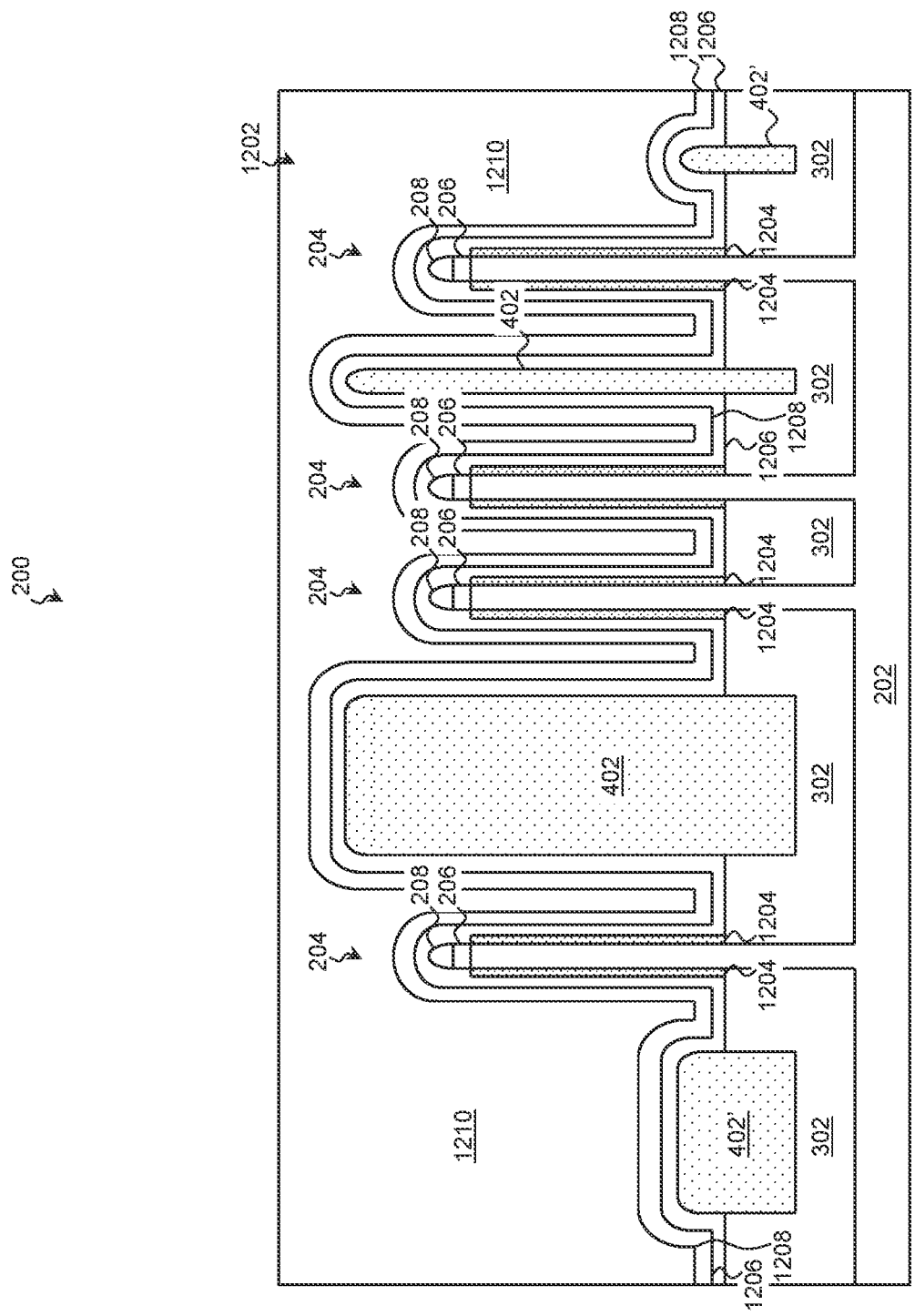

Referring to FIG. 10, in some examples, block 122 includes a first etching process to etch back the portions of the placeholder gates 604 exposed by the cut patterning hard masks 902 and 904 so that at least the top portions of the underlying fins 204 and cut features 402 are exposed. In the examples, referring to FIG. 11, the first etching process is followed by a second etching process configured to remove the second dielectric layer 602 and to recess the exposed cut features 402, thereby forming recessed cut features 402'. Any suitable amount of the cut features 402 may be removed. In an example, the exposed cut features 402 are recessed to a height that is between about 20 nm and about 100 nm below a topmost surface of the fins 204 (including any fin-top hard masks 206 and/or 208 remaining on the fins 204) as indicated by marker 1102. Recessing the cut features 402 in this way leaves space for the forthcoming gate electrode to extend between fins 204 on opposite sides of the cut features 402.

The second etching process may also recess the fin-top hard masks 206 and 208. In some examples, the etching of the second etching process completely removes the fin-top hard masks 206 and 208 so that the fins 204 are exposed. In some examples, the second etching process leaves the fin-top hard masks 206 and 208 with a combined thickness of no more than about 10 nm. In both types of examples, the top of the fins 204 and any fin-top hard masks 206 and 208 are below the topmost surface of the unetched cut features 402 to reserve space for a functional gate to extend over the fins 204. In some examples, the topmost surface of the unetched cut features 402 is between about 5 nm and about 50 nm above the top of the fins 204 and any fin-top hard masks 206 and 208 at the conclusion of block 122 as indicated by marker 1104.

Referring to block 124 of FIG. 1B, an etching process is performed to remove the remaining cut patterning hard masks 902 and 904 and placeholder gates 604. This may include removing a remainder of the second dielectric layer 602 from the fins 204 and the cut features 402. The etching process may include one or more iterations of various etching techniques, such as wet etching, dry etching, RIE, ashing, etc., each configured to selectively etch a particular material or set of materials.

Removing the placeholder gates 604 leaves recesses in which to form functional gates. Referring to block 126 of FIG. 1B and to FIG. 12, the forming of functional gates 1202 in the recesses begins by forming an interfacial layer 1204 on the side surfaces of the fins 204 and on the top of the fins 204 in those embodiments where the fin-top hard masks 206 and 208 are removed. The interfacial layer 1204 may include an interfacial material, such as a semiconductor oxide, semiconductor nitride, semiconductor oxynitride, other semiconductor dielectrics, other suitable interfacial materials, and/or combinations thereof. The interfacial layer 1204 may be formed to any suitable thickness using any suitable process including thermal growth, ALD, CVD, HDP-CVD, PVD, spin-on deposition, and/or other suitable deposition processes. In some examples, the interfacial layer 1204 is formed by a thermal oxidation process and includes a thermal oxide of a semiconductor present in the fins 204 (e.g., silicon oxide for silicon-containing fins 204, silicon-germanium oxide for silicon-germanium-containing fins 204, etc.).

Referring to block 128 of FIG. 1B, a gate dielectric 1206 is formed on the interfacial layer 1204 on the side surfaces of the fins 204 and on the top of the fins 204. The gate dielectric 1206 may include one or more dielectric materials, which are commonly characterized by their dielectric constant relative to silicon dioxide. In some embodiments, the gate dielectric 1206 includes a high-k dielectric material, such as $HfO_2$, HfSiO, HfSiON, HfTaO, HfTiO, HfZrO, zirconium oxide, aluminum oxide, hafnium dioxide-alumina ($HfO_2$—$Al_2O_3$) alloy, other suitable high-k dielectric materials, and/or combinations thereof. Additionally or in the alternative, the gate dielectric 1206 may include other dielectrics, such as a semiconductor oxide, semiconductor nitride, semiconductor oxynitride, semiconductor carbide, amorphous carbon, TEOS, other suitable dielectric material, and/or combinations thereof. The gate dielectric 1206 may be formed using any suitable process including ALD, PEALD, CVD, Plasma Enhanced CVD (PE CVD), HDP-CVD, PVD, spin-on deposition, and/or other suitable deposition processes. The gate dielectric 1206 may be formed to any suitable thickness, and in some examples, the gate dielectric 1206 has a thickness of between about 0.1 nm and about 3 nm.

Referring to block 130 of FIG. 1B, one or more work function layers 1208 of the functional gates 1202 are formed on the gate dielectric 1206. Specifically, the work function layers 1208 may be formed on the top and the sides of the fins 204 and on the top and sides of the cut features 402 and the recessed cut feature 402'. Suitable work function layer materials include n-type and/or p-type work function materials based on the type of device. Exemplary p-type work function metals include TiN, TaN, Ru, Mo, Al, WN, $ZrSi_2$, $MoSi_2$, $TaSi_2$, $NiSi_2$, WN, other suitable p-type work function materials, and/or combinations thereof. Exemplary n-type work function metals include Ti, Ag, TaAl, TaAlC, TiAlN, TaC, TaCN, TaSiN, Mn, Zr, other suitable n-type work function materials, and/or combinations thereof. The work function layer(s) 1208 may be deposited by any suitable technique including ALD, CVD, PE CVD, PEALD, PVD, and/or combinations thereof.

Referring to block 132 of FIG. 1B, an electrode fill 1210 of the functional gates 1202 is deposited on the work function layer(s) 1208. The electrode fill 1210 may include any suitable material including metals (e.g., W, Al, Ta, Ti, Ni, Cu, Co, etc.), metal oxides, metal nitrides and/or combinations thereof, and in an example, the electrode fill includes tungsten. The electrode fill 1210 may be deposited by any suitable technique including ALD, CVD, PE CVD, PEALD, PVD, and/or combinations thereof.

Figure 13:
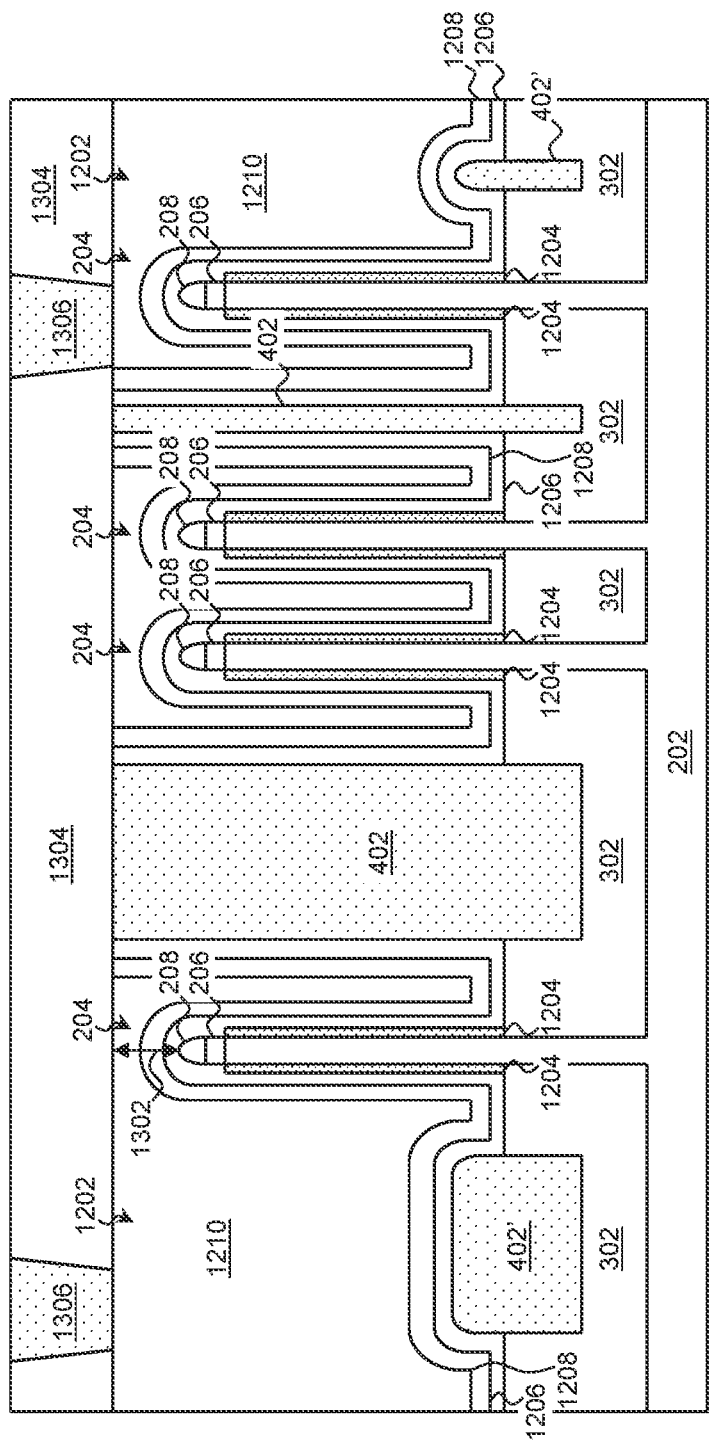

Referring to block 134 of FIG. 1B and to FIG. 13, a CMP process may be performed to remove excess gate material (e.g., material of: the gate dielectric 1206, the work function layer(s) 1208, the electrode fill 1210, etc.) that is outside of the functional gates 1202. In particular, the CMP process removes conductive material of the functional gates 1202 including the work function layer(s) 1208 and the electrode fill 1210 from top of those cut features 402 that were not recessed in block 122. In this way, these cut features 402 provide an insulating structure that electrically isolates the functional gates 1202 on either side. Thus, the technique creates functional gates 1202 that are aligned and extend in the same plane but are electrically isolated by the cut features 402. As illustrated in FIG. 13, the recessed cut features 402' do not serve as insulating structures and the functional gates 1202 extend over the recessed cut features 402'.

In contrast, the CMP process leaves a portion of the conductive material of the functional gates 1202 over the fin 204 and any fin-top hard masks 206 and 208. In some such examples, the thickness 1302 of the functional gate 1202 on top of the fins 204 is between about 5 nm and about 50 nm.

Referring to block 136 of FIG. 1B, the workpiece 200 may then be provided for further fabrication. In various examples, this includes forming additional ILD layers (e.g., second ILD layer 1304), forming contacts 1306 coupling to the source/drain features 704 and to the functional gates 1202, forming a remainder of an electrical interconnect structure, dicing, packaging, and other fabrication processes.

These remaining processes may include forming contacts that electrically couple to the functional gates 1202. In some examples, wider cut features 402 may be thinned horizontally to provide additional coupling area for the contact by changing the pattern of the cut patterning hard masks 902 and 904 in block 120. Examples of thinned cut features formed by method 100 are described with reference to FIGS. 14 and 15, which are cross-sectional illustrations of workpieces taken along gate regions of the workpieces having a thinned cut feature according to various aspects of the present disclosure.

Figure 14:
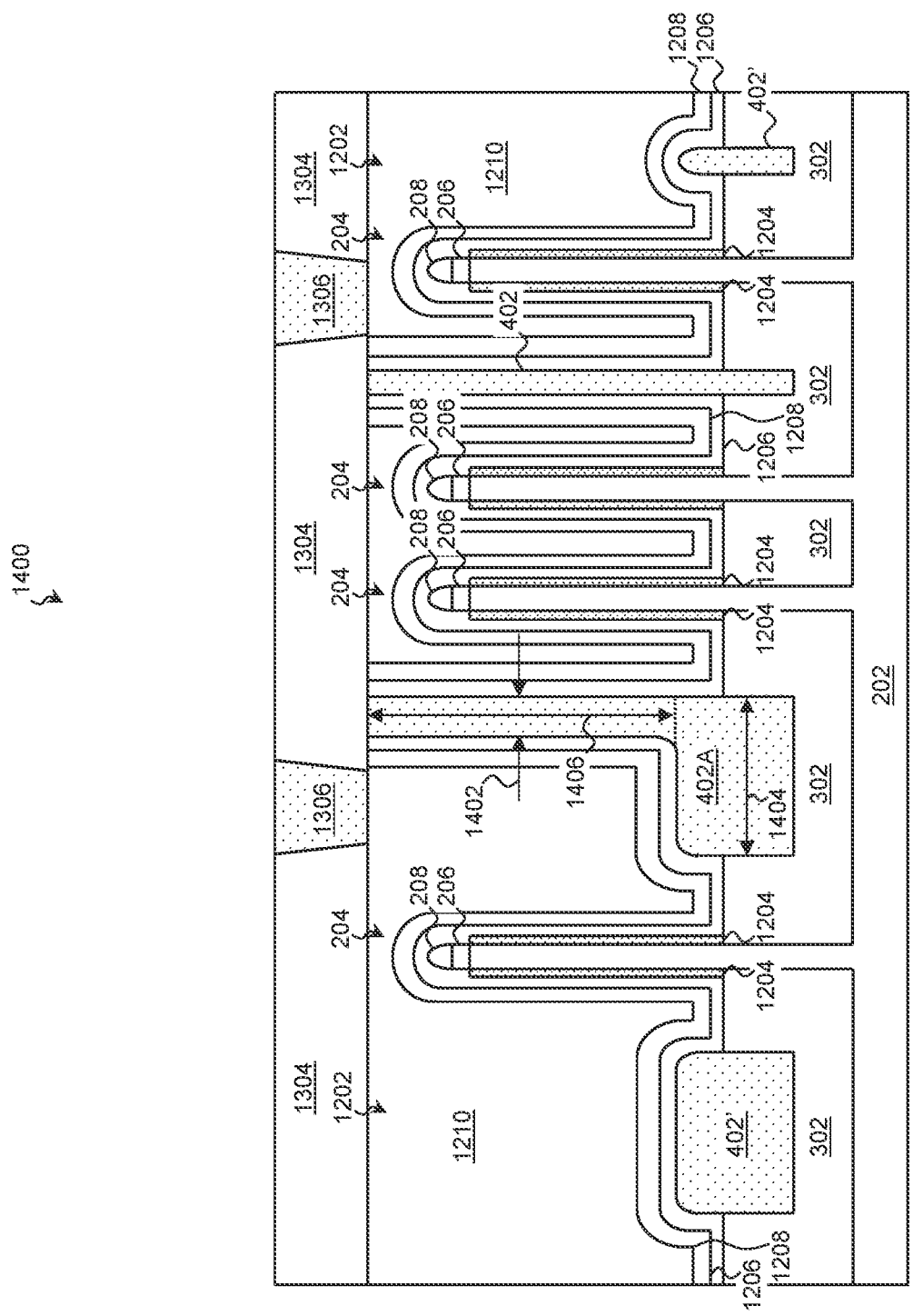
FIGS. 14 and 15, which are cross-sectional illustrations of workpieces taken along the gate regions having thinned cut features according to various aspects of the present disclosure.

Referring first to FIG. 14, a workpiece 1400 is illustrated that is substantially similar to workpiece 200 except where noted. By protecting only a portion of cut feature 402A with the cut patterning hard masks 902 and 904, the cut feature 402A is formed with a width 1402 in a top portion that is narrower than a width 1404 in a bottom portion. In some examples where the width 1404 of the bottom portion is about 500 nm, the width 1402 of the top portion is between about 3 nm and about 490 nm. The top portion may extend any height 1406 above the bottom portion, and in various such examples, the top portion extends between about 20 nm and about 150 nm above the bottom portion.

As can be seen, when a second ILD layer 1304 is formed on the functional gate 1202, the narrower cut feature 402A allows more area for contacts 1306 to couple to the functional gate 1202.

Figure 15:
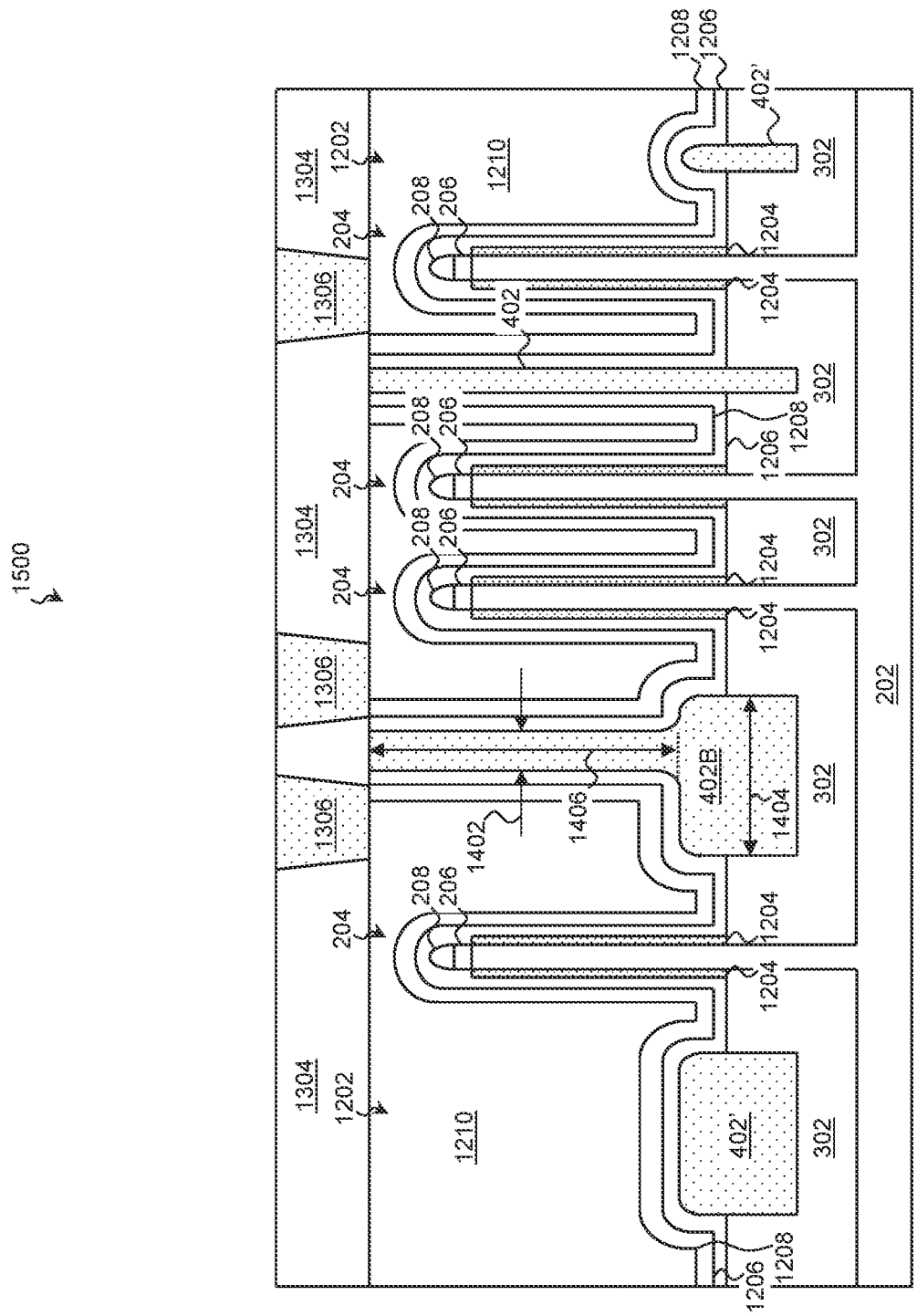

Referring next to FIG. 15, a workpiece 1500 is illustrated that is substantially similar to workpieces 200 and 1400, except where noted. In particular, the workpiece 1500 is substantially similar to workpiece 1400 except that the narrower top portion of cut feature 402B is arranged in the middle of the wider bottom portion of the cut feature 402B. This configuration also allows more area for contacts 1306 to couple to the functional gate 1202 when a second ILD layer 1304 is formed on the functional gate 1202.

Figure 16:
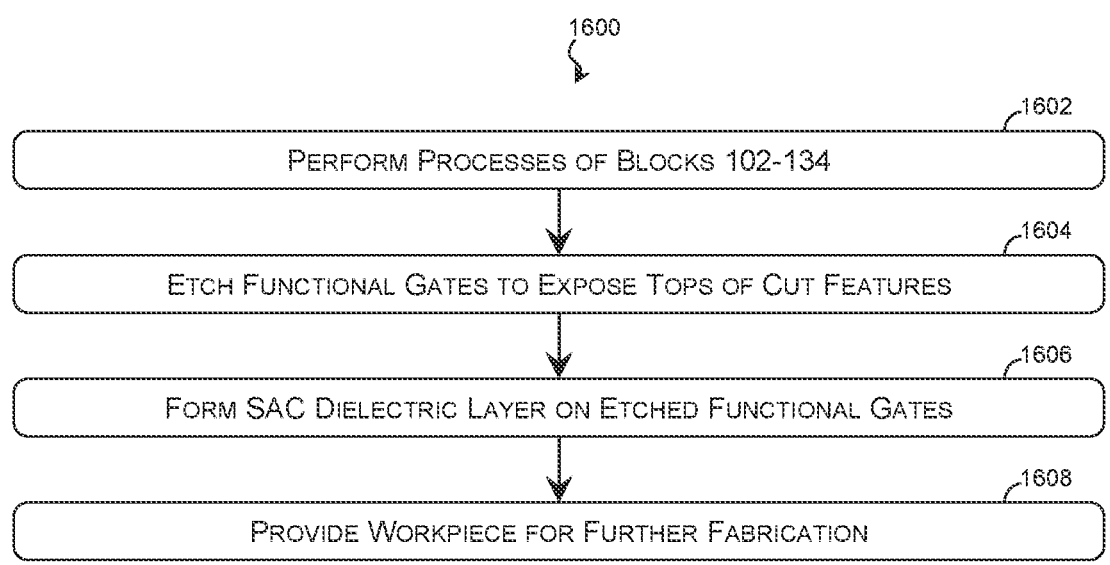
FIG. 16 is a flow diagram of a method of fabricating a workpiece using a self-aligned contact process according to various aspects of the present disclosure.
Figure 17:
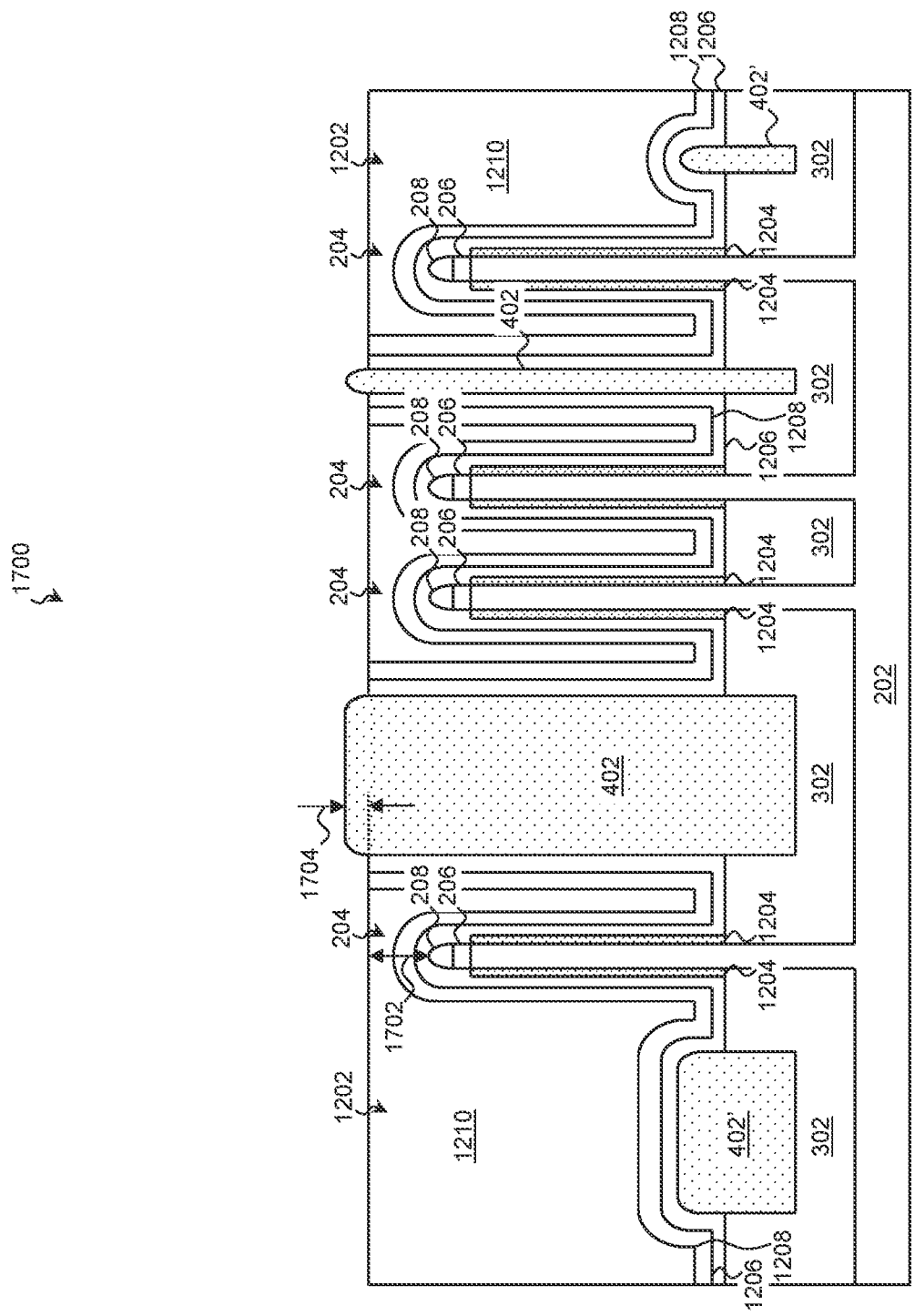
FIGS. 17-19 are cross-sectional illustrations of a workpiece taken along a gate region undergoing the method of fabrication using a self-aligned contact process according to various aspects of the present disclosure.
Figure 18:
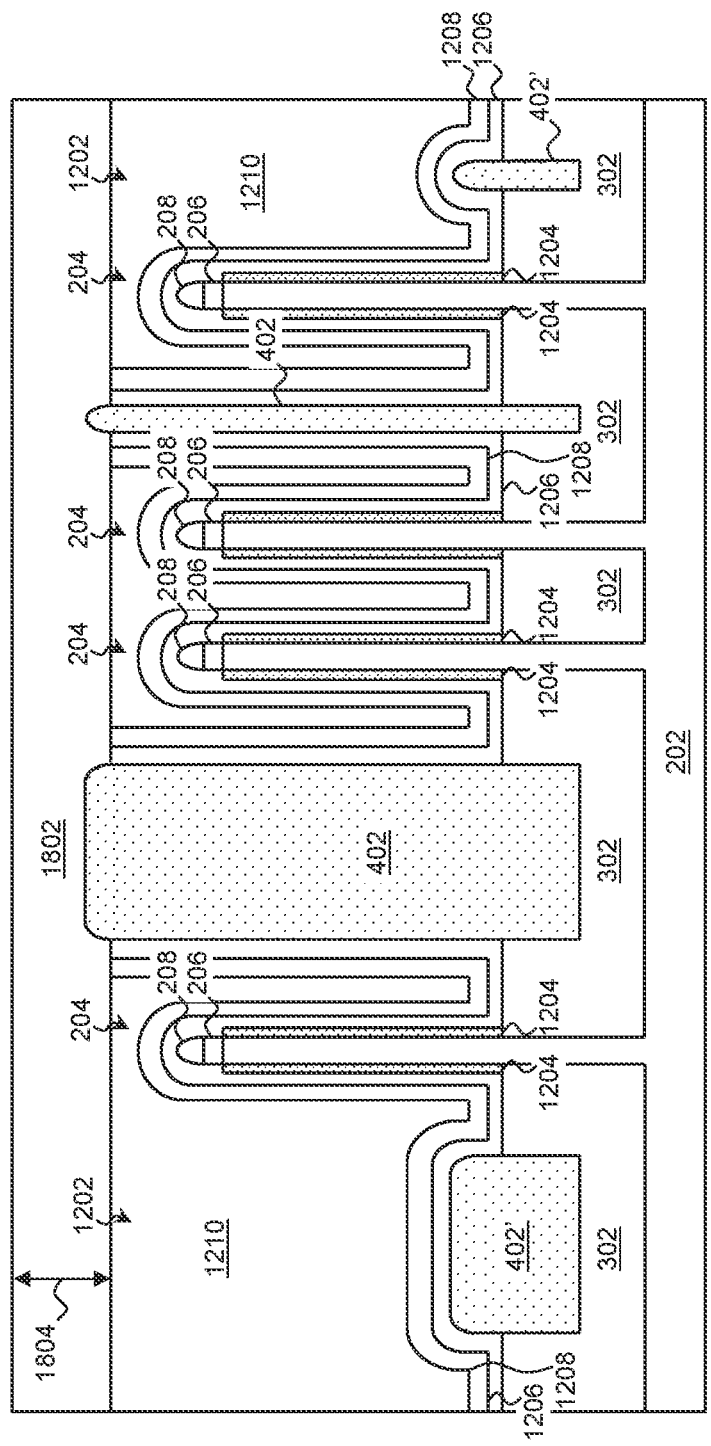
Figure 19:
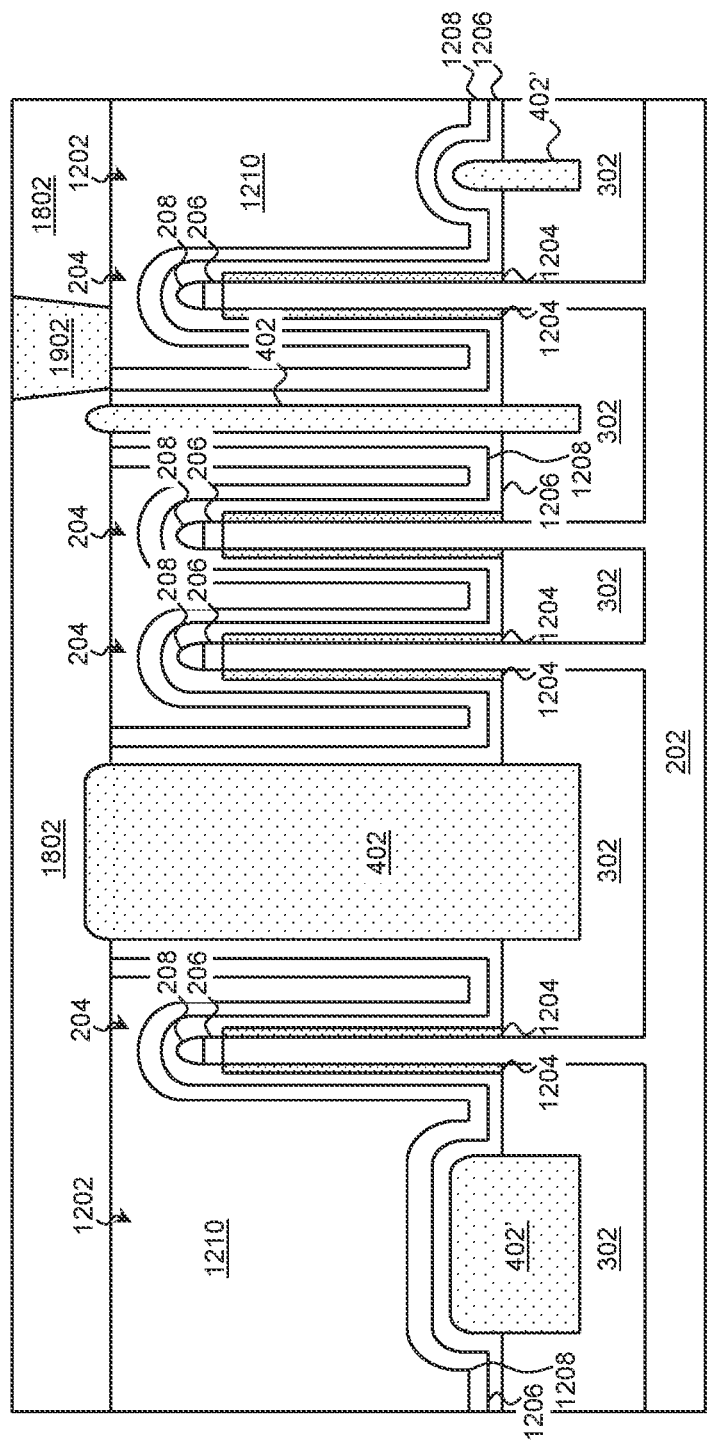

The above-described method 100 may be adapted for a self-aligned contact process. The present disclosure provides examples of an integrated circuit including a plurality of FETs and a cut technique for forming electrically isolated gates on the channel regions of selected FET devices. In that regard, FIG. 16 is a flow diagram of a method 1600 of fabricating a workpiece 1700 using a self-aligned contact process according to various aspects of the present disclosure. Additional steps can be provided before, during, and after the method 1600, and some of the steps described can be replaced or eliminated for other embodiments of the method 1600. FIGS. 17-19 are cross-sectional illustrations of the workpiece 1700 taken along a gate region undergoing the method 1600 of fabrication using a self-aligned contact process according to various aspects of the present disclosure.

Referring to block 1602 of FIG. 16, the processes of blocks 102-134 of FIGS. 1A and 1B are performed on a workpiece 1700, such that the workpiece 1700 is substantially similar to workpiece 200, except where noted. Referring to block 1604 and to FIG. 17, an etching process is performed to recess the materials of the functional gates 1202 (e.g., the gate dielectric 1206, the work function layer(s) 1208, the electrode fill 1210, etc.) to expose the top of those cut features 402 that were not recessed in block 122. In various examples, the etching is controlled so that the top of the functional gate 1202 is between about 5 nm and about 50 nm above the top of the fins 204 and any remaining fin-top hard mask 206 and/or 208 as indicated by marker 1702. In such examples, the cut features 402 extend between about 1 nm and about 30 nm above the top of the etched functional gate 1202 as indicated by marker 1704. The etching process may include any suitable etching technique, such as wet etching, dry etching, RIE, ashing, and/or other etching methods, and the etching steps and chemistries may be configured to etch the materials of the electrode fill 1210, the work function layer(s) 1208, and/or the gate dielectric 1206 without significant etching of the cut features 402.

Referring to block 1606 of FIG. 16 and to FIG. 18, a Self-Aligned Contact (SAC) dielectric layer 1802 is formed on the etched functional gate 1202. The SAC dielectric layer 1802 may include any suitable material, such as one or more dielectric materials including a semiconductor oxide, a semiconductor nitride, a semiconductor oxynitride, a semiconductor carbide, a semiconductor carbonitride, a semiconductor oxycarbonitride, and/or a metal oxide. In various examples, the SAC dielectric layer 1802 includes HfO, ZrO, AlO, LaO, BN, silicon oxide, silicon nitride, silicon carbonitride, silicon oxynitride, and/or silicon oxycarbonitride.

The SAC dielectric layer 1802 may be formed by any suitable process, and in some examples, the SAC dielectric layer 1802 is deposited using CVD, PECVD, HDP-CVD, PVD, ALD, PEALD, and/or other deposition processes. The deposition may be followed by a CMP process to remove material outside of the gate region, and the planarized SAC dielectric layer 1802 within the gate region may have any suitable thickness 1804 following the CMP process. In various examples, the SAC dielectric layer 1802 has a thickness 1804 between about 30 nm and about 500 nm.

Referring to block 1608 of FIG. 16 and to FIG. 19, the workpiece 1700 may then be provided for further fabrication. In various examples, this includes forming contacts 1902 coupling to the source/drain features 704 and to the functional gates 1202, forming a remainder of an electrical interconnect structure, dicing, packaging, and other fabrication processes.

Figure 20:
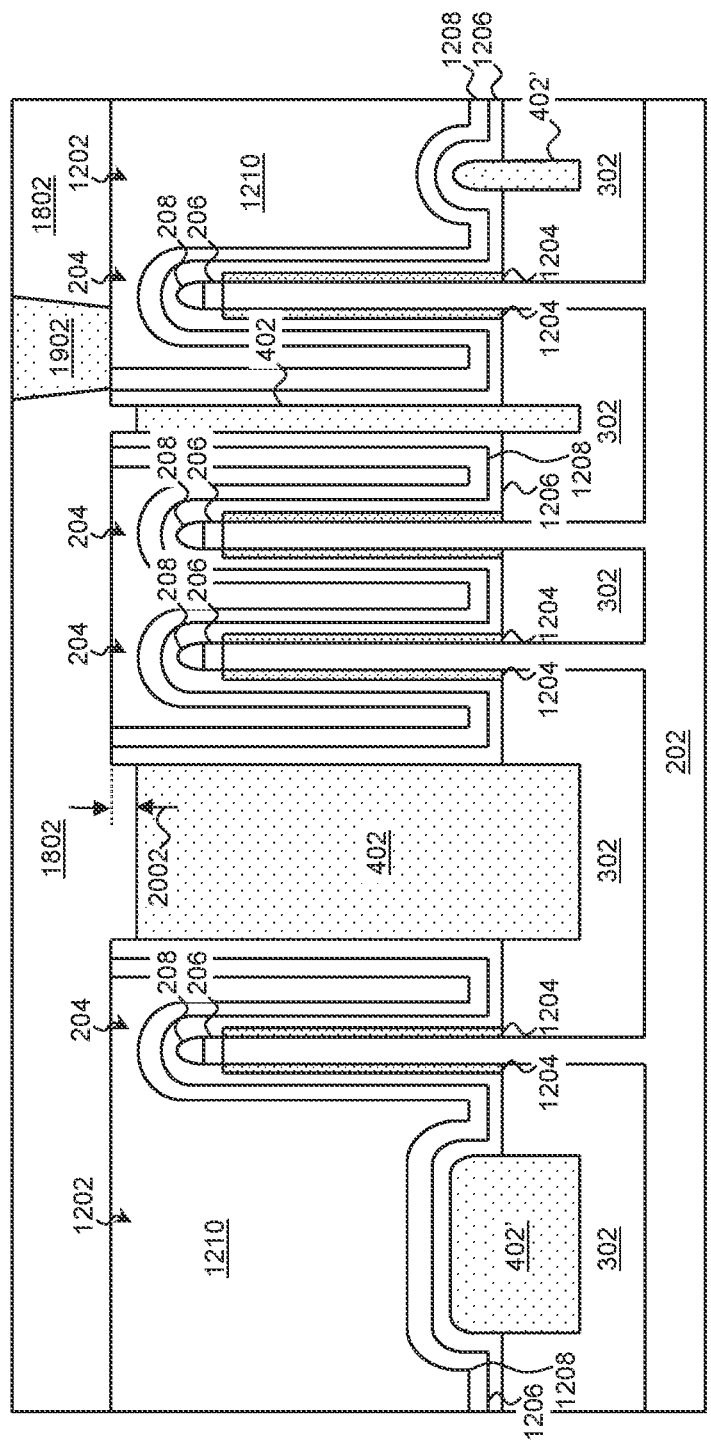
FIG. 20 is a cross-sectional illustration of a workpiece taken along a gate region undergoing a method of fabrication using a self-aligned contact process according to various aspects of the present disclosure.

In some examples, the etching of block 1604 intentionally or unintentionally recesses part of the cut features 402. Referring to FIG. 20, a workpiece 2000 is illustrated that is substantially similar to workpiece 1700 except where noted. As can be seen, the tops of the cut features 402 have been recessed to be below the top of the functional gate 1202 and the recessed portions of the cut features 402 have been filled with the SAC dielectric layer 1802. In various such examples, the SAC dielectric layer 1802 extends to a depth 2002 between about 1 nm and about 50 nm below the top of the functional gate 1202.

In some examples, wider cut features 402 may be thinned horizontally to provide additional coupling area for the contact by changing the pattern of the cut patterning hard masks 902 and 904 in block 120. Examples of thinned cut features formed by method 1600 are described with reference to FIGS. 21 and 22, which are cross-sectional illustrations of workpieces taken along gate regions having thinned cut features according to various aspects of the present disclosure.

Figure 21:
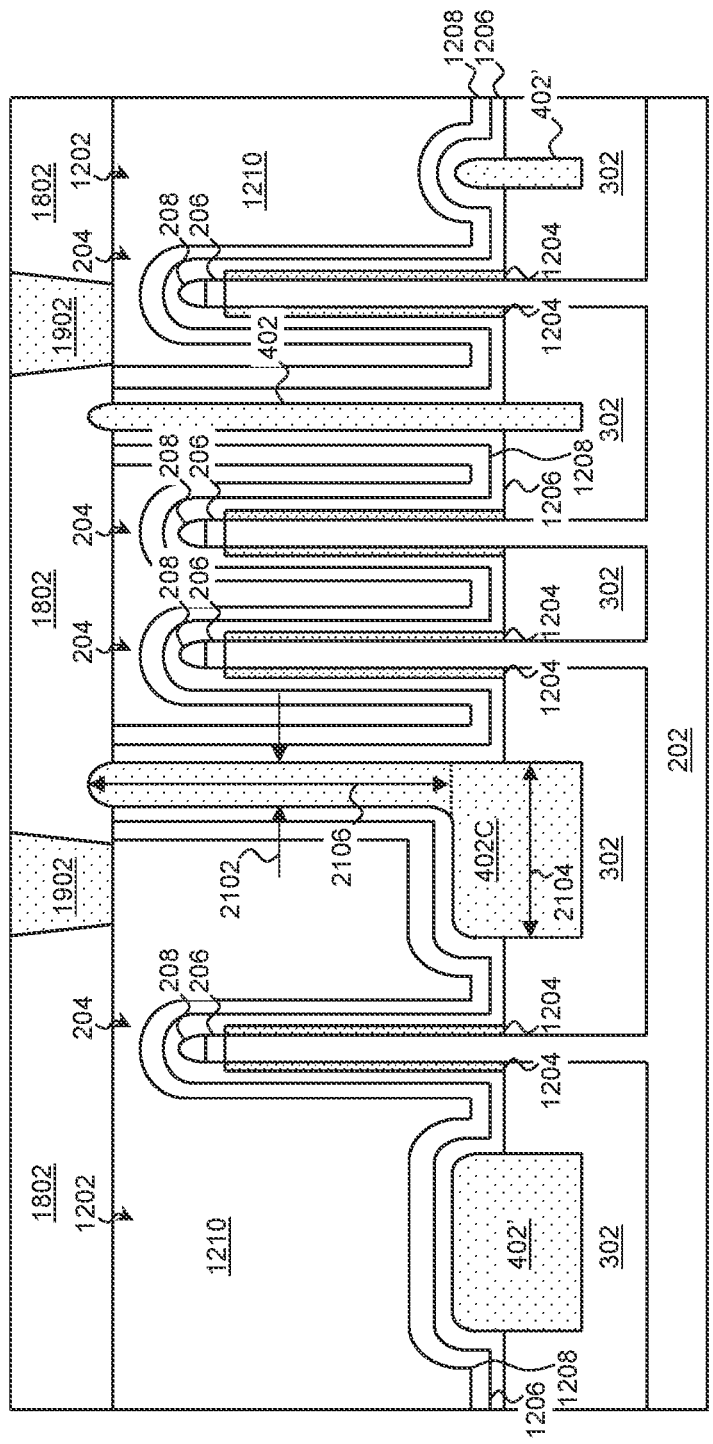
FIGS. 21 and 22 are cross-sectional illustrations of workpieces taken along gate regions having thinned cut features according to various aspects of the present disclosure.

Referring first to FIG. 21, a workpiece 2100 is illustrated that is substantially similar to workpiece 1700 except where noted. By protecting only a portion of cut feature 402C with the cut patterning hard masks 902 and 904, the cut feature 402C is formed with a width 2102 in a top portion that is narrower than a width 2104 in a bottom portion. In some examples where the width 2104 of the bottom portion is about 500 nm, the width 2102 of the top portion is between about 3 nm and about 490 nm. The top portion may extend any height 2106 above the bottom portion, and in various such examples, the top portion extends between about 20 nm and about 150 nm above the bottom portion. As can be seen, the narrower cut feature 402C allows more area for contacts 1902 to couple to the functional gate 1202.

Figure 22:
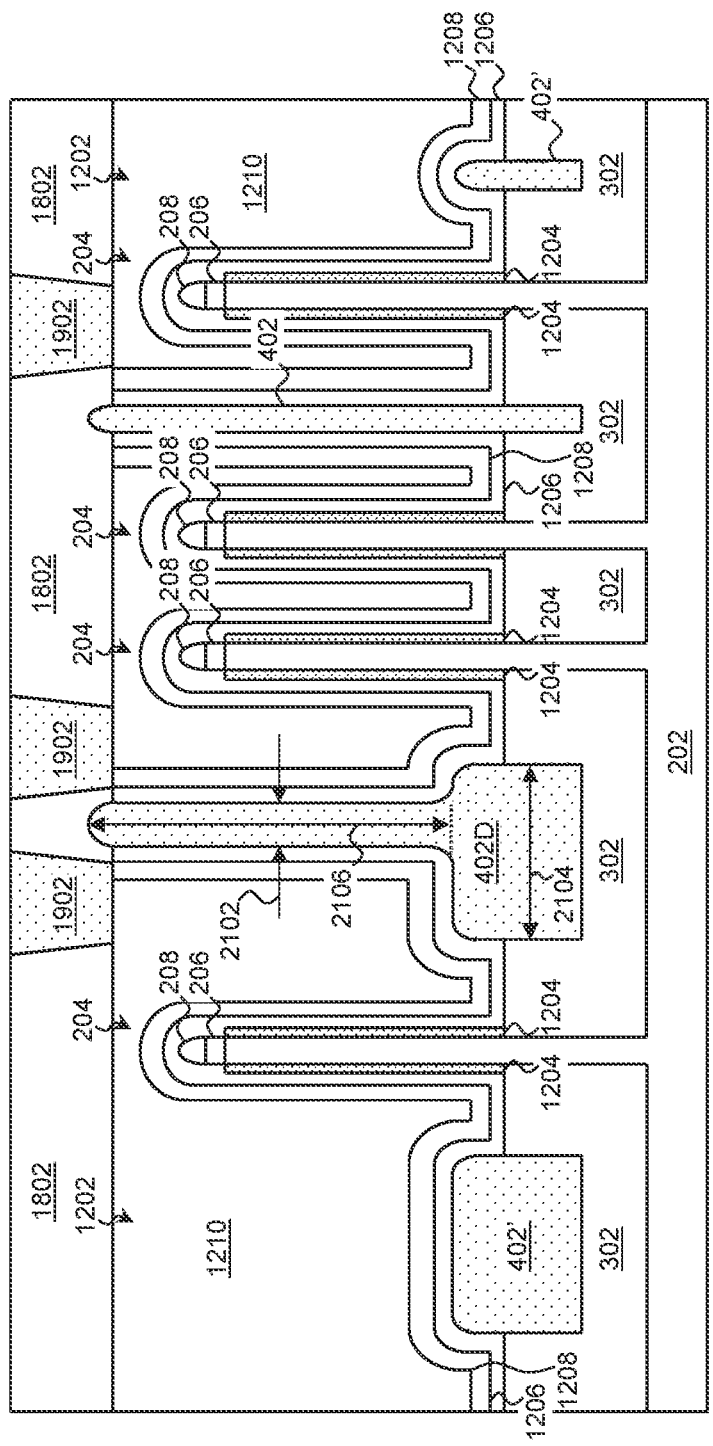

Referring next to FIG. 22, a workpiece 2200 is illustrated that is substantially similar to workpieces 1700 and 2100, except where noted. In particular, the workpiece 2200 is substantially similar to workpiece 2100 except that the narrower top portion of cut feature 402D is arranged in the middle of the wider bottom portion of the cut feature 402D. This configuration also allows more area for contacts 1902 to couple to the functional gate 1202.

Figure 23:
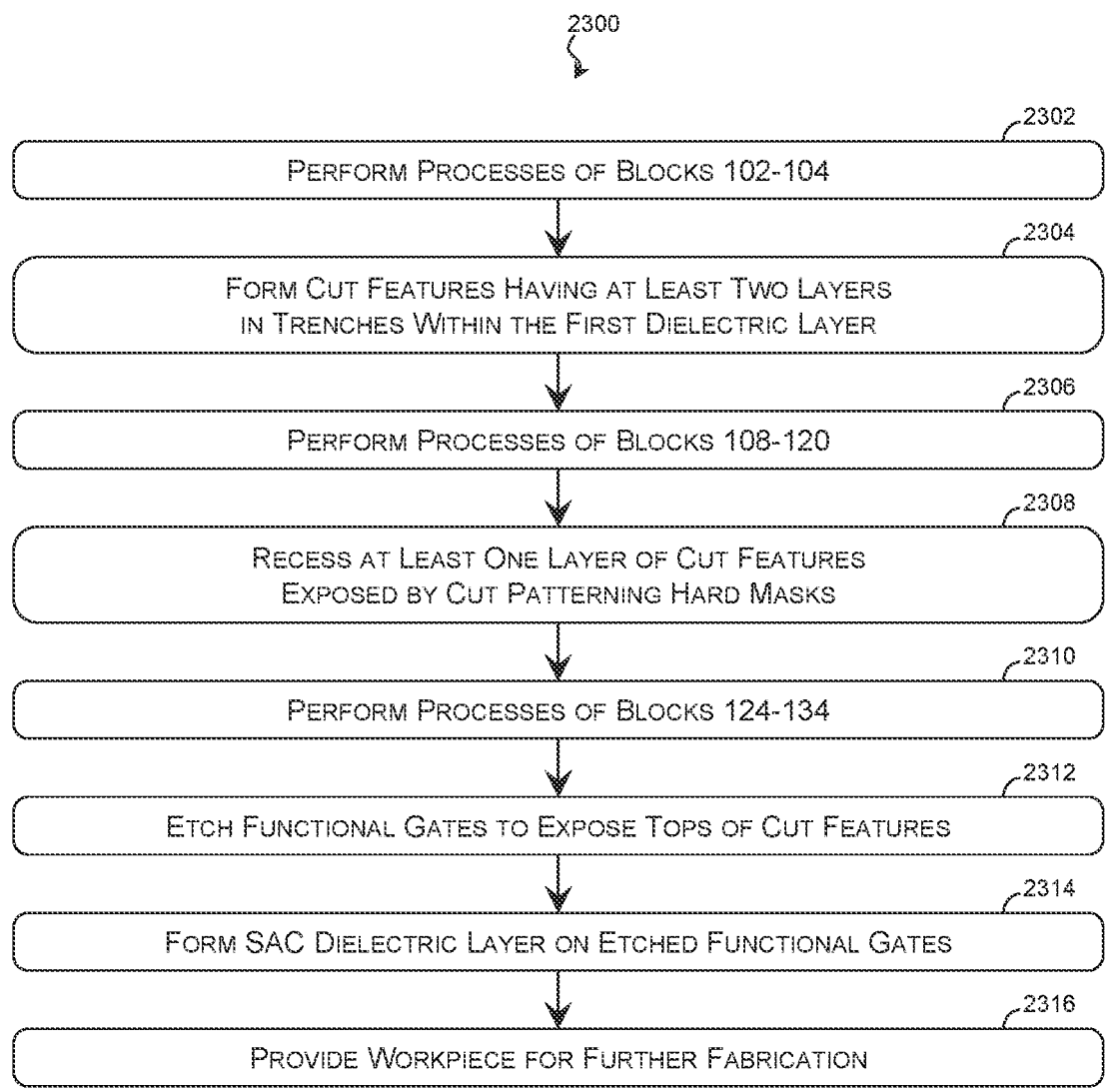
FIG. 23 is a flow diagram of a method of fabricating a workpiece with multi-layer gate cut features according to various aspects of the present disclosure.
Figure 24:
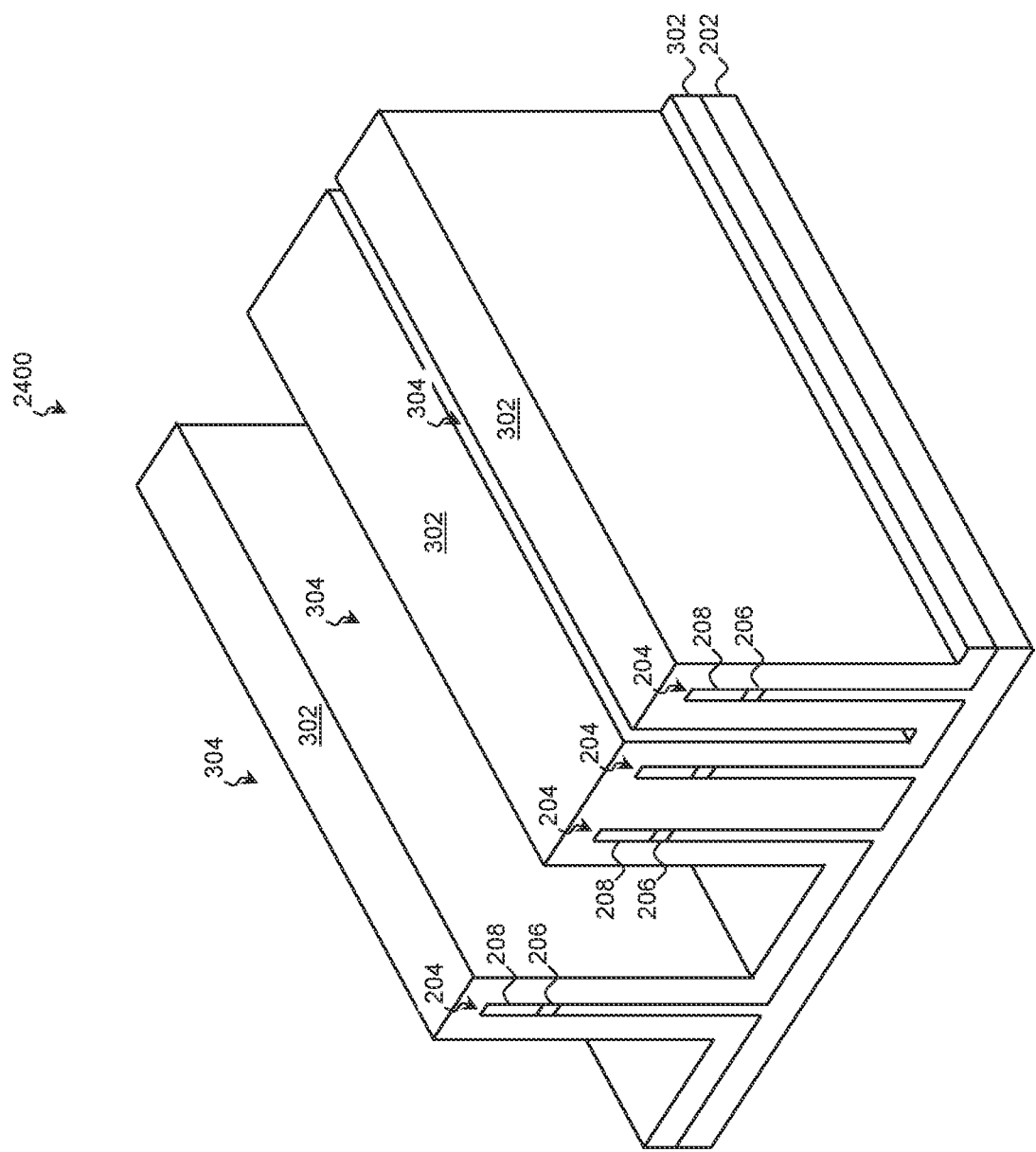
FIGS. 24 and 25 are perspective illustrations of a workpiece undergoing the method of fabricating multi-layer gate cut features according to various aspects of the present disclosure.
Figure 25:
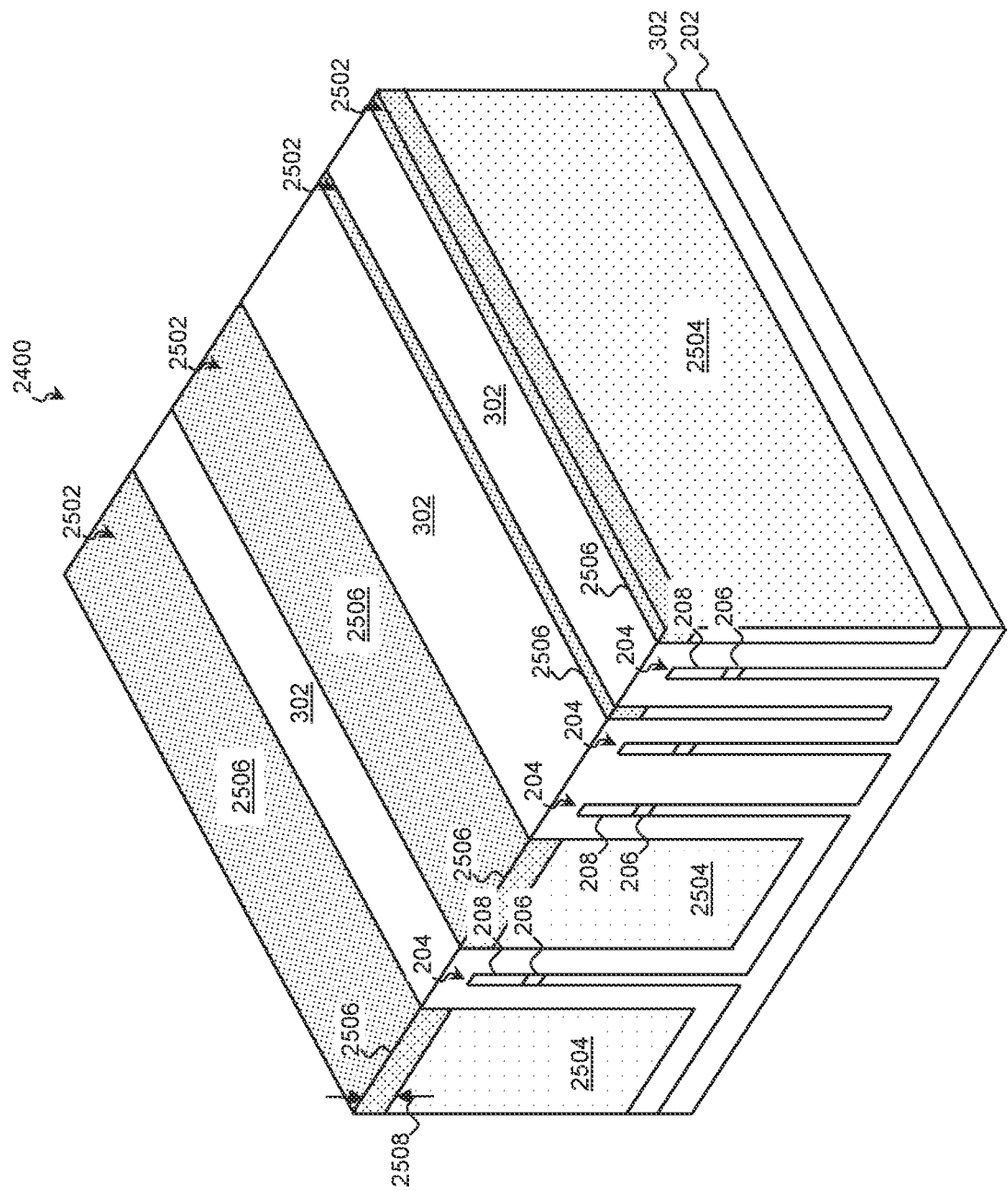
Figure 26:
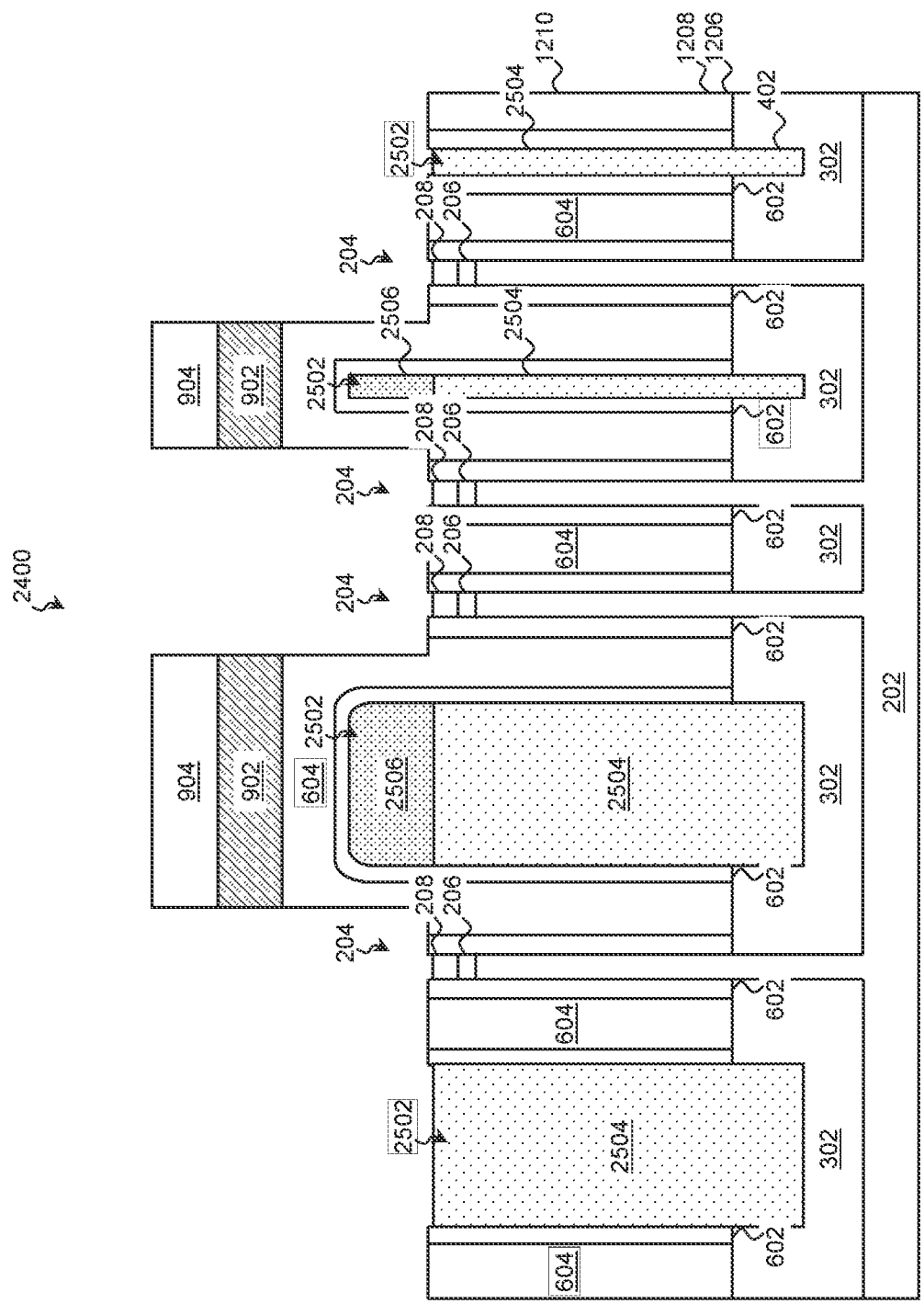
FIGS. 26 and 27 are cross-sectional illustrations of the workpiece taken along a gate region according to various aspects of the present disclosure.
Figure 27:
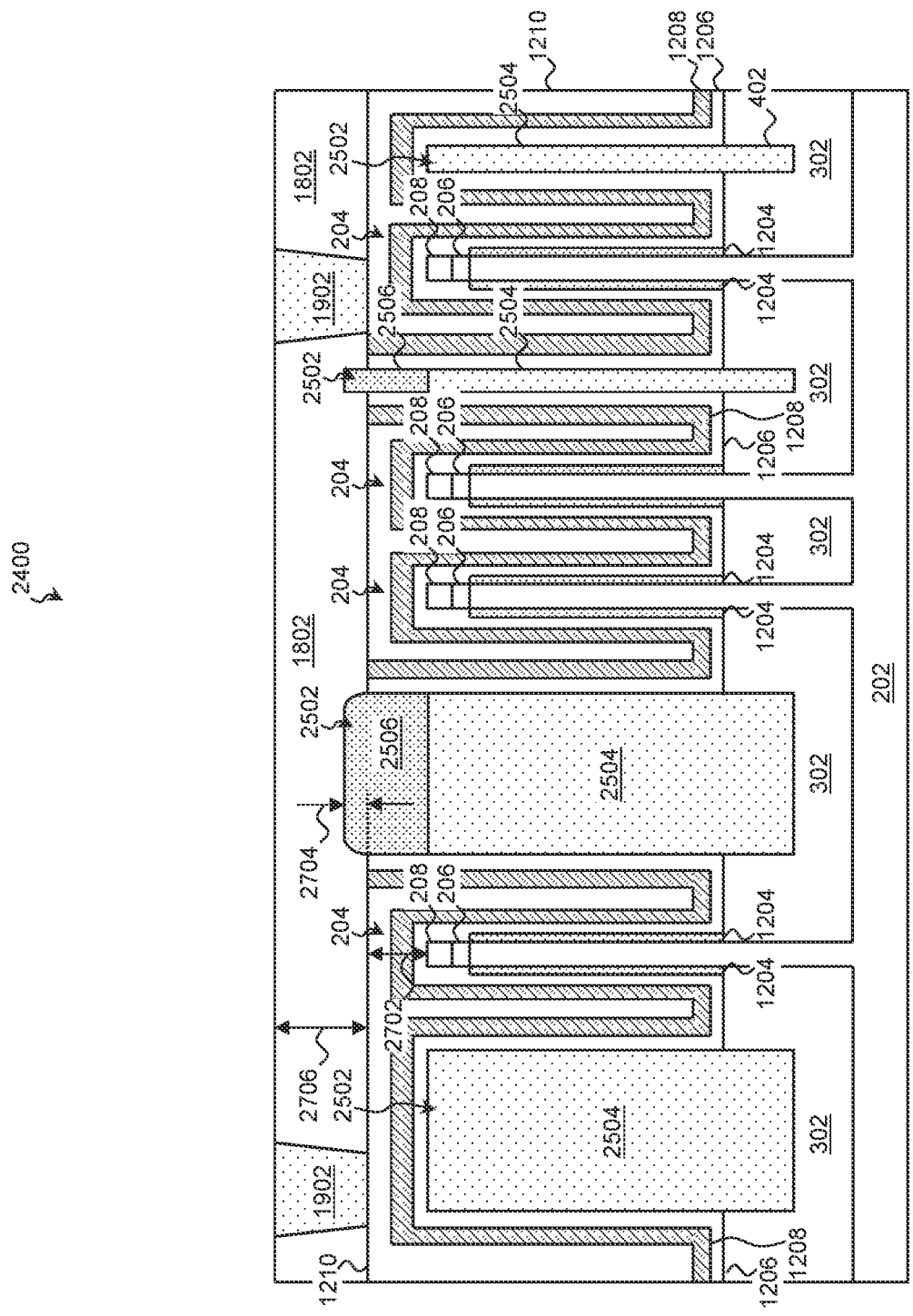

As explained above, the cut features may include more than one layer of similar or different materials. The differences in the materials of the cut features may be used to selectively etch particular layers of the cut features. In that regard, FIG. 23 is a flow diagram of a method 2300 of fabricating a workpiece 2400 with multi-layer gate cut features according to various aspects of the present disclosure. Additional steps can be provided before, during, and after the method 2300, and some of the steps described can be replaced or eliminated for other embodiments of the method 2300. FIGS. 24 and 25 are perspective illustrations of the workpiece 2400 undergoing the method 2300 of fabricating multi-layer gate cut features according to various aspects of the present disclosure. FIGS. 26 and 27 are cross-sectional illustrations of the workpiece 2400 taken along a gate region undergoing the method 2300 according to various aspects of the present disclosure.

Referring to block 2302 of FIG. 23 and to FIG. 24, the processes of blocks 102-104 of FIG. 1A are performed on a workpiece 2400, such that the workpiece 2400 is substantially similar to workpiece 200, except where noted.

Referring to block 2304 of FIG. 23 and to FIG. 25, cut features 2502 are formed between the fins 204 in the trenches in the first dielectric layer 302. The cut features 2502 include a first layer 2504 of a first material and a second layer 2506 of a second material having different etch selectivity than the first material. Each of the first layer 2504 and the second layer 2506 may include a dielectric material, such as a semiconductor oxide, a semiconductor nitride, a semiconductor oxynitride, a semiconductor carbide, a semiconductor carbonitride, a semiconductor oxycarbonitride, and/or a metal oxide. In various examples, the first and second layers 2504 and 2506 of the cut features 2502 include HfO, ZrO, AlO, LaO, BN, silicon oxide, silicon nitride, silicon carbonitride, silicon oxynitride, silicon oxycarbonitride, and/or other suitable materials.

The first layer 2504 and the second layer 2506 may be formed to have any suitable height, and in an example, the top surface of the first layer 2504 is substantially coplanar with the top of the fins 204 including any fin-top hard mask 206 and/or 208. In the example, the second layer 2506 is formed to have a thickness 2508 between about 10 nm and about 30 nm.

The first and second layers 2504 and 2506 of the cut features 2502 may be formed by any suitable process, and in some examples, the cut features 2502 are deposited using CVD, PECVD, HDP-CVD, Physical Vapor Deposition PVD, ALD, PEALD, and/or other suitable deposition processes. In some such examples, the first layer 2504 is formed using a flowable CVD process configured to fill the trenches 304 in the first dielectric layer 302. The first layer 2504 is then etched back to create a recess in which the second layer 2506 is deposited. In some examples, forming the first layer 2504 stops short of filling the trenches 304 in order to leave recesses in the trenches 304 for the second layer 2506 to be deposited. The deposition processes may be followed by a CMP process to remove material of the first and second layers 2504 and 2506 from the top of the first dielectric layer 302.

Referring to block 2306 of FIG. 23, the processes of blocks 108-120 of FIGS. 1A and 1B are performed on the workpiece 2400. This may include forming cut patterning hard masks 902 over portions of the multi-layer cut features 2502. Referring to block 2308 of FIG. 23 and to FIG. 26, those cut features 2502 that are not covered by the cut patterning hard masks 902 and 904 are etched back while the cut features 2502 that are covered by the cut patterning hard masks 902 and 904 remain. This may be performed using an etching technique configured to etch the second layer 2506 of the cut features 2502 without significant etching of the first layer 2504. Selectively etching the second layer 2506 provides a surface defined by the top of the first layer 2504 that is substantially flat and free of dishing or corner rounding and provides a uniform and controlled etching depth without precise etch timing. The etching of block 2308 may include any suitable etching techniques, such as wet etching, dry etching, RIE, ashing, and/or other etching methods. In some embodiments, the fin-top hard mask 206 and/or 208 that are not covered by the cut patterning hard masks 902 and 904 are etched back. In some instances, the fin-top hard mask 206 and/or 208 that are not covered by the cut patterning hard masks 902 and 904 are partially removed. For example, the fin-top hard mask 208 is removed while the fin-top hard mask 206 is partially removed. In some other instances, the fin-top hard mask 206 and/or 208 that are not covered by the cut patterning hard masks 902 and 904 are completely removed to expose the fins 204.

Referring to block 2310 of FIG. 23, the processes of blocks 124-134 of FIG. 1B are performed on the workpiece 2400. In this way, functional gates 1202, substantially as described above, are formed on the fins 204 and on the cut features 2502. Referring to block 2312 of FIG. 23 and to FIG. 27, an etching process is performed to recess the materials of the functional gates 1202 (e.g., the gate dielectric 1206, the work function layer(s) 1208, the electrode fill 1210, etc.) to expose the top of those cut features 2502 that were not recessed. In various examples, the etching is controlled so that the top of the functional gate 1202 is between about 5 nm and about 50 nm above the top of the fins 204 and any remaining fin-top hard mask 206 and/or 208 as indicated by marker 2702. In such examples, the cut features 2502 extend between about 1 nm and about 30 nm above the top of the etched functional gate 1202 as indicated by marker 2704.

Referring to block 2314 of FIG. 23, a Self-Aligned Contact (SAC) dielectric layer 1802 is formed on the etched functional gate 1202. The SAC dielectric layer 1802 may be substantially as described above and may include any suitable material, such as one or more dielectric materials including a semiconductor oxide, a semiconductor nitride, a semiconductor oxynitride, a semiconductor carbide, a semiconductor carbonitride, a semiconductor oxycarbonitride, and/or a metal oxide.

The SAC dielectric layer 1802 may be formed by any suitable process including CVD, PECVD, HDP-CVD, PVD, ALD, PEALD, and/or other deposition processes, and may be formed to have any suitable thickness 2706. In various examples, the SAC dielectric layer 1802 has a thickness 2706 between about 30 nm and about 500 nm.

Referring to block 2316 of FIG. 23, the workpiece 1700 may then be provided for further fabrication. In various examples, this includes forming contacts 1902 coupling to the source/drain features 704 and to the functional gates 1202, forming a remainder of an electrical interconnect structure, dicing, packaging, and other fabrication processes.

Figure 28:
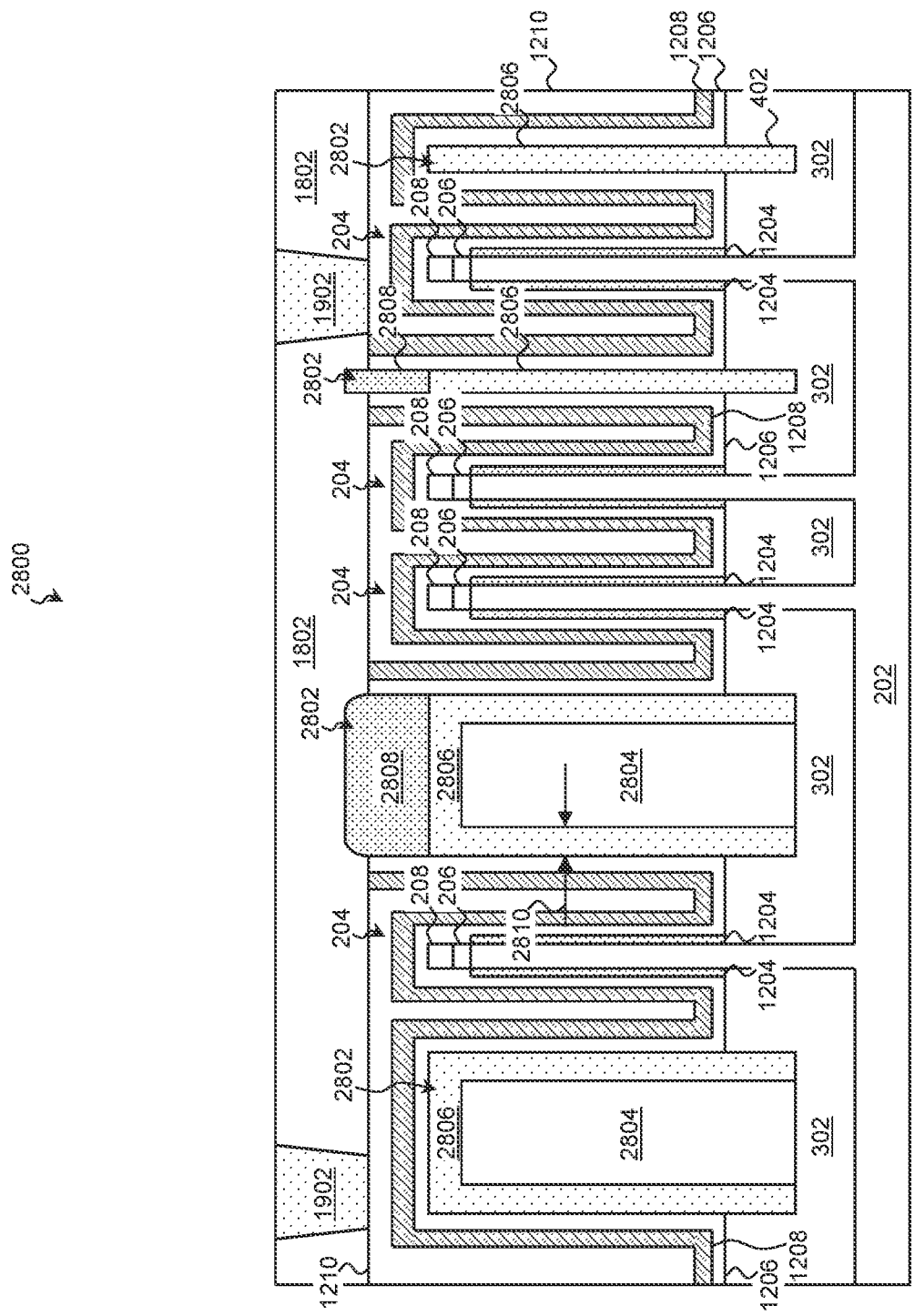
FIG. 28 is a cross-sectional illustration of a workpiece taken along a gate region according to various aspects of the present disclosure.

In further examples, cut features are formed with additional layers. Referring to FIG. 28, a workpiece 2800 is illustrated that is substantially similar to workpiece 2400. The indicated cut features 2802 of workpiece 2800 include a first layer 2804, a second layer 2806 disposed on the top and sides of the first layer 2804, and a third layer 2808 disposed on the second layer 2806. In this example, the second layer 2806 may have a thickness 2810 between about 3 nm and about 50 nm. Each of the first, second, and third layers 2804, 2806, and 2808 may include any suitable material, such as one or more dielectric materials including a semiconductor oxide, a semiconductor nitride, a semiconductor oxynitride, a semiconductor carbide, a semiconductor carbonitride, a semiconductor oxycarbonitride, and/or a metal oxide, and the materials of each layer 2804, 2806, and 2808 may be different from the remaining layers.

Figure 29A:
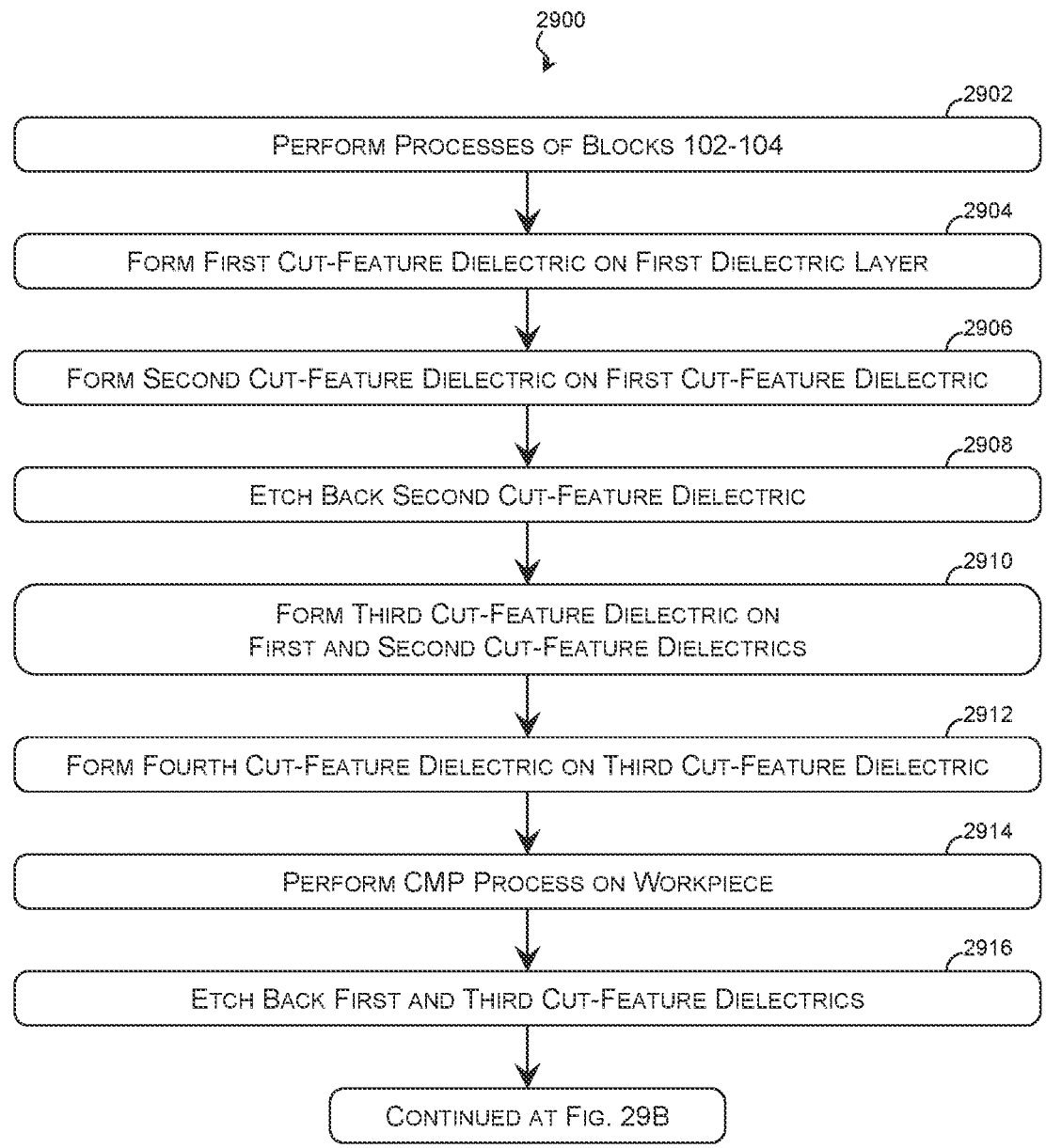
FIGS. 29A and 29B are flow diagrams of a method of fabricating a workpiece with multi-layer gate cut features according to various aspects of the present disclosure.
Figure 29B:
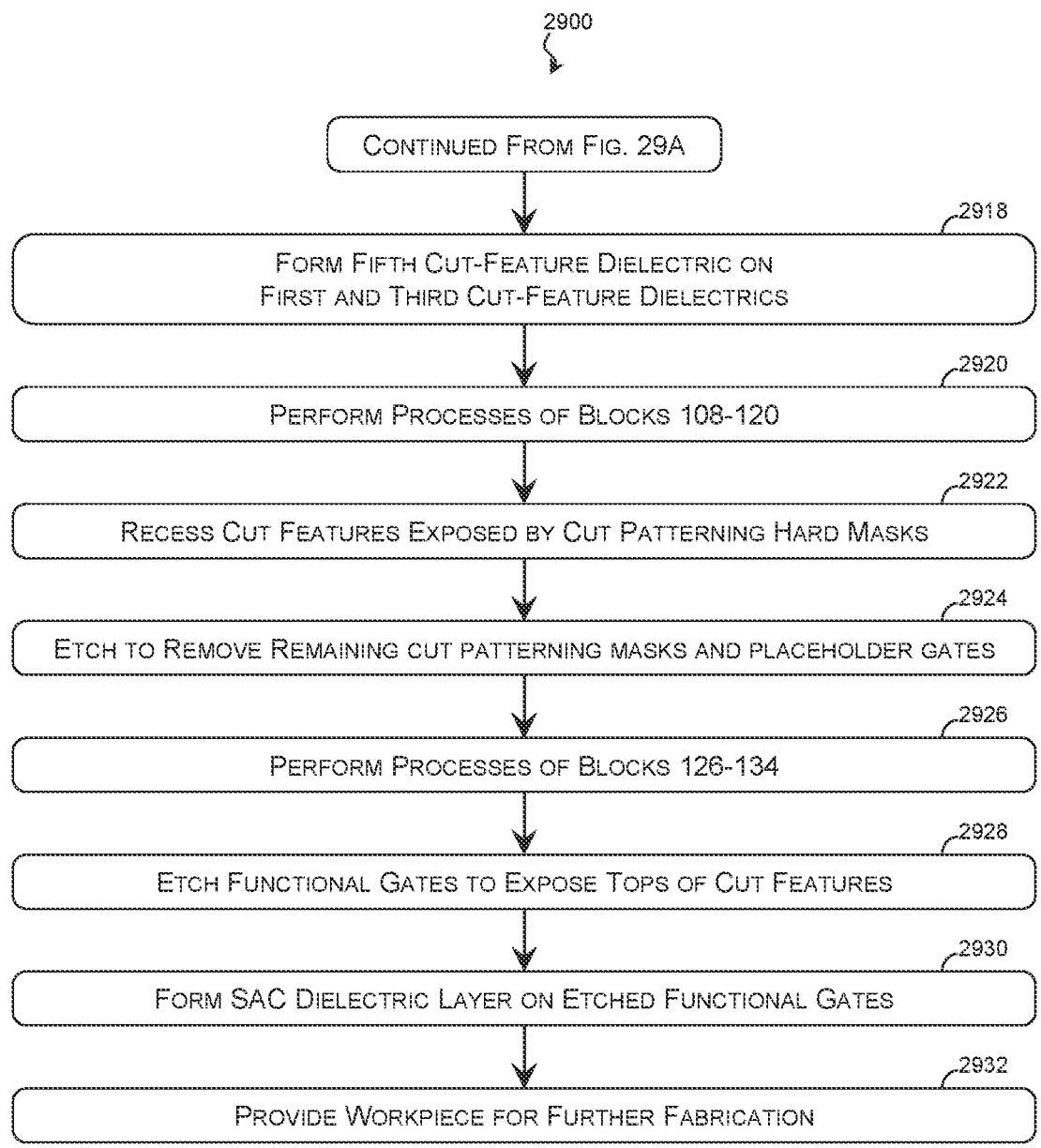

Further examples of a technique for forming multi-layer gate cut features are described with reference to FIGS. 29A-40. In that regard, FIGS. 29A and 29B are flow diagrams of a method 2900 of fabricating a workpiece 3000 with multi-layer gate cut features according to various aspects of the present disclosure. Additional steps can be provided before, during, and after the method 2900, and some of the steps described can be replaced or eliminated for other embodiments of the method 2900. FIGS. 30-36 are perspective illustrations of the workpiece 3000 undergoing the method 2900 of fabrication according to various aspects of the present disclosure. FIGS. 37-40 are cross-sectional illustrations of the workpiece 3000 taken along a gate region according to various aspects of the present disclosure.

Figure 30:
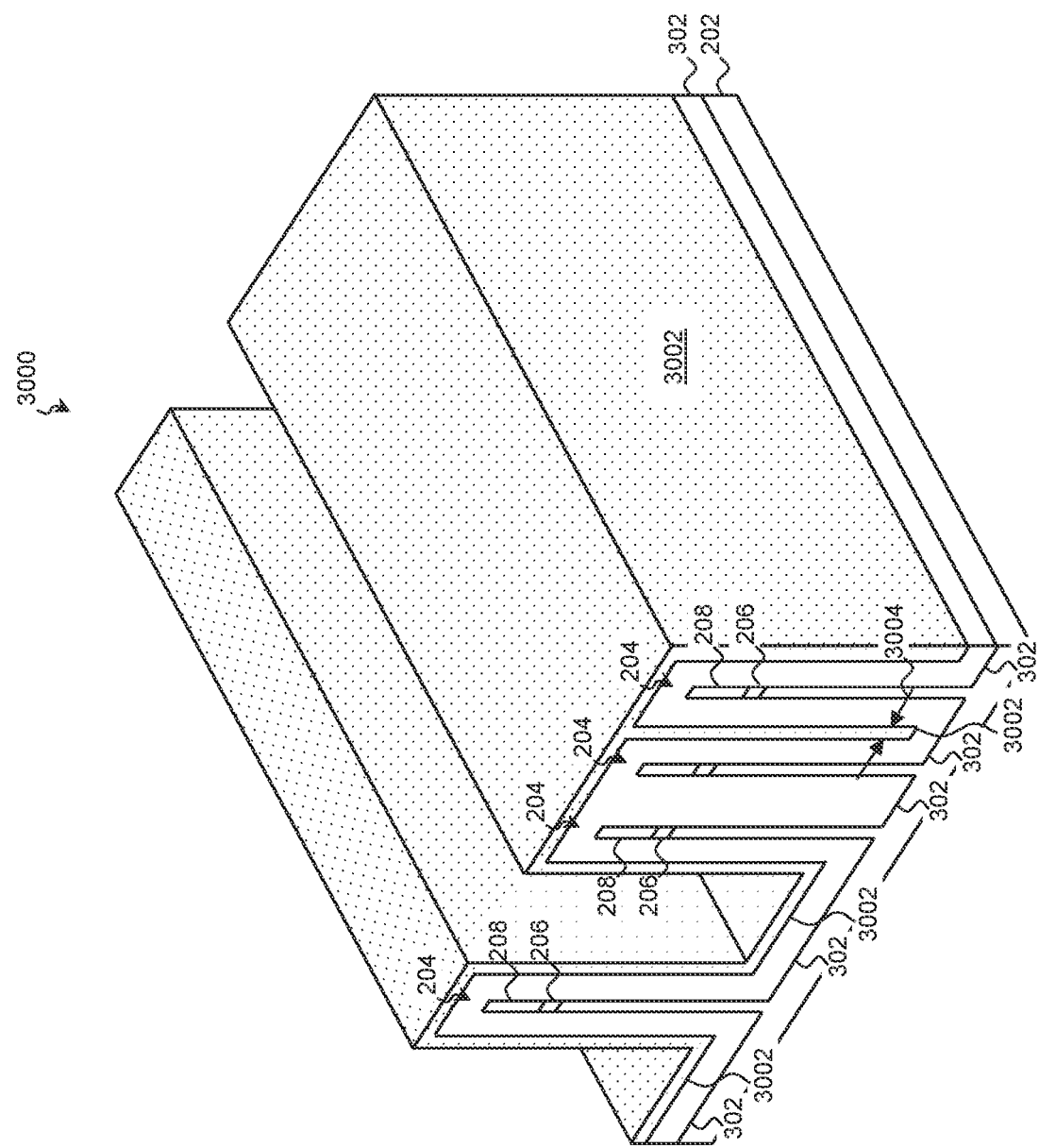
FIGS. 30-36 are perspective illustrations of a workpiece undergoing the method of fabrication according to various aspects of the present disclosure.

Referring to block 2902 of FIG. 29A and to FIG. 30, the processes of blocks 102-104 of FIG. 1A are performed on the workpiece 3000. As a result, the workpiece 3000 may include fins 204 and a first dielectric layer 302 disposed on the fins 204 substantially as described above.

Referring to block 2904 of FIG. 29A and referring still to FIG. 30, a first cut-feature dielectric 3002 is formed on the top and side surfaces of the first dielectric layer 302. The first cut-feature dielectric 3002 is self-aligned by the first dielectric layer 302 to extend parallel to the fins 204 and at a fixed distance from the nearest fin 204.

The first cut-feature dielectric 3002 may include any suitable material, such as one or more dielectric materials including a semiconductor oxide, a semiconductor nitride, a semiconductor oxynitride, a semiconductor carbide, a semiconductor carbonitride, a semiconductor oxycarbonitride, and/or a metal oxide. In various examples, the first cut-feature dielectric 3002 includes HfO, ZrO, AlO, LaO, BN, silicon oxide, silicon nitride, silicon carbonitride, silicon oxynitride, silicon oxycarbonitride, and/or other suitable materials.

The first cut-feature dielectric 3002 may be formed by any suitable process, and in some examples, the first cut-feature dielectric 3002 is deposited using ALD, PEALD, CVD, PECVD, HDP-CVD, and/or other suitable deposition processes. The process may form the first cut-feature dielectric to have any suitable thickness, and in some examples, the thickness 3004 of the first cut-feature dielectric 3002 is substantially the same as the minimum fin width (e.g., between about 3 nm and about 10 nm).

Figure 31:
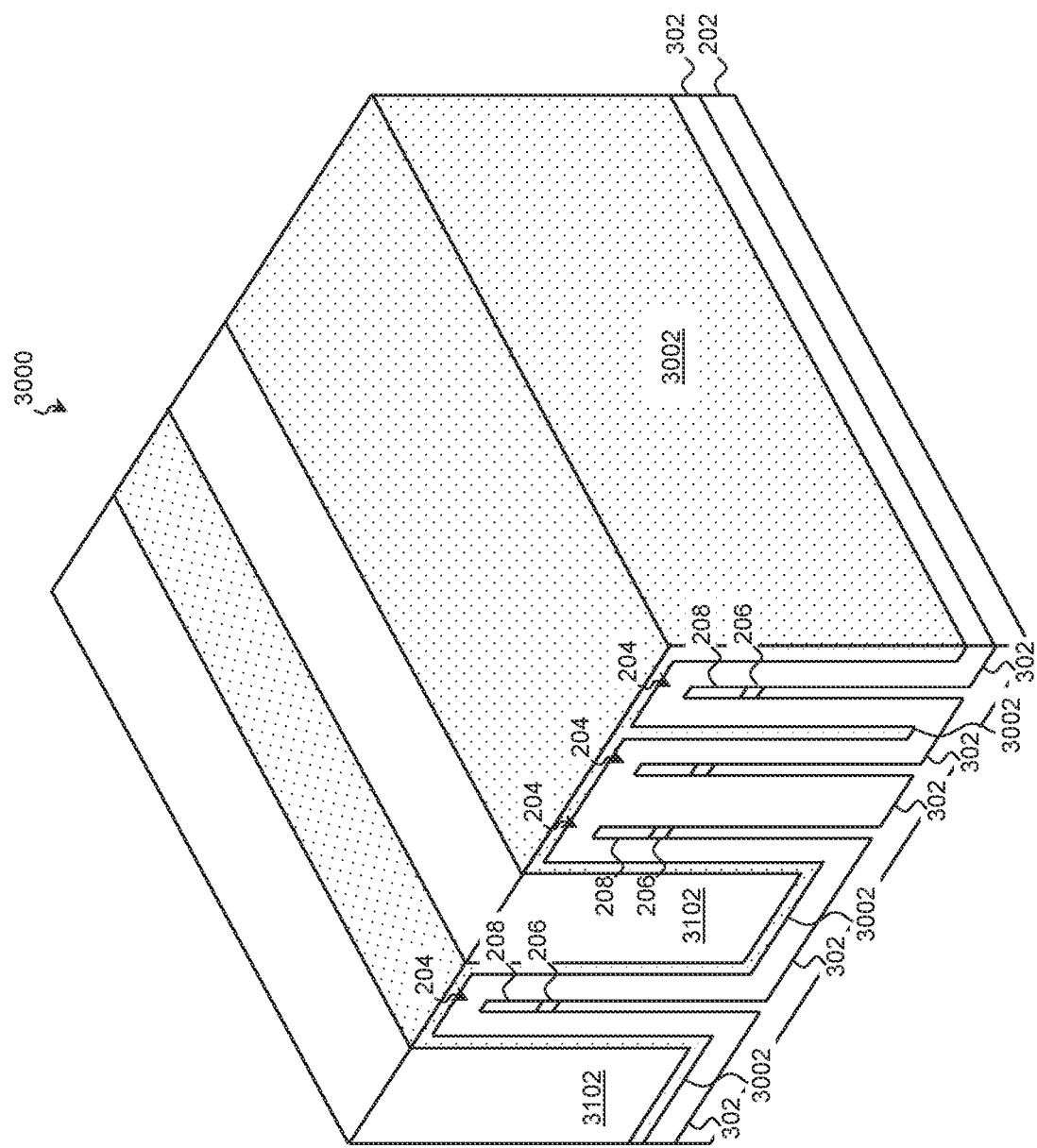

Referring to block 2906 of FIG. 29A and to FIG. 31, a second cut-feature dielectric 3102 is formed between the fins 204 in the trenches in the first cut-feature dielectric 3002. The second cut-feature dielectric 3102 may include any suitable material, such as one or more dielectric materials including a semiconductor oxide, a semiconductor nitride, a semiconductor oxynitride, a semiconductor carbide, a semiconductor carbonitride, a semiconductor oxycarbonitride, and/or a metal oxide. The second cut-feature dielectric 3102 may be selected to have a different etch selectivity from that of the first cut-feature dielectric 3002, and in an example where the first cut-feature dielectric 3002 includes a semiconductor nitride, the second cut-feature dielectric 3102 includes a flowable silicon oxide.

The second cut-feature dielectric 3102 may be formed by any suitable process, and in some examples, the second cut-feature dielectric 3102 is deposited using CVD, PECVD, HDP-CVD, PVD, ALD, PEALD, and/or other suitable deposition processes. In some such examples, the second cut-feature dielectric 3102 is formed using a flowable CVD process configured to fill the trenches within the first cut-feature dielectric 3002.

Figure 32:
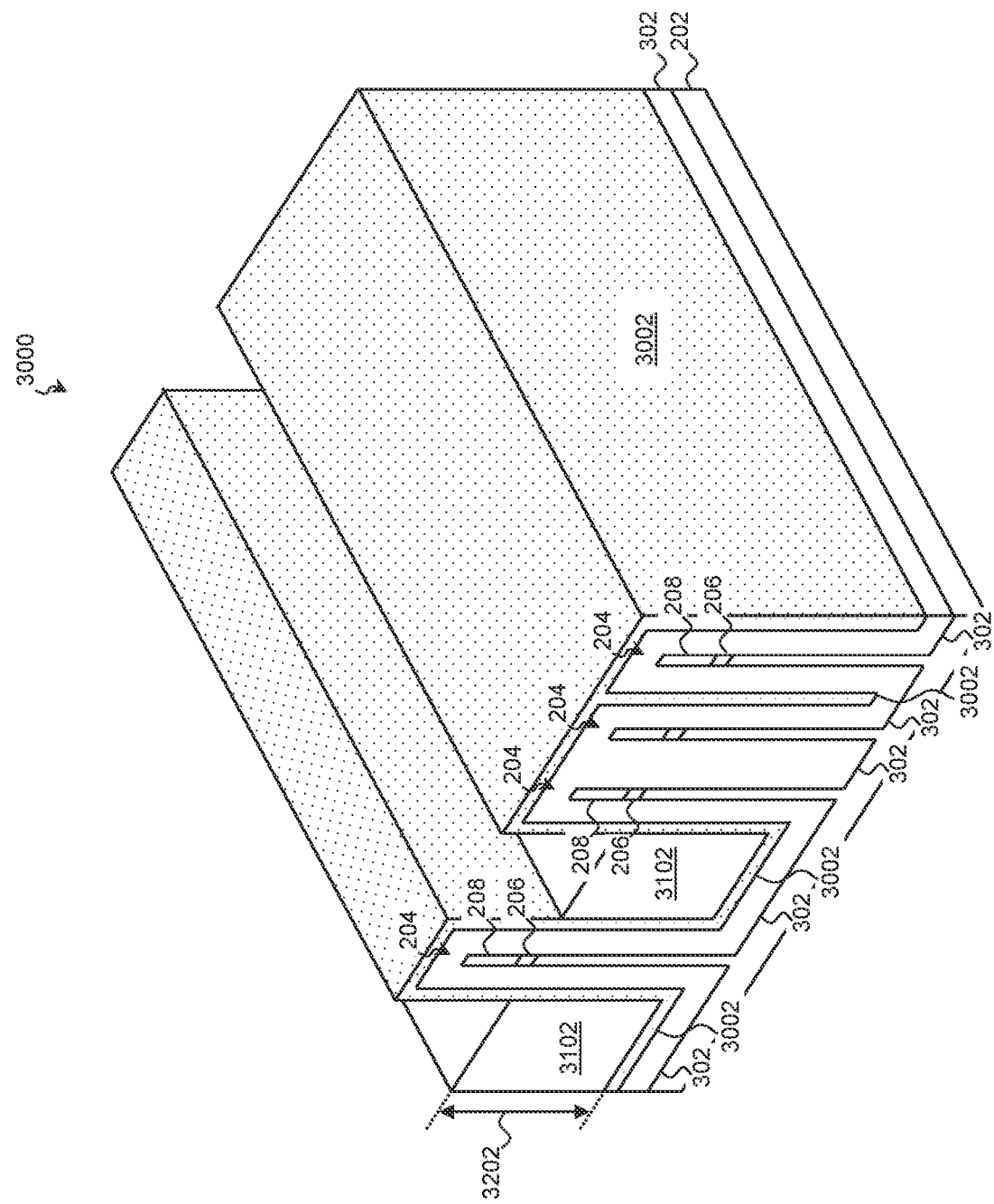

Referring to block 2908 of FIG. 29A and to FIG. 32, the second cut-feature dielectric 3102 is etched back. The etch back process may leave a remaining portion of the second cut-feature dielectric 3102 having any suitable thickness 3202. In various such examples, the thickness 3202 of the remaining second cut-feature dielectric 3102 after the etch back process is between about 30 nm and about 100 nm.

The etching process of block 2908 may include any suitable etching technique, such as wet etching, dry etching, RIE, ashing, and/or other etching methods. The etching steps and chemistries may be configured to etch the second cut-feature dielectric 3102 without significant etching of the first cut-feature dielectric 3002.

Figure 33:
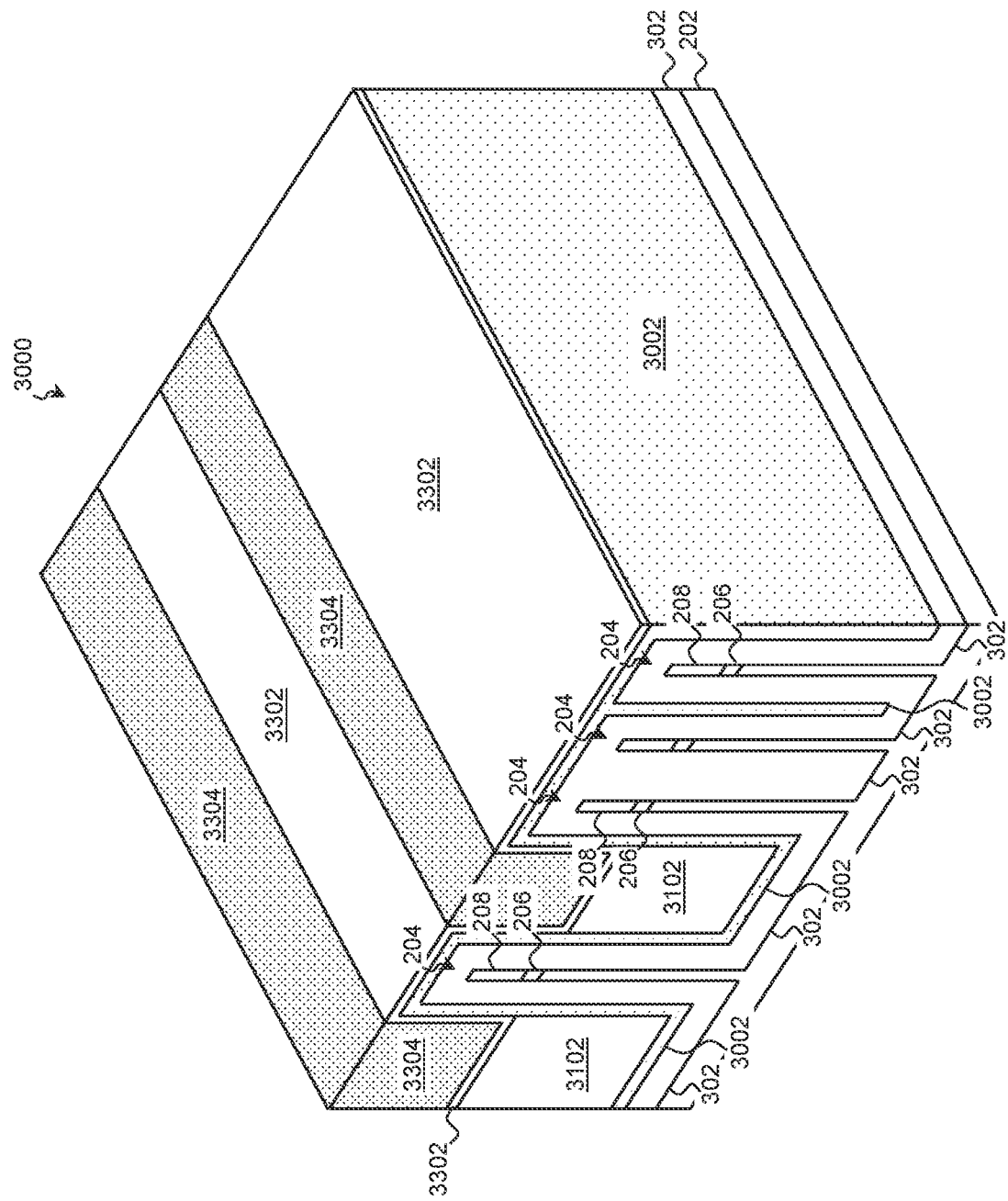

Referring to block 2910 of FIG. 29A and referring to FIG. 33, a third cut-feature dielectric 3302 is formed on top of the second cut-feature dielectric 3102 and on the sides of the first cut-feature dielectric 3002.

The third cut-feature dielectric 3302 may include any suitable material, such as one or more dielectric materials including a semiconductor oxide, a semiconductor nitride, a semiconductor oxynitride, a semiconductor carbide, a semiconductor carbonitride, a semiconductor oxycarbonitride, and/or a metal oxide. In some examples, the third cut-feature dielectric 3302 has substantially the same composition as the first cut-feature dielectric 3002.

The third cut-feature dielectric 3302 may be formed by any suitable process, and in some examples, the third cut-feature dielectric 3302 is deposited using ALD, PEALD, CVD, PECVD, HDP-CVD, and/or other suitable deposition processes.

Referring to block 2912 of FIG. 29A, a fourth cut-feature dielectric 3304 is formed in the trenches in the third cut-feature dielectric 3302. The fourth cut-feature dielectric 3304 may include any suitable material, such as one or more dielectric materials including a semiconductor oxide, a semiconductor nitride, a semiconductor oxynitride, a semiconductor carbide, a semiconductor carbonitride, a semiconductor oxycarbonitride, and/or a metal oxide. In various such examples, the fourth cut-feature dielectric 3304 includes a high-k dielectric or other suitable dielectric material.

The fourth cut-feature dielectric 3304 may be formed by any suitable process, and in some examples, the fourth cut-feature dielectric 3304 is deposited using CVD, PECVD, HDP-CVD, PVD, ALD, PEALD, and/or other suitable deposition processes. In some such examples, the fourth cut-feature dielectric 3304 is formed using a CVD process configured to fill the trenches within the third cut-feature dielectric 3302.

Figure 34:
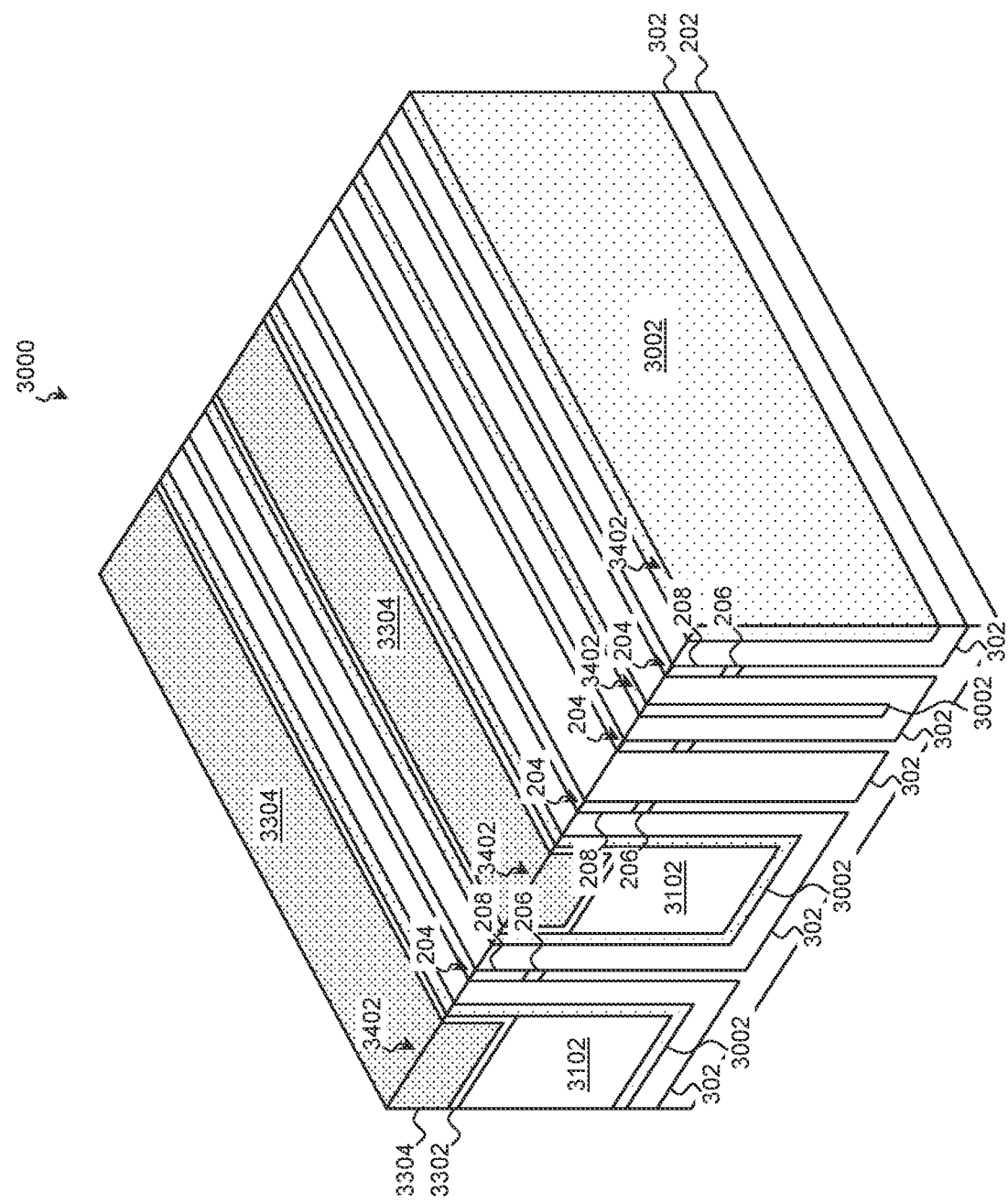

Referring to block 2914 of FIG. 29A and to FIG. 34, a CMP process is performed on the workpiece 3000 to remove excess material of the first cut-feature dielectric 3002, the second cut-feature dielectric 3102, the third cut-feature dielectric 3302, the fourth cut-feature dielectric 3304, and/or the first dielectric layer 302. The CMP process may utilize one of the materials of the fin-top hard masks 206 and 208 as a CMP-stop in order to planarize the aforementioned layers to substantially the same height as the fins 204. In so doing, the CMP process may define gate cut features 3402 that include the first cut-feature dielectric 3002, the second cut-feature dielectric 3102, the third cut-feature dielectric 3302, and/or the fourth cut-feature dielectric 3304.

Figure 35:
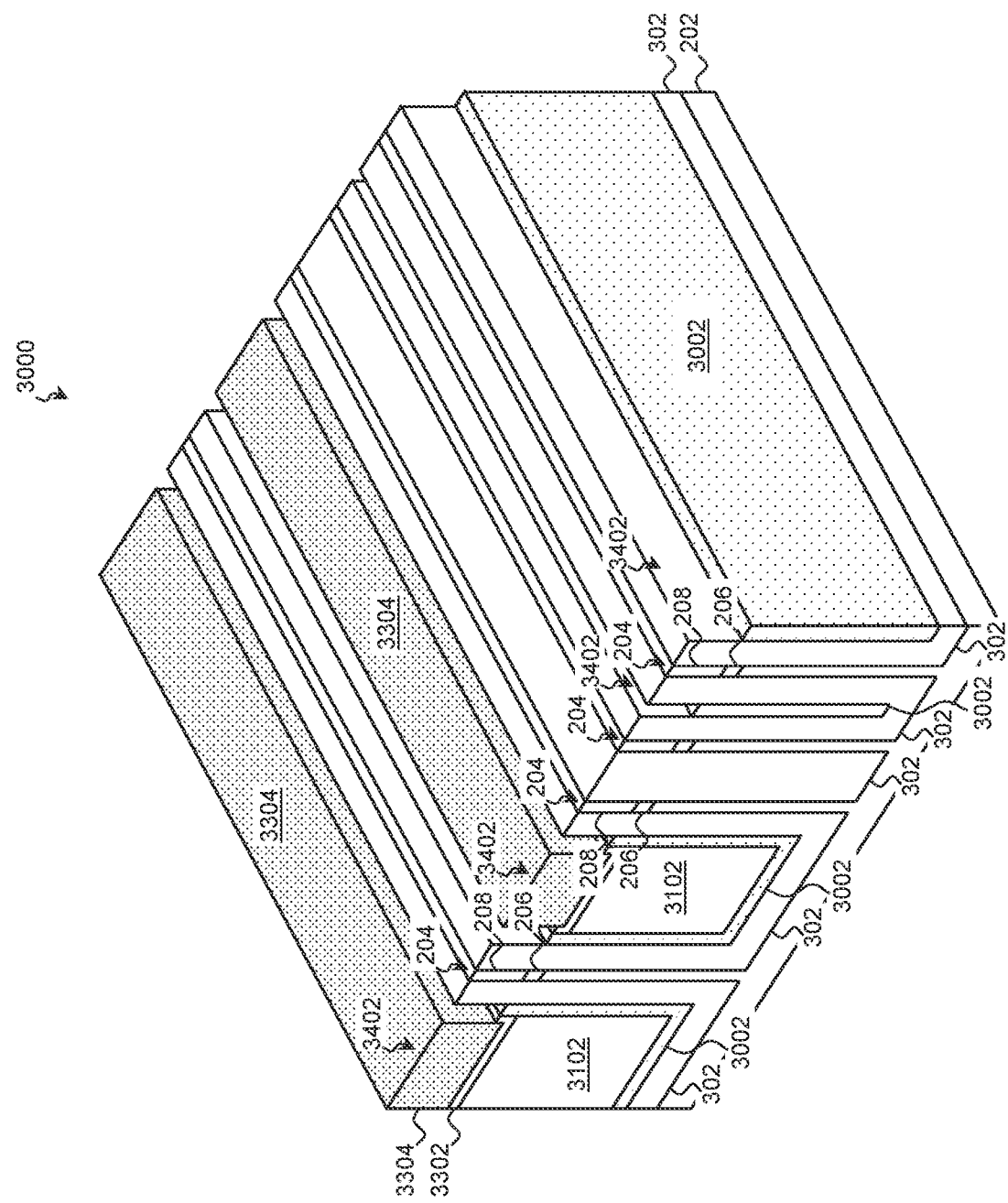

Referring to block 2916 of FIG. 29A and to FIG. 35, the exposed portions of the first cut-feature dielectric 3002 and the third cut-feature dielectric 3302 are etched back. For the wider cut features 3402, this may recess the exposed portions of the first and third cut feature dielectrics 3002 and 3302 at the edges of the cut features 3402 while leaving the portions protected by the fourth cut feature dielectric 3304 in the middle of the cut features 3402 intact. The etch back process may leave a remaining portion of the first cut-feature dielectric 3002 and the third-cut feature dielectric 3302 having any suitable height. In some examples, the tops of the remaining exposed and etched portions of the first cut-feature dielectric 3002 and the third cut-feature dielectric 3302 are at substantially the same height as the portion of the third cut-feature dielectric 3302 under the fourth cut-feature dielectric 3304. In some examples, the tops of the remaining exposed and etched portions of the first cut-feature dielectric 3002 and the third cut-feature dielectric 3302 extend between about 10 nm and about 50 nm above the portion of the third cut-feature dielectric 3302 under the fourth cut-feature dielectric 3304.

The etching process of block 2916 may include any suitable etching technique, such as wet etching, dry etching, RIE, ashing, and/or other etching methods. The etching steps and chemistries may be configured to etch the first cut-feature dielectric 3002 and the third cut-feature dielectric 3302 without significant etching of the fourth cut-feature dielectric 3304 or the first dielectric layer 302.

Figure 36:
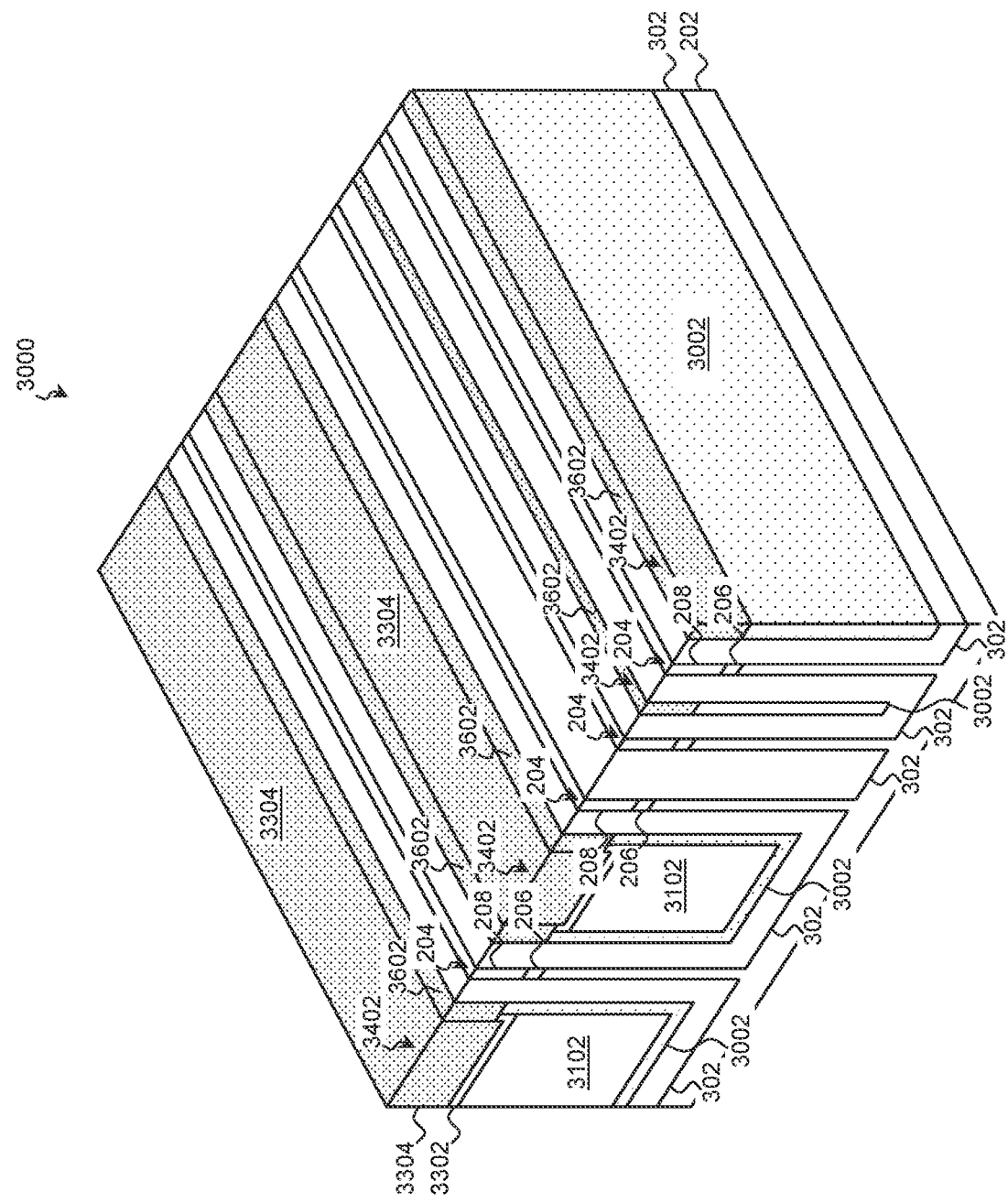

Referring to block 2918 of FIG. 29B and to FIG. 36, a fifth cut-feature dielectric 3602 is formed on the recessed first and third cut-feature dielectrics 3002 and 3302. The fifth cut-feature dielectric 3602 may include any suitable material, such as one or more dielectric materials including a semiconductor oxide, a semiconductor nitride, a semiconductor oxynitride, a semiconductor carbide, a semiconductor carbonitride, a semiconductor oxycarbonitride, and/or a metal oxide. In some examples, the fifth cut-feature dielectric 3602 is substantially similar in composition to the fourth cut-feature dielectric 3304 and includes a high-k dielectric or other suitable dielectric material.

The fifth cut-feature dielectric 3602 may be formed by any suitable process, and in some examples, the fifth cut-feature dielectric 3602 is deposited using CVD, PECVD, HDP-CVD, PVD, ALD, PEALD, and/or other suitable deposition processes. The forming of the fifth cut-feature dielectric 3602 may be followed by a CMP process.

Referring to block 2920 of FIG. 29A, the processes of blocks 108-120 of FIGS. 1A and 1B are performed on the workpiece 3000. This may include recessing the first dielectric layer 302, forming a second dielectric layer on the fins 204 and the cut features 3402, forming placeholder gates 604, and forming one or more cut patterning hard masks 902 and 904 on the workpiece 3000 exposing a subset of the cut features 3402 to be recessed so that a functional gate extends over the recessed cut features 3402.

Referring to block 2922 of FIG. 29A, those cut features 3402 that are not covered by the cut patterning hard masks 902 and 904 are etched back while the cut features 3402 that are covered by the cut patterning hard masks 902 and 904 remain. Doing so may include one or more etching processes, each configured to selectively etch a particular material or set of materials. The etching process of block 2922 may include any suitable etching techniques, such as wet etching, dry etching, RIE, ashing, and/or other etching methods.

Figure 37:
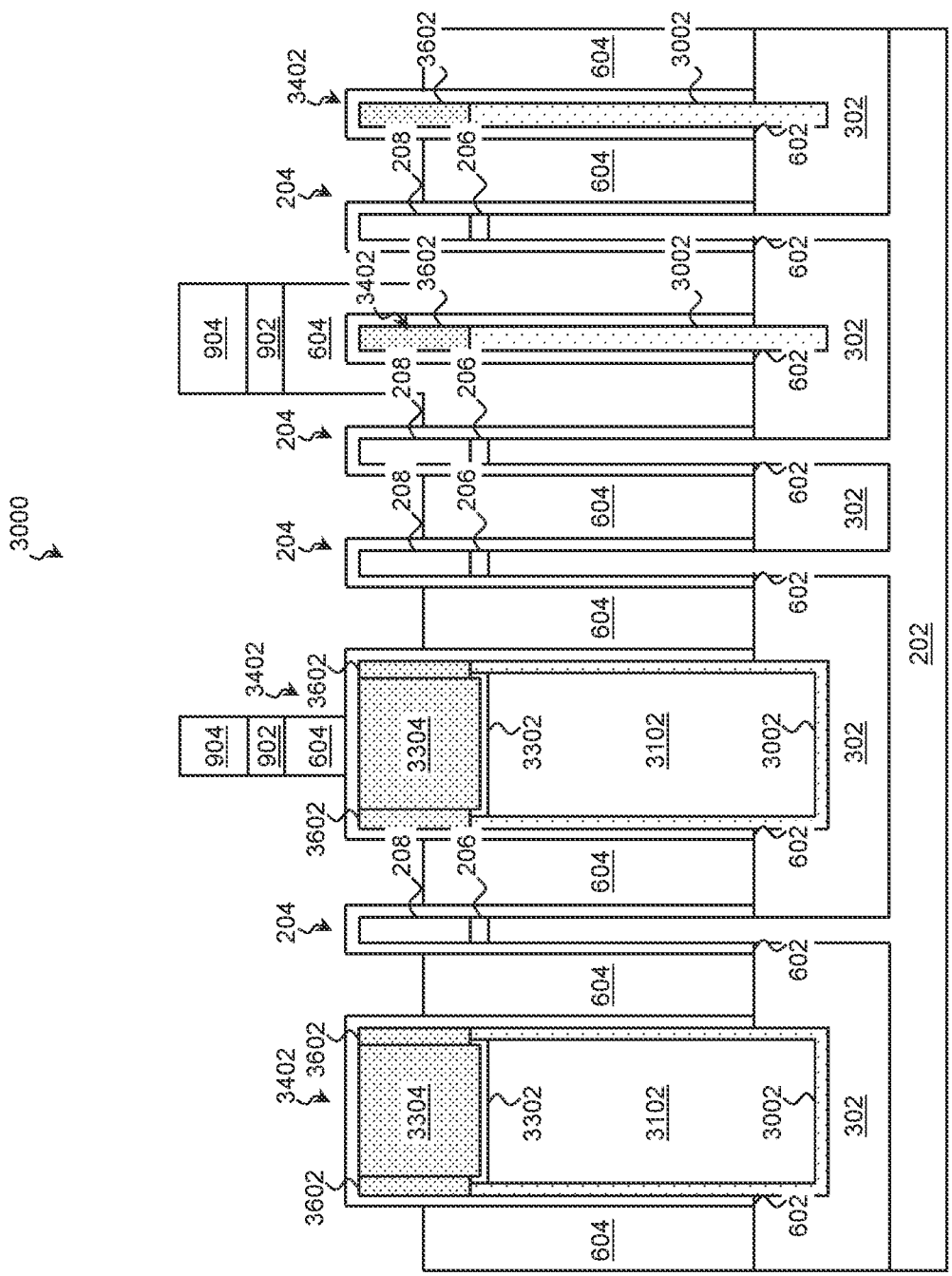
FIGS. 37-40 are cross-sectional illustrations of the workpiece taken along a gate region according to various aspects of the present disclosure.
Figure 38:
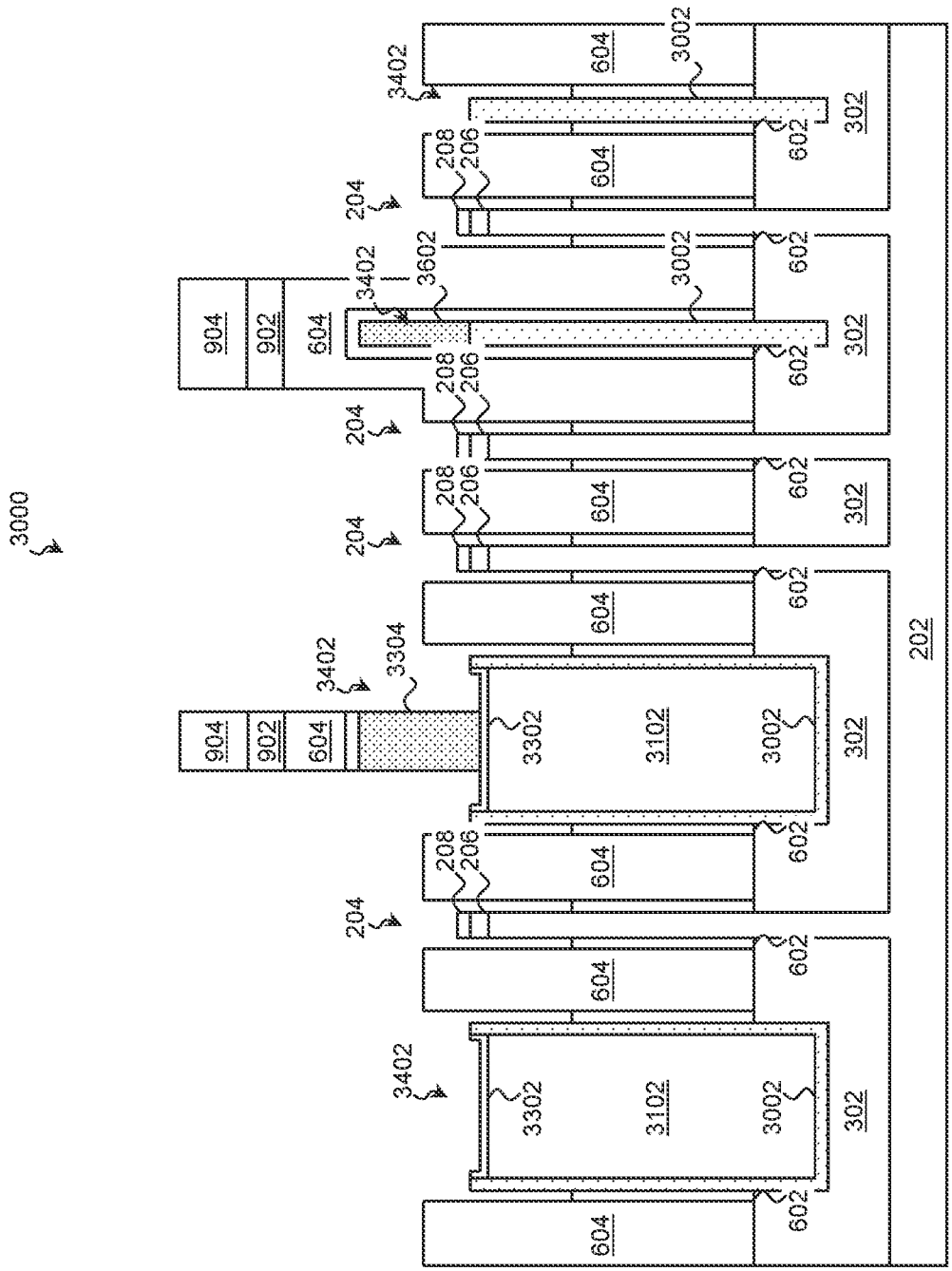
Figure 39:
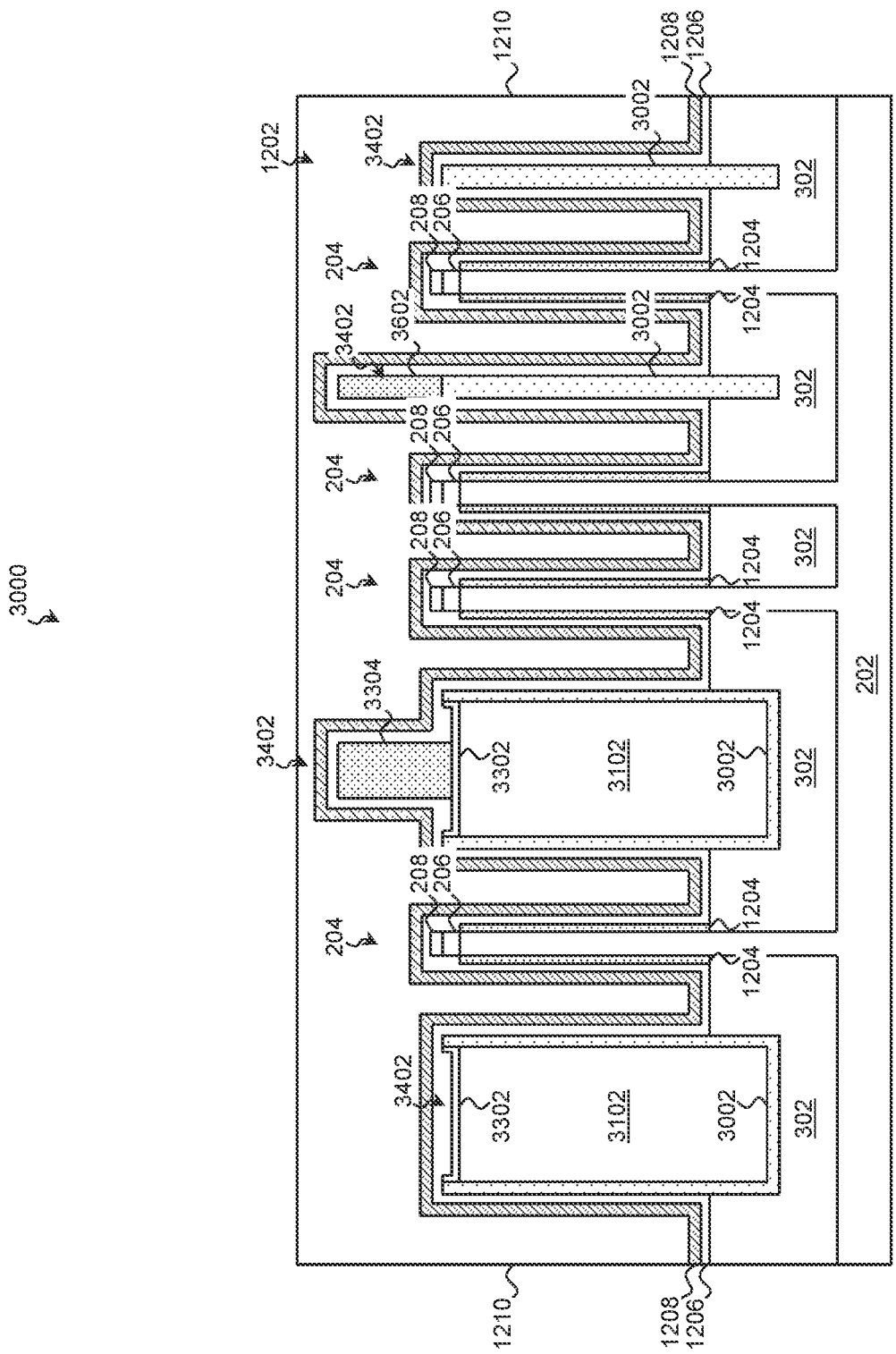

Referring to FIG. 37, in some examples, block 2922 includes a first etching process to etch back the portions of the placeholder gates 604 exposed by the cut patterning hard masks 902 and 904 so that at least the top portions of the underlying fins 204 and cut features 3402 are exposed. In the examples, referring to FIG. 38, the first etching process is followed by a second etching process configured to remove the second dielectric layer 602 and to recess the exposed portions of the cut features 3402. In some examples, the second etching process is configured to selectively remove particular materials of the cut features 3402 such as the fourth and fifth cut-feature dielectrics 3304 and 3602 without significant etching of other materials such as the first and third cut-feature dielectrics 3002 and 3302. Thus, the top surface of the remaining materials of the cut features 3402 may provide a substantially planar surface free of dishing, corner rounding, and other imperfections.

The second etching process may also recess the fin-top hard masks 206 and 208. In some examples, the etching of the second etching process completely removes the fin-top hard masks 206 and 208 so that the fins 204 are exposed. In some examples, the second etching process leaves the fin-top hard masks 206 and 208 with a combined thickness of no more than about 10 nm. In both types of examples, the top of the fins 204 and any fin-top hard masks 206 and 208 are below the topmost surface of the unetched cut features 3402 to reserve space for a functional gate to extend over the fins 204.

Referring to block 2924 of FIG. 29B, an etching process is performed to remove the remaining cut patterning hard masks 902 and 904 and placeholder gates 604. This may include removing a remainder of the second dielectric layer 602 from the fins 204 and the cut features 3402. The etching process may include one or more iterations of various etching techniques, such as wet etching, dry etching, RIE, ashing, etc., each configured to selectively etch a particular material or set of materials.

Removing the placeholder gates 604 leaves recesses in which to form functional gates. Referring to block 2926 of FIG. 29B and to FIG. 39, the processes of blocks 126-134 of FIG. 1B are performed to form functional gates 1202 in the recesses. This may include forming an interfacial layer 1204 on the side surfaces of the fins 204 and on the top of the fins 204 in those embodiments where the fin-top hard masks 206 and 208 are removed, forming a gate dielectric 1206 is formed on the interfacial layer 1204, forming one or more work function layers 1208 on the gate dielectric 1206, and/or forming an electrode fill 1210 on the work function layer(s) 1208, each substantially as described above. A CMP process may be performed to remove excess gate material (e.g., material of: the gate dielectric 1206, the work function layer(s) 1208, the electrode fill 1210, etc.) that is outside of the functional gates 1202.

Figure 40:
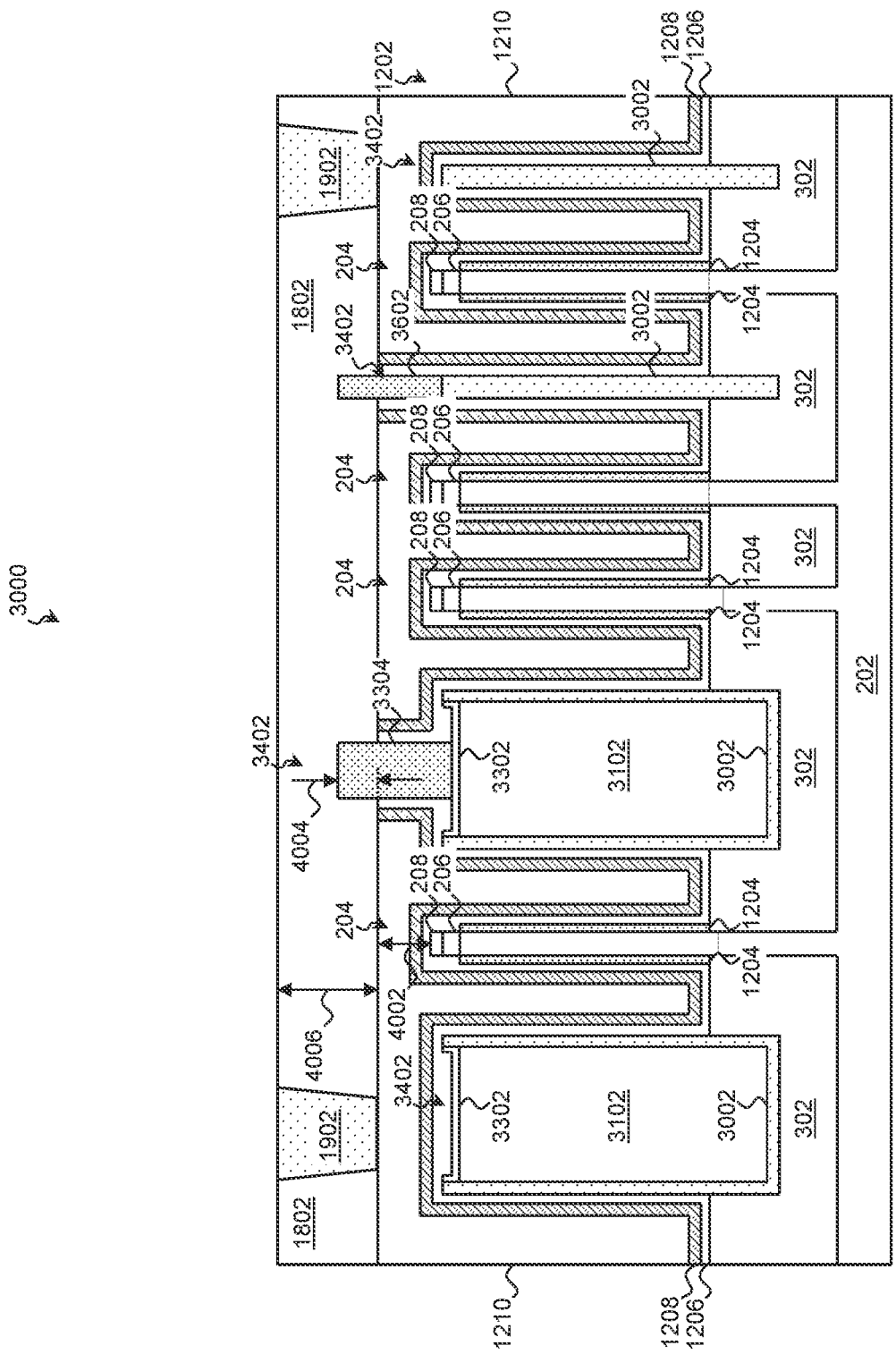

Referring to block 2928 of FIG. 29B and to FIG. 40, an etching process is performed to recess the materials of the functional gates 1202 (e.g., the gate dielectric 1206, the work function layer(s) 1208, the electrode fill 1210, etc.) to expose the top of those cut features 3402 that were not recessed in block 2922. In various examples, the etching is controlled so that the top of the functional gate 1202 is between about 5 nm and about 50 nm above the top of the fins 204 and any remaining fin-top hard mask 206 and/or 208 as indicated by marker 4002. In such examples, the cut features 3402 extend between about 1 nm and about 30 nm above the top of the etched functional gate 1202 as indicated by marker 4004. The etching process may include any suitable etching technique, such as wet etching, dry etching, RIE, ashing, and/or other etching methods, and the etching steps and chemistries may be configured to etch the materials of the electrode fill 1210, the work function layer(s) 1208, and/or the gate dielectric 1206 without significant etching of the cut features 3402.

Referring to block 2930 of FIG. 29B and referring still FIG. 40, a Self-Aligned Contact (SAC) dielectric layer 1802 is formed on the etched functional gate 1202. The SAC dielectric layer 1802 may include any suitable material, such as one or more dielectric materials including a semiconductor oxide, a semiconductor nitride, a semiconductor oxynitride, a semiconductor carbide, a semiconductor carbonitride, a semiconductor oxycarbonitride, and/or a metal oxide. In various examples, the SAC dielectric layer 1802 includes HfO, ZrO, AlO, LaO, BN, silicon oxide, silicon nitride, silicon carbonitride, silicon oxynitride, and/or silicon oxycarbonitride.

The SAC dielectric layer 1802 may be formed by any suitable process, and in some examples, the SAC dielectric layer 1802 is deposited using CVD, PECVD, HDP-CVD, PVD, ALD, PEALD, and/or other deposition processes. The deposition may be followed by a CMP process to remove material outside of the gate region, and the planarized SAC dielectric layer 1802 within the gate region may have any suitable thickness 4006. In various examples, the SAC dielectric layer 1802 has a thickness 4006 between about 30 nm and about 500 nm.

Referring to block 2932 of FIG. 29B, the workpiece 3000 may then be provided for further fabrication. In various examples, this includes forming contacts 1902 coupling to the source/drain features 704 and to the functional gates 1202, forming a remainder of an electrical interconnect structure, dicing, packaging, and other fabrication processes.

Thus, the present disclosure provides examples of an integrated circuit with gate cut features and a method for forming the integrated circuit. In some examples, the method includes receiving a workpiece that includes a substrate and a plurality of fins extending from the substrate. A first layer is formed on a side surface of each of the plurality of fins such that a trench bounded by the first layer extends between the plurality of fins. A cut feature is formed in the trench. A first gate structure is formed on a first fin of the plurality of fins, and a second gate structure is formed on a second fin of the plurality of fins such that the cut feature is disposed between the first gate structure and the second gate structure. In some such examples, the first layer is recessed prior to the forming of the first gate structure and the second gate structure. The first layer is disposed between the first gate structure and the substrate and between the second gate structure and the substrate. In some such examples, the first layer is recessed prior to the forming of the first gate structure and the second gate structure, and the plurality of fins extend above a topmost surface of the first layer after the recessing of the first layer. In some such examples, a second cut feature is formed in a second trench bounded by the first layer, and the second cut feature is recessed such that the first gate structure extends over the second cut feature. In some such examples, a width of the first cut feature is different from a width of the second cut feature. In some such examples, the recessing of the second cut feature includes forming a patterned hard mask on the first cut feature that exposes the second cut feature, the recessing of the second cut feature uses the patterned hard mask to prevent significant etching of the first cut feature. In some such examples, the recessing of the second cut feature includes forming a patterned hard mask on a first portion of the first cut feature that exposes a second portion of the first cut feature and exposes the second cut feature. The recessing of the second cut feature further recesses the second portion of the first cut feature such that a width of a bottom portion of the first cut feature is wider than a width of a top portion of the first cut feature. In some such examples, each of the first cut feature and the second cut feature includes a first cut-feature layer of a first material and a second cut-feature layer of a second material disposed on the first cut-feature layer, and the recessing of the second cut feature removes the second cut-feature layer of the second cut feature. In some such examples, the first gate structure and the second gate structure are recessed. A dielectric layer is formed on the first gate structure and the second gate structure, and the cut feature extends into the dielectric layer. In some such examples, the recessing of the first gate structure and the second gate structure further recesses the cut feature, and the dielectric layer extends below a top surface of the first gate structure to a top surface of the cut feature.

In further examples, a method includes receiving a substrate having a plurality of fins extending from the substrate. A dielectric layer is formed on a side surface of a first fin of the plurality of fins, and a cut feature is formed alongside the dielectric layer opposite the first fin. The dielectric layer is recessed such that the first fin and the cut feature extend above the dielectric layer. A gate structure is formed on the first fin and the cut feature, and the gate structure is recessed to form a first gate on the first fin and a second gate that is electrically isolated from the first gate by the cut feature. In some such examples, the dielectric layer is disposed between the gate structure and the substrate and between the cut feature and the substrate. In some such examples, the forming of the dielectric layer further forms the dielectric layer on a side surface of a second fin of the plurality of fins. A second cut feature is formed alongside the dielectric layer opposite the second fin. In some such examples, a width of the first cut feature is different from a width of the second cut feature. In some such examples, the second cut feature is recessed without recessing the first cut feature. In some such examples, the first gate is formed to extend over the second cut feature. In some such examples, the cut feature is partially recessed such that a bottom portion of the cut feature is wider than a top portion of the cut feature.

In yet further examples, a device includes a substrate, a first fin and a second fin extending from the substrate, a dielectric layer extending between the first fin and the second fin, a first cut feature disposed on the dielectric layer, a first gate structure disposed on the first fin; and a second gate structure disposed on the second fin, such that the first gate structure and the second gate structure are separated by the first cut feature. In some such examples, the dielectric layer is a first dielectric layer, and the device further includes a second dielectric layer disposed on the first gate structure and the second gate structure such that the first cut feature extends into the second dielectric layer. In some such examples, the device further includes a second cut feature disposed on the dielectric layer and adjacent to the first fin, wherein a portion of the first gate structure extends over the second cut feature In some such examples, the first cut feature includes a first layer that contains a first material and a second layer that contains a second material that is different from the first material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
a substrate;
a first fin and a second fin extending from the substrate;
a dielectric layer extending between the first fin and the second fin;
a first cut feature disposed on the dielectric layer;
a first gate structure disposed on the first fin; and
a second gate structure disposed on the second fin, such that the first gate structure and the second gate structure are separated by the first cut feature,
wherein the first cut feature comprises an inner layer and an outer layer, the outer layer is disposed on a top surface and sidewalls of the inner layer.

2. The device of claim 1, further comprising: a second cut feature disposed on the dielectric layer and adjacent to the first fin, wherein a portion of the first gate structure extends over the second cut feature.

3. The device of claim 2, wherein a top surface of the first cut feature is above a top surface of the first gate structure.

4. The device of claim 2, wherein a thickness of the first cut feature is different from a thickness of the second cut feature.

5. The device of claim 2, wherein a composition of a lower portion of the first cut feature is same as a composition of the second cut feature.

6. The device of claim 1, wherein the first cut feature further includes an upper layer disposed over the inner layer and the outer layer.

7. The device of claim 1, further comprising:
a third cut feature disposed on the dielectric layer and adjacent to the second fin,
wherein a width of the third cut feature is different from a width of the first cut feature.

8. The device of claim 7, wherein a lower portion of the first cut feature extends into the dielectric layer such that the lower portion of the first cut feature is spaced apart from the first fin and the second fin by the dielectric layer.

9. A device comprising:
a first fin structure over a substrate;
a first cut feature adjacent to the first fin structure and having a first top surface;
a first gate structure comprising a first portion disposed directly over the first fin structure and a second portion disposed directly over and in direct contact with the first top surface of the first cut feature;
a second fin structure over the substrate;
a second cut feature disposed between the first fin structure and the second fin structure and having a second top surface above the first top surface; and
a second gate structure over the second fin structure, wherein the second gate structure is electrically isolated from the first gate structure by the second cut feature.

10. The device of claim 9, further comprising:
a hard mask layer over the first fin structure, wherein the first gate structure is disposed over the hard mask layer.

11. The device of claim 10, further comprising:
an interfacial layer disposed between the first gate structure and sidewalls of the first fin structure,
wherein the first gate structure is in direct contact with the hard mask layer.

12. The device of claim 9, wherein the second cut feature rises above a top surface of the second gate structure.

13. The device of claim 9,
wherein each of the first cut feature and the second cut feature comprises an inner layer and an outer layer,
wherein the outer layer is disposed on a top surface and sidewalls of the inner layer.

14. The device of claim 13, wherein a composition of the inner layer is different from a composition of the outer layer.

15. The device of claim 14, wherein the second cut feature further comprises a dielectric layer disposed on a top surface of the outer layer, and the dielectric layer rises above a top surface of the second gate structure.

16. The device of claim 9, wherein a central line of a bottom portion of the second cut feature is offset from a central line of a top portion of the second cut feature.

17. The device of claim 9, wherein the first cut feature is an integral structure and is formed of a first material, the second cut feature comprises a first portion formed of the first material and a second portion formed of a second material different from the first material.

18. A semiconductor structure, comprising:
a substrate;
a first fin and a second fin extending from the substrate;
a dielectric layer on the substrate and extending between the first fin and the second fin;
a first cut feature disposed between the first fin and the second fin, wherein a portion of the first cut feature extends into the dielectric layer and spaced apart from the first fin and the second fin by the dielectric layer, wherein the first cut feature includes a first layer formed of a first material and a second layer formed of a second material and disposed over the first layer, wherein the second material is different from the first material, and a width of the second layer is less than a width of the first layer;

a first gate structure disposed over the first fin; and a second gate structure disposed over the second fin and electrically isolated from the first gate structure by the first cut feature.

19. The semiconductor structure of claim 18, further comprising:

a second cut feature adjacent to the first fin, wherein the first gate structure is further disposed over the second cut feature, wherein a composition of the second cut feature is different from a composition of the first cut feature.

20. The semiconductor structure of claim 18, further comprising:

another dielectric layer over the first gate structure, the second gate structure, and the first cut feature, wherein a portion of the first cut feature extends into the another dielectric layer.

* * * * *